(12) United States Patent
Miida et al.

(10) Patent No.: US 8,599,614 B2
(45) Date of Patent: Dec. 3, 2013

(54) PROGRAMMING METHOD FOR NAND FLASH MEMORY DEVICE TO REDUCE ELECTRONS IN CHANNELS

(75) Inventors: Takashi Miida, Tokyo (JP); Riichiro Shirota, Kanagawa (JP); Hideki Arakawa, Kanagawa (JP); Ching Sung Yang, Hsinchu (TW); Tzung Ling Lin, Banciao (TW)

(73) Assignees: Powerchip Corporation, Tokyo (JP); Powerchip Technology Corporation, Hsinchu (TW)

( * ) Notice: Subject to any disclaimer, the term of this patent is extended or adjusted under 35 U.S.C. 154(b) by 258 days.

(21) Appl. No.: 13/203,612

(22) PCT Filed: Apr. 30, 2009

(86) PCT No.: PCT/JP2009/058788
§ 371 (c)(1),
(2), (4) Date: Aug. 26, 2011

(87) PCT Pub. No.: WO2010/125695
PCT Pub. Date: Nov. 4, 2010

(65) Prior Publication Data
US 2011/0310666 A1 Dec. 22, 2011

(51) Int. Cl.
*G11C 11/34* (2006.01)
(52) U.S. Cl.
USPC ............. 365/185.14; 365/185.28; 365/185.17
(58) Field of Classification Search
USPC ............................ 365/185.14, 185.17, 185.28
See application file for complete search history.

(56) References Cited

U.S. PATENT DOCUMENTS

| | | | |
|---|---|---|---|
| 5,659,505 | A | 8/1997 | Kobayashi et al. |
| 5,677,873 | A | 10/1997 | Choi et al. |
| 5,745,417 | A | 4/1998 | Kobayashi et al. |
| 5,898,606 | A | 4/1999 | Kobayashi et al. |
| 6,621,735 | B2 | 9/2003 | Nakamura et al. |
| 6,912,157 | B2 | 6/2005 | Nakamura et al. |
| 7,085,162 | B2 | 8/2006 | Nakamura et al. |

(Continued)

FOREIGN PATENT DOCUMENTS

| | | |
|---|---|---|
| JP | 6-244386 | 9/1994 |
| JP | 10-3794 | 1/1998 |

(Continued)

OTHER PUBLICATIONS

International Search Report issued Feb. 2, 2010 in International (PCT) Application No. PCT/JP2009/058788.
Written Opinion of the International Searching Authority issued Feb. 2, 2010 in International (PCT) Application No. PCT/JP2009/058788.
Roberto Bez, et. al., "Introduction to Flash Memory", Proceeding of IEEE, vol. 91, No. 4, pp. 489-501, Apr. 2003.

(Continued)

*Primary Examiner* — Anthan Tran
(74) *Attorney, Agent, or Firm* — Wenderoth, Lind & Ponack, L.L.P.

(57) ABSTRACT

In a programming method for a NAND flash memory device, a self-boosting scheme is used to eliminate excess electrons in the channel of an inhibit cell string that would otherwise cause programming disturb. The elimination is enabled by applying a negative voltage to word lines connected to the inhibit cell string before boosting the channel, and this leads to bringing high program immunity. A row decoder circuitry to achieve the programming operation and a file system architecture based on the programming scheme to improve the efficiency of file management are also described.

14 Claims, 47 Drawing Sheets

(56) References Cited

U.S. PATENT DOCUMENTS

| | | |
|---|---|---|
| 7,286,402 B2 | 10/2007 | Nakamura et al. |
| 7,623,387 B2 * | 11/2009 | Dong et al. ............. 365/185.18 |
| 2002/0071311 A1 | 6/2002 | Jeong et al. |
| 2003/0133329 A1 | 7/2003 | Satoh |
| 2004/0196685 A1 | 10/2004 | Miida |
| 2006/0245260 A1 | 11/2006 | Kim |
| 2008/0279008 A1 * | 11/2008 | Dong et al. ............. 365/185.17 |

FOREIGN PATENT DOCUMENTS

| | | |
|---|---|---|
| JP | 10-275484 | 10/1998 |
| JP | 2002-63795 | 2/2002 |
| JP | 2002-203393 | 7/2002 |
| JP | 2004-72060 | 3/2004 |
| JP | 2006-313613 | 11/2006 |
| WO | 98/18132 | 4/1998 |

OTHER PUBLICATIONS

T. Kobayashi, et. al., "A Giga-Scale Assist-Gate (AG)-AND-Type Flash Memory Cell with 20-MB/s Programming Throughout for Content-Downloading Applications", IEEE Technical Digest of IEDM 2001, pp. 29-32, Dec. 2001.

Shin-ichi Kobayashi, et. al., "Memory Array Architecture and Decoding Scheme for 3V Only Sector Erasable DINOR Flash Memory", IEEE Journal of Solid-state Circuit, vol. 29, No. 4, pp. 454-460, Apr. 1994.

International Preliminary Report on Patentability issued Nov. 10, 2011 in International (PCT) Application No. PCT/JP2009/058788.

* cited by examiner

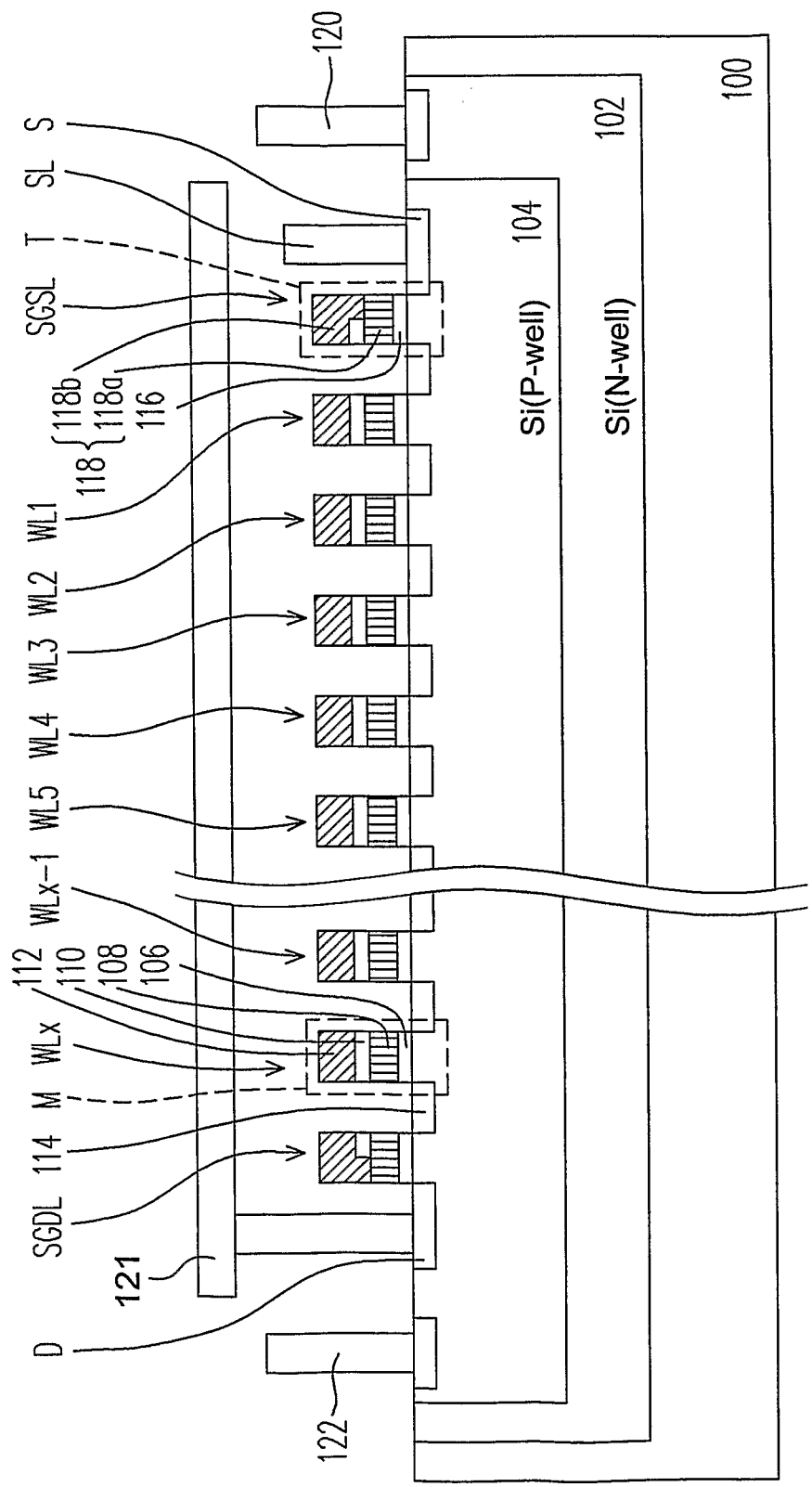

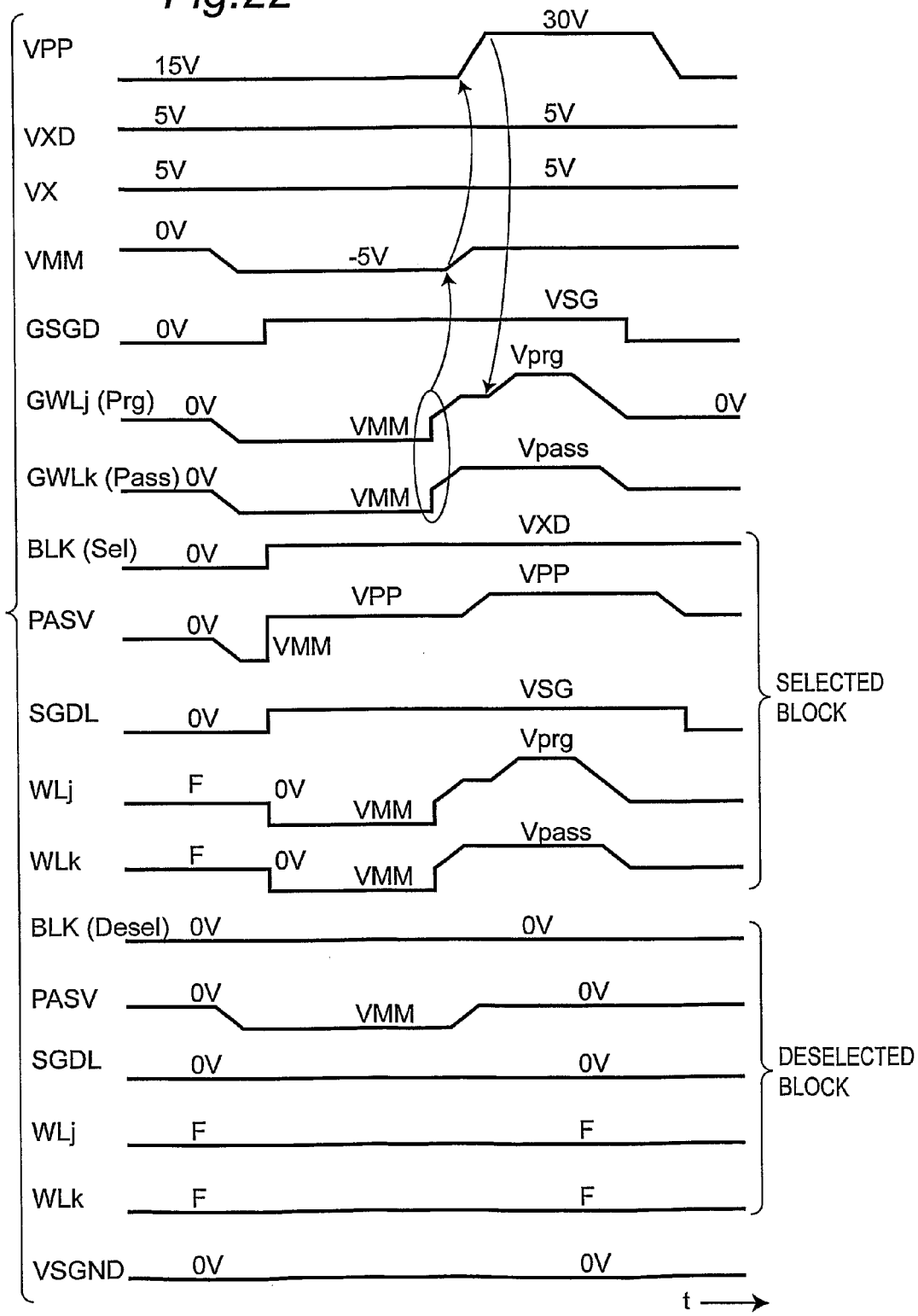

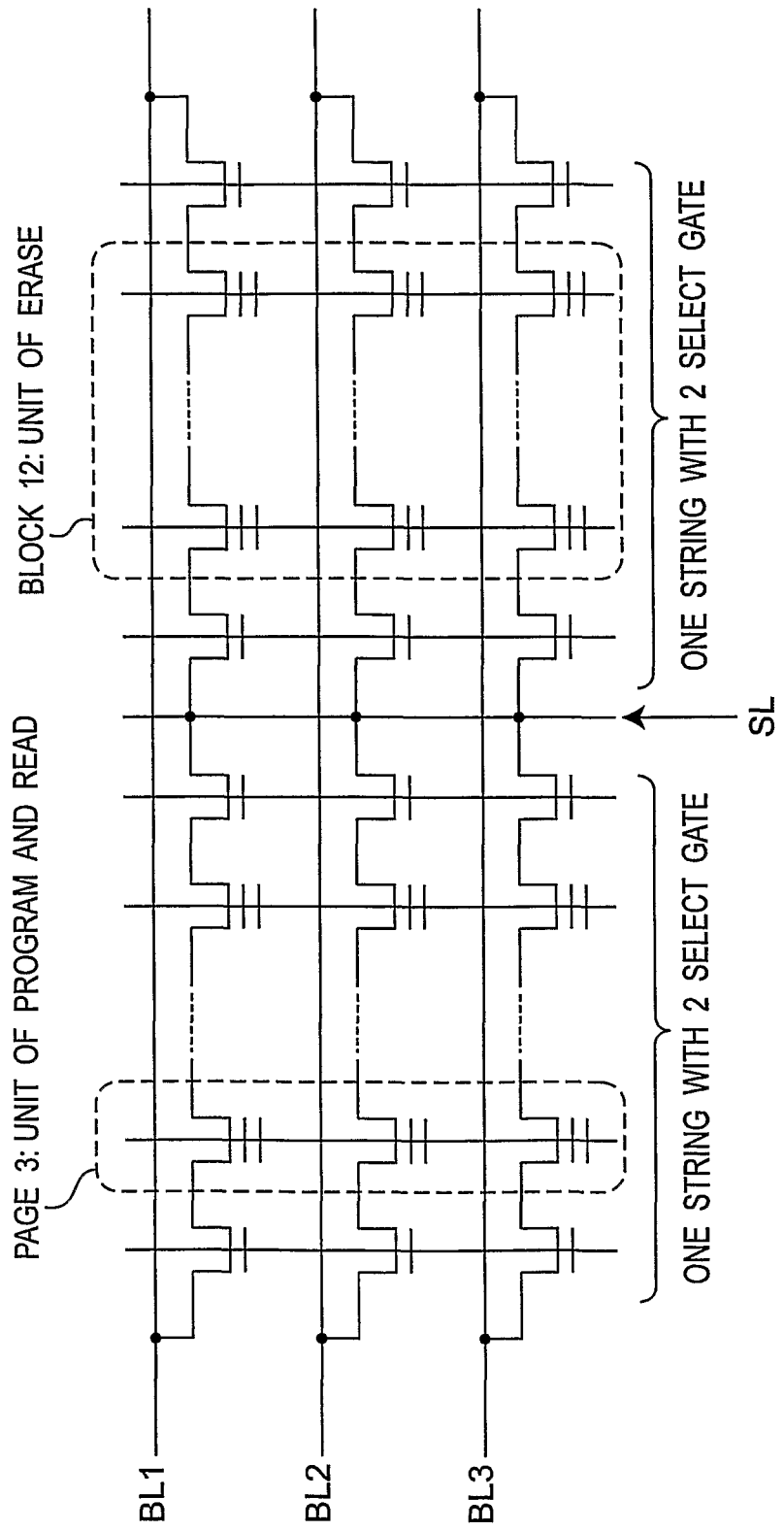

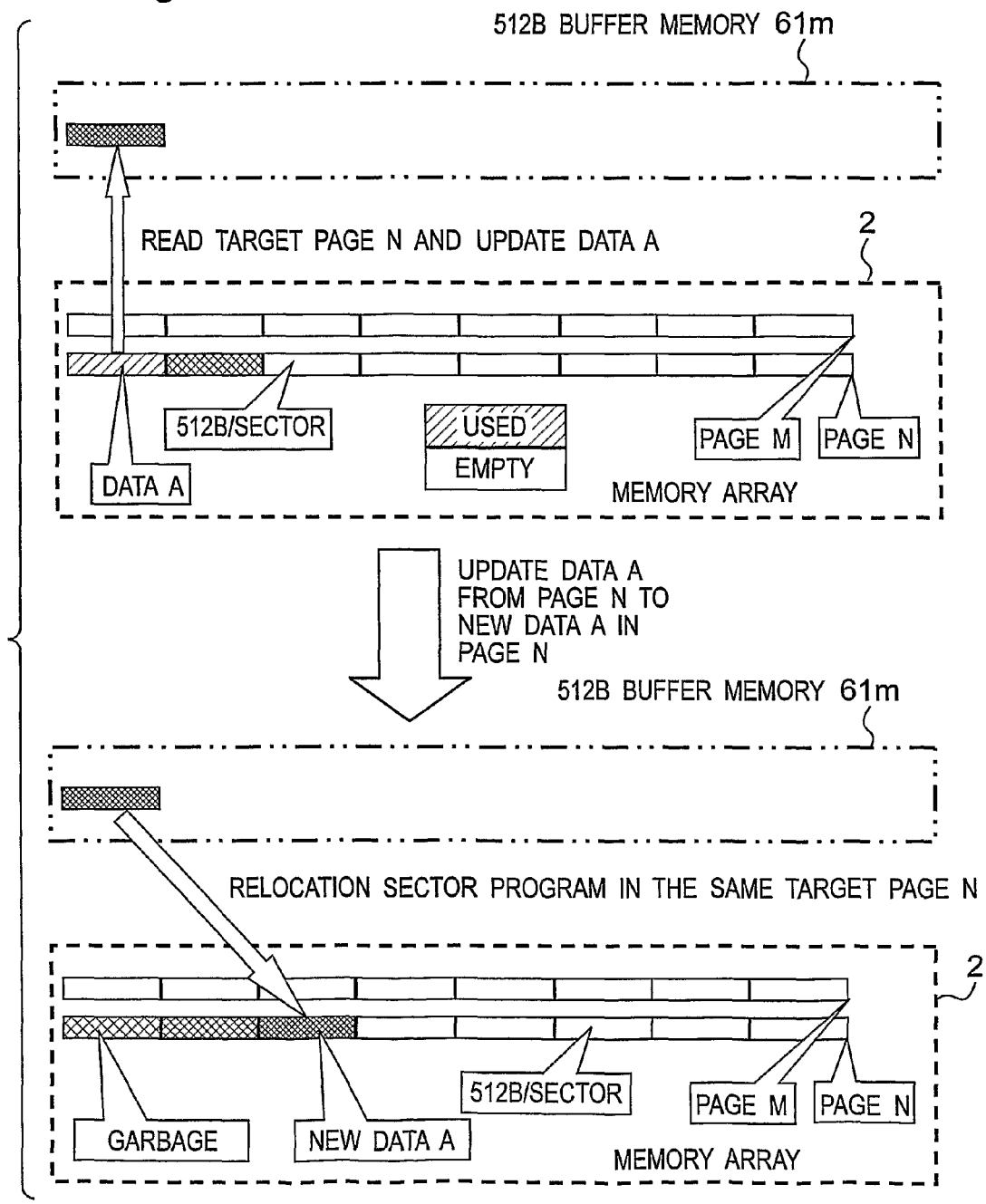

Fig.39

| VOLTAGES | PERIOD 1(t<t0) | PERIOD 2 (t0<t<t1) | PERIOD 3 (t1<t<t3) |
|---|---|---|---|
| BL | V1=2.4V | V1=2.4V | V1=2.4V |
| SL | V2=1.9V | V2=1.9V | V2=1.9V |
| SGDL | V3=5V and V4=1.5V | V4=1.5V | V4=1.5V |
| SGSL | 0V | 0V | 0V |
| WL(selected) | 0V | V5= -5V | V6=Vpass and V7=Vprg |
| WL(deselected) | 0V | V5= -5V | V6 =Vpass |

PROGRAMMING METHOD FOR NAND FLASH MEMORY DEVICE TO REDUCE ELECTRONS IN CHANNELS

TECHNICAL FIELD

The present invention relates to a programming method for a NAND flash memory device including a NAND flash memory array, and to a NAND flash memory device including a NAND flash memory array.

BACKGROUND ART

NAND flash memories have been developed for high density storage application, such as picture cards for digital cameras, memory of MP players, and universal serial bus (USB) memories. In particular, a cellular phone system and personal digital assistants (PDA) have shown rapid growth to expand its market segment. Further, its application has been extended to PC storage use as a solid-state drive (referred to as an SSD hereinafter), which is an alternative of a hard disk drive (HDD), and is the most promising market domain for the NAND flash memory in the future. However, as the scaling technology for finer pattern in the semiconductor memories is further developed, the NAND flash memories face such a physical limitation as in terms of the cell operability, where the narrow threshold voltage (Vth) windows become, in particular, a serious issue for multi-level cell (MLC) operation. The threshold voltage of a MOS transistor is referred to as a Vth voltage hereinafter.

In pursuing high-density storage and higher performance in data reliability for NAND flash memory, programming disturb is one of the most critical issues, and the capacitance coupling interference between neighboring floating gates is also critical. These factors broaden the Vth distribution and decrease the Vth windows for the MLC operation. Such programming disturb is also critical issue for a single level cell (SLC) to cause failure in a multiple overwrite operation in one page or at non-sequential data programming from source line SL side to bit line BL side.

CITATION LIST

Patent Literature

PTL 1: U.S. Pat. No. 5,677,873;
PTL 2: Japanese patent laid-open publication No. JP-2002-063795;
PTL 3: Japanese patent laid-open publication No. JP-10-003794;
PTL 4: Japanese patent laid-open publication No. JP-10-275484;
PTL 5: Japanese patent laid-open publication No. JP-6-244386;
PTL 6: U.S. Pat. No. 6,621,735;
PTL 7: U.S. Pat. No. 6,912,157;
PTL 8: U.S. Pat. No. 7,085,162;
PTL 9: U.S. Pat. No. 7,286,402;
PTL 10: U.S. Pat. No. 5,659,505;
PTL 11: U.S. Pat. No. 5,745,417; and
PTL 12: U.S. Pat. No. 5,898,606.

Non Patent Literature

NPL 1: R. Bez, et. al., "Introduction to Flash Memory", Proceeding of IEEE, Vol. 91, No. 4, pp. 489-501, April 2003;
NPL 2: T. Kobayashi, et. al., "A Giga-Scale Assist-Gate (AG)-AND-Type Flash Memory Cell with 20-MB/s Programming Throughput for Content-Downloading Applications", IEEE Technical Digest of IEDM 2001, pp. 29-32, December 2001; and
NPL 3: S. Kobayashi, et. al., "Memory Array Architecture and Decoding Scheme for 3V Only Sector Erasable DINOR Flash Memory", IEEE Journal of Solid-state Circuit, Vol. 29, No. 4, pp. 454-460, April 1994.

SUMMARY OF INVENTION

Technical Problem

A self-boosting operation has been developed and applied to avoid the programming disturb and improve the immunity of all inhibit cells which is disclosed in PTL 1. However, the disturb cannot be prevented completely by doing so, because unwanted programming usually occur at the inhibit cells under the selected word line WL due to the excess electric field enhancement at the oxide caused by the surface channel potential drop. This channel potential falling is brought by transfer of the electrons at the channel surface of the NAND flash memory cell string into the inhibit cells. Hence, it is necessary to apply a positive intermediate pass voltage (Vpass) lower than the program voltage to the deselected word lines during programming (the intermediate pass voltage is referred to as a Vpass voltage hereinafter). However, there is an upper limit for the Vpass voltage, since an overly high Vpass would adversely cause an intermediate pass voltage (Vpass) disturb, which is referred to as a Vpass disturb hereinafter.

A conventional programming scheme that utilizes a conventional self-boosting method to prevent programming disturb will be described below.

FIG. 4 is a timing chart showing a conventional programming operation of a NAND flash memory device of a prior art. Referring to FIG. 4, a positive voltage such as 5V is applied to the gate line SGDL of a drain-side select transistor while another positive voltage such as 2.4V is applied to a bit line BL connected to the inhibit cell string, so as to pre-charge the channel string region where the channel electrons are reduced under the body bias condition in a period of t<t0 (t0=0). On the other hand, the bit line BL is connected to the selected programmed cell string which is grounded to enable the programming. For either a selected bit line case or a deselected bit line case, a gate line SGSL of a source-side select transistor (referred to as an SGSL transistor hereinafter) and a P-well in the cell string are set to be grounded, and the source line (SL) is set to 1.9V.

During the period of t<t0, all the word lines WL are grounded, and the voltage applied to the gate line SGDL is changed to a voltage such as 1.5V, where the gate line SGDL is cut-off from the deselected bit line applied with a voltage of 2.4V to inhibit the programming of the deselected cells at the boosting phase, while the transistor connected to the gate line SGDL (referred to as an SGDL transistor hereinafter) is turn-on on the selected bit line BL with grounded to program the selected cells. In the case that all memory cells in the cell string are in an erased condition, the floating gates FG are positively charged and a strong inversion layer is formed with inducing high density of electrons at the Si-surface.

Referring to FIG. 4, in a period of t<t0 (t0=0), a voltage V1 is applied to the bit lines BL to be deselected while the selected bit line BL is grounded to program the same cell. In addition, a voltage V2 is applied to the source line SL, a voltage V3 is applied to the selected gate line SGDL and changed to a voltage V4, and the word lines WL and the selected gate line SGSL are grounded to set to a voltage of 0V. In the prior art example, the voltage V1 is set to about 2.4V, the voltage V2 is set to about 1.9V, and the voltage V3 is set to about 5V wherein the electrons in the cell strings are swept to the bit lines BL through the SGDL transistors. Then the bias voltage to the gate line SGDL is changed from the voltage V3 to the voltage V4, to cut-off the channel string potential from the BL for channel boosting at inhibit cells, where the voltage V4 is set to about 1.5V in the period of t<t0.

In the period of t<t0, the connections to the drain-side and the selected SGSL transistors must be cut off to prevent any reverse electron flow from the bit line BL or the source line SL to the cell string. Therefore, a large amount of electrons is evenly distributed in the cell channels and the source and drain regions, even though some electrons are swept through the SGDL transistors.

FIG. 5 is a schematic longitudinal cross sectional view and a horizontal energy band diagram along an inhibit cell string of the NAND flash memory device of the prior art, showing an electron density at a Si-interface during a period of t<t0, and FIG. 6 is a vertical energy band diagram along an inhibit cell string of the NAND flash memory device of the prior art, showing an electron density at a cell channel thereof during a period of t>t0. In FIGS. 5 and 6 and the following figures, Ec denotes a conduction level, Ei denotes an intrinsic Fermi level, and Ev denotes a valence level. As apparent from FIGS. 5 and 6, a high-level electron density is induced to form the inversion layer in the cell channel region.

Thereafter, during a period of t1<t<t2, Vpass voltage pulses are applied to all the word lines WL to boost the channel potential, where a deep depletion layer spreads over the P-well and the holes are swept away to the substrate. Besides, the donors in the lightly doped source and drain regions are ionized and whole electrons are moved and gathered in the channel regions, to lower the surface potential as compared with the case of full depletion.

FIG. 7 is a schematic longitudinal cross sectional view and a horizontal energy band diagram along the inhibit cell string of the NAND flash memory device of the prior art, showing an electron density at the Si-interface during a period of t1<t<t2, and FIG. 8 is a vertical energy band diagram along the inhibit cell string of the NAND flash memory device of the prior art, showing an electron density at the cell channel thereof during a period of t1<t<t2. Namely, FIG. 7 shows the electron density and the horizontal band diagram at the Si-surface in a case with lightly doped sources and drains, and FIG. 8 shows the vertical band diagram along a cell channel in this boosting phase, i.e., the Vpass period where the surface potential is dynamically turned to a thermally non-equilibrium condition.

During the programming period of t2<t<t3, a program pulse is applied to the selected word line WL. Most channel electrons in the entire inhibit cell string are laterally transferred and gathered into the channel of the cell under the selected word lines WL through drift and diffusion driven carrier transfer, and this leads to lowering of the surface potential of the inhibit cell as illustrated in the horizontal band diagram with electron density shown in FIG. 9. FIG. 9 is a schematic longitudinal cross sectional view and a horizontal energy band diagram along the inhibit cell string of the NAND flash memory device of the prior art, showing an electron density at the Si-interface during a period of t2<t<t3. Then, the electrons enhance the electric field across the tunnel oxide, which causes serious programming disturb in which unwanted tunneling current flows.

FIG. 10 is a vertical energy band diagram along the inhibit cell string of the NAND flash memory device of the prior art, showing an electron density at the cell channel thereof during a period of t2<t<t3. Namely, FIG. 10 shows the vertical band diagram with electron density that also illustrates the high electric field across the tunnel oxide of the inhibit cell. This reason is that the remaining excess electrons in the surface channel are transferred and gathered in the inhibit cell under the selected word line WL. This is considered as the major causal root of the programming (Vprg) disturb problem occurring in a NAND flash memory cell string in the conventional programming method. The programming disturb is referred to as a Vprg disturb hereinafter.

FIG. 11 is a schematic circuit diagram showing a bit line programming scheme for a basic NAND flash memory device of a prior art. Referring to FIG. 11, the Vpass disturb, which is suffered the electric stress from Vpass to floating gates in a string causing electron injection, and the Vprg disturb occur simultaneously and are mutually traded off. The Vprg disturb problem occurs as long as the NAND flash memory cell string architecture is adopted, no matter that the flash memory is of charge-trapping type like SONOS (Silicon Oxide Nitride Oxide Silicon) type or of conventional floating gate type.

By the way, a conventional row decoder for use in the NAND flash memory device which supplies the various voltages to word lines WL during the programming sequence is disclosed in PTL 2 to 12. During the programming sequence, methods of applying a negative voltage to the word lines WL are disclosed in PTL 2 to 12 and NPL 1 to 3, where PTL 6 to 9 are each a family application of PTL 2, and PTL 10 to 9 are each a family application of PTL 3.

NPL 1 discloses a NOR-type flash memory which adopts CHE (Channel Hot Electron) Injection Programming and FN (Fowler-Nordheim) Tunnel Erasing. In the erase mode, all the word lines WL in the selected memory cell array unit are set to a negative voltage. PTL 2 and 3 and NPL 2 each disclose an AG-AND type flash memory, where memory cells on one word line WL can be erased by applying a negative voltage to the word line WL. PTL 4 and NPL 3 each disclose a DINOR-type flash memory, where only the selected word line WL is set to a negative voltage for programming the cell.

The common thing for these prior arts is that the purpose for applying the negative voltage to the word lines WL is only for programming or erasing, and the period adding the negative voltage is limited during the programming, though prior arts do not utilize negative voltage for the operation of electrons reduction in the cell channel region before programming.

Further, in a file system, a sector size, which is a division in a page as the unit of file management, becomes much smaller than the page size in a conventional OS platform. The page size increases with higher density NAND development, since the larger page size is required in terms of chip cost advantageous based on memory area penalty. Furthermore, the block size also increases with higher density NAND flash memory, as the number of string increases to pursue the cost advantage such as from 32 to 64.

This is because it is defined by binding pages with word lines in a cell string as shown in FIG. 31A. FIG. 31A is a schematic circuit diagram showing a page 3 which is a unit of program and read of data, and a block 12 which is a unit of erase of data in a part of the NAND flash memory device 80, FIG. 31B is a graph showing a trend of the page size over the scaling of the design rule of the prior art, and FIG. 31C is a graph showing a trend of block size over the scaling of the design rule of the prior art, As apparent from FIGS. 31B and 31C, although erase operation is performed in a unit of block, updating specific file is not easily performed by such as sector or page, which is smaller than block size.

FIG. 32A is a schematic circuit diagram showing a page in a part of a NAND flash memory array of the prior art, and FIG. 32B is a schematic circuit diagram showing a size of the page in a part of the NAND flash memory array of FIG. 32A. Although the larger page size for the NAND flash memory is suitable in the conventional application such as a picture card or mobile audio, one sector programming in a page, such as for file copy, wastes most of the memory space as shown in FIGS. 32A and 32B. This is caused by the program disturb, in which unwanted program is occurred at inhibit cells and NOP (Number of Operation for Programming in one page) is limited to only once by the device reason as explained above. Therefore, this requires a data temporal relocation, such as block copy, which is, however, time consuming (>100 msec) in application such as the solid-state drive, because it needs extra program and erase operations as shown in FIG. 33.

FIG. 33 is a schematic block diagram showing a block copy operation upon updating file data of old block 12a to file data of new block 12b in a NAND flash memory device of a prior art. Referring to FIG. 33, a NAND flash memory device includes a NAND flash memory array and a page buffer 9, which is connected to a NAND controller 61 including a buffer memory 61m, and the NAND controller 61 is connected to a host computer 50. The file updating scheme includes the steps of reading the block data from the old block 12a the cell at step S101, outputting the data and inputting data and ECC (Error Correction Code) at step S102, and writing the block data to the new block 12b of the cell at step S103. In this case, the time of the block copying is represented by the following equation (1):

The time of the block copying=(the time of reading data from the cell)+(the time of outputting data)+(the time of processing ECC)+(the time of writing data into the cell)×(the number of pages per block)=125 msec. (1)

This block copy operation is usually performed with the garbage collection, which is operated to organize the file at the case such as file updating and defragmentation in the SSD. This is the major over head at file management system in terms of speed performance, which is to be improved.

Traditionally, the NAND flash memory device limits the NOP for a page to one due to the program-inhibit disturb at the same word line WL as explained in the prior art. When the size of the NAND flash memory device increases beyond such as 16G bits, the page size, which is the maximum readable and programmable unit of memory, increases to 4 KB instead of 2 KB. If the unit of file by operating system is a sector of, e.g. 512 B, where a page of 4 KB consists of 8 sectors. Due to the NOP requirement, the NAND controller 61 needs to implement 4 KB with two sets to enable the page programming with continuous data management by the NAND controller 61 using the buffer memory 61m.

The drawbacks of the data system using the block copy operation are as follows:

(A) The NAND controller 61 manages the data structure arrangement between a sector access unit of operating system of the host computer 50 and the page access unit of the NAND flash memory device. The insufficient utilization of sectors in a page results in resource waste, and in other words, this causes more frequently updating the sector data by the page relocation through the block copy operation as descried above.

(B) The implementation of the buffer memory 61m having 4 KB page becomes a cost penalty. In addition, the cost for revising the design of the NAND controller 61 due to up-sizing of the page size of advanced NAND flash memory device becomes also a cost penalty.

An essential object of the present invention is to provide a programming method for a NAND flash memory device, and a NAND flash memory device, which are capable of reducing or preventing the programming disturb as compared with that of prior art.

Another object of the present invention is to provided a programming method for a NAND flash memory device, and a NAND flash memory device, which are capable of updating data stored in the NAND flash memory device in a unit smaller than that of the prior art at a speed higher than that of the prior art with any block erase operation.

A further object of the present invention is to provided a programming method for a NAND flash memory device, and a NAND flash memory device, which are capable of randomly programming data stored in the NAND flash memory device.

Solution to Problem

According to a first aspect of the present invention, there is provided a programming method for a NAND flash memory device including a memory cell array formed on a P-well of a semiconductor substrate. The memory cell array includes a plurality of cell strings connected to a plurality of word lines. The programming method includes a step of reducing electrons in channel, source and drain regions of the cell strings before a step of programming a memory cell to be programmed.

In the above-mentioned programming method, the step of reducing the electrons includes a step of biasing the word lines to be a voltage lower than a bias voltage of the P-well to accumulate holes at a channel surface to ionize interface traps which will recombine with electrons during a self boosting operation upon programming for inhibit cells.

In addition, in the above-mentioned programming method, the step of reducing includes a step of negatively biasing the word lines against the P-well.

Further, in the above-mentioned programming method, the step of negatively biasing includes step of applying a negative voltage to the word lines with the P-well grounded.

Still further, in the above-mentioned programming method, the step of reducing includes a step of positively biasing the P-well against the word lines.

Still more further, in the above-mentioned programming method, the step of positively biasing includes a step of applying a positive voltage to the P-well with the word lines grounded.

Still more further, in the above-mentioned programming method, the step of positively biasing includes a step of applying a positive voltage to the P-well while applying a negative voltage to the word lines.

According to a second aspect of the present invention, there is provided a programming method for a NAND flash memory device including a memory cell array formed on a P-well of a semiconductor substrate. The memory cell array includes a plurality of cell strings connected to word lines and is divided into a plurality of blocks, where each block corresponds to respective word lines selected from the word lines. The programming method includes a step of reducing channel electrons in the cell strings, and a step of applying a program voltage to at least one selected word line while applying one or several pass voltages Vpass in a range between 0V and the program voltage, to deselected word lines after the step of reducing.

In the above-mentioned programming method, the step of reducing includes a step of negatively biasing the word lines against the P-well.

In addition, in the above-mentioned programming method, the step of negatively biasing includes step of applying a negative voltage to the word lines with the P-well grounded.

Further, in the above-mentioned programming method, the word line which is negatively biased is only one word line connected to a memory cell to be programmed.

Furthermore, in the above-mentioned programming method, the step of negatively biasing includes a step of applying a negative voltage to a plurality of word lines in the memory string, which include one word line connected to a memory cell to be programmed.

Still further, in the above-mentioned programming method, the step of negatively biasing includes a step of applying a negative voltage to all the word lines in a selected block including a memory cell to be programmed.

Still more further, in the above-mentioned programming method, the step of negatively biasing includes a step of applying a negative voltage to all the word lines in a plurality of selected blocks, one selected block including a memory cell to be programmed.

Still furthermore, in the above-mentioned programming method, each cell string is connected to each bit line. The method further includes a step of applying a voltage corresponding to the program voltage to the bit line connected to a memory string to be programmed before the step of reducing the channel electrons, and a step of applying a voltage corresponding to a program inhibit voltage to the bit line connected to a memory string to be unprogrammed before the step of reducing the channel electrons.

Still more furthermore, in the above-mentioned programming method, each cell string is connected to each bit line. The method further includes a step of applying a voltage corresponding to a program inhibit voltage to the bit lines before the step of reducing the channel electrons, and a step of applying a voltage corresponding to the program voltage to the bit line connected to a memory string to be programmed at start of programming.

In the above-mentioned programming method, the step of reducing includes a step of positively biasing the P-well against the word lines in the memory string.

In addition, in the above-mentioned programming method, the step of positively biasing includes a step of applying a positive voltage to the P-well with the word lines in the memory string grounded.

Further, in the above-mentioned programming method, the step of positively biasing includes a step of applying a positive voltage to the P-well while applying a negative voltage to the word lines in the memory string.

Furthermore, the above-mentioned programming method further includes a step of grounding the P-well upon applying the program voltage.

Still further, in the above-mentioned programming method, the step of positively biasing the P-well against the word lines includes a step of applying a negative voltage to only one word line connected to a memory cell to be programmed.

Still more further, In the above-mentioned programming method, the step of positively biasing includes a step of applying a negative voltage to a plurality of word lines in the memory string, which include one word line connected to a memory cell to be programmed.

Still furthermore, In the above-mentioned programming method, the step of positively biasing includes a step of applying a negative voltage to a plurality of word line in the memory string, which include all the word lines in a selected block including a memory cell to be programmed.

Still more further, In the above-mentioned programming method, the step of positively biasing includes a step of applying a negative voltage to a plurality of selected word lines, which include all the word lines in a plurality of selected blocks, one selected block including a memory cell to be programmed.

The above-mentioned programming method further includes a step of setting the bit lines and source line to a floating state upon positively biasing the P-well.

In addition, the above-mentioned programming method further includes a step of applying a voltage corresponding to the program voltage to the bit line including a memory cell to be programmed before the step of positively biasing the P-well, and a step of applying a voltage corresponding to a program inhibit voltage to the bit lines except for the bit line including the memory cell to be programmed before the step of positively biasing the P-well.

The above-mentioned programming method further includes a step of applying a voltage corresponding to the program voltage to the bit line including a memory cell to be programmed after the step of positively biasing the P-well, and a step of applying a voltage corresponding to a program inhibit voltage to the bit lines except for the bit line including the memory cell to be programmed after the step of positively biasing the P-well.

In addition, the above-mentioned programming method includes a step of applying a voltage corresponding to a program inhibit voltage to the bit lines before the step of positively biasing the P-well, and a step of applying a voltage corresponding to the program voltage to the bit lines including the memory cell to be programmed upon programming the memory cell.

Further, in the above-mentioned programming method, the step of negatively biasing the word lines against the P-well includes a step of changing a relative voltage to be biased to the selected word lines, against the P-well, in an order of a negative voltage before a first period, 0V in the first period, the pass voltage Vpass in the second period, and the program voltage or the pass voltage Vpass in the third period.

Furthermore, in the above-mentioned programming method, the step of negatively biasing the word lines against the P-well includes a step of changing a relative voltage to be biased to the selected word lines, against the P-well, in an order of 0V before a first period, a negative voltage in the first period, the pass voltage Vpass in the second period, and the program voltage or the pass voltage Vpass in the third period.

Still further, in the above-mentioned programming method, the step of negatively biasing the word lines against the P-well includes a step of changing a relative voltage to be biased to the selected word lines, against the P-well, in an order of a pre-charge voltage before a first period, a negative voltage in the first period, the pass voltage Vpass in the second period, and the program voltage or the pass voltage Vpass in the third period.

Still more further, in the above-mentioned programming method, the step of negatively biasing the word lines against the P-well includes a step of changing a relative voltage to be biased to the selected word lines, against the P-well, in an order of a negative voltage, and then, the program voltage or the pass voltage Vpass.

According to a third aspect of the present invention, there is provided a NAND flash memory device including a memory cell array, first means for applying a program voltage, and second means for reducing channel electrons. The memory cell array is formed on a P-well of a semiconductor substrate, and the memory cell array includes a plurality of cell strings connected to word lines and is divided into a plurality of blocks, where each block corresponds to respective word lines selected from the word lines. The first means applies the program voltage to at least one selected word line in a selected block while applying a pass voltage Vpass to deselected word lines. The second means reduces channel electrons in the cell strings before applying the program voltage.

In the above-mentioned NAND flash memory device, the means for reducing the channel electrons applies a negative voltage to the word lines in the selected block.

In addition, the means for applying the program voltage includes a row decoder. The row decoder includes a block decoder, a level shifter, and a word line driver. The block decoder decodes an address signal to a select signal for selecting a block. The level shifter converts a predetermined voltage into a gate drive voltage in response to the select signal. The word line driver transfers a global word line voltage to the word lines. Each of the level shifter and the word line driver includes N-channel transistors which are formed in a Triple-well of the semiconductor substrate. The row decoder generates a negative voltage for reducing the channel electrons.

In the above-mentioned NAND flash memory device, the row decoder changes the negative voltage to 0V after reducing the channel electrons.

In addition, in the above-mentioned NAND flash memory device, the row decoder generates a high voltage higher than the negative voltage, and the high voltage at least upon reducing the channel electrons is set to be lower than a voltage obtained by an equation of the high voltage upon programming minus absolute value of the negative voltage.

Further, in the above-mentioned NAND flash memory device, the means for applying the program voltage includes a row decoder. The row decoder includes a block decoder, a level shifter, and a word line driver. The block decoder decodes an address signal to a select signal for selecting a block, the level shifter converts a predetermined voltage into a gate drive voltage in response to the select signal. The word line driver for transferring a global word line voltage to the word lines. The level shifter includes P-channel transistors.

Furthermore, in the above-mentioned NAND flash memory device, the means for reducing channel electrons applies a positive voltage to the P-well of the semiconductor substrate.

Still further, in the above-mentioned NAND flash memory device, the means for reducing channel electrons inputs the positive voltage from an external circuit, and applies the positive voltage to the P-well of the semiconductor substrate.

According to a fourth aspect of the present invention, there is provided a NAND flash memory device including a memory cell array, reducing means, and programming means. The memory cell array is formed on a P-well of a semiconductor substrate, and the memory cell array includes a plurality of cell strings connected to word lines and is divided into a plurality of blocks, where each block corresponds to respective word lines selected from the word lines, each block is divided into a plurality of pages each page located along each word line, and each page is divided into a plurality of sector corresponding to a predetermined number of memory cells. The reducing means reduces channel electrons in the cell strings. The programming means programs memory cells in a unit of one sector selected from the sectors located within one page after reducing channel electrons.

In the above-mentioned NAND flash memory device, the programming means programs the memory cells while dividing the page into sectors having a number of sectors in the page at maximum.

In addition, in the above-mentioned NAND flash memory device, when the programming means updates data stored in a first sector of a first page of a first block, the programming means randomly programs updated data onto one or ones of combination as selected from among the following: (a) a second sector of the first page of the first block; (b) a sector of a second page of the first block; and (c) a sector of a page of a second block.

According to a fifth aspect of the present invention, there is provided a system for a NAND flash memory device including NAND flash memory, a peripheral circuitry, a control logic, and a NAND controller. The NAND flash memory array performs a step of reducing electrons in channel, source and drain regions of the cell strings before programming a memory cell to be programmed. The peripheral circuitry controls the step of reducing in the NAND flash memory array. The control logic controls an operation of the peripheral circuitry. The NAND controller includes a buffer memory and manages an interface with an operation system in a unit of one sector of the NAND flash memory array.

In the above-mentioned system, the NAND controller controls data of the NAND flash memory array to be randomly programmed therein.

In addition, in the above-mentioned system, the buffer memory has a size of one sector of the NAND flash memory array.

Further, in the above-mentioned system, NOP (Number of Operation for Programming in one page) of NAND flash memory array is equal to or larger than two.

Still further, in the above-mentioned system, the NAND controller controls update data in a page of the NAND memory array to relocate to the same page without deleting old data.

Still more further, in the above-mentioned system, the NAND controller controls update data in a page of the NAND flash memory array to relocate to the same page, without deleting old data and erase operation within the same block.

Still furthermore, in the above-mentioned system, the NAND controller controls update data in a sector of a page of the NAND flash memory array to relocate to an empty sector within the same page with saving old data as an invalid data, without erase operation within the same block.

The present invention provides a programming method for a NAND flash memory device that applies a new pulse sequence and biasing condition in a programming scheme to prevent the programming disturb of the inhibit cell strings.

Accordingly, the present invention provides a programming method for the NAND flash memory device, which is capable of reducing the programming disturb by utilizing a new self-boosting architecture which eliminates the excess electrons in the channel of NAND flash memory cell string that would be the cause of the programming disturb.

The present invention also provides a programming method for the NAND flash memory device, which performs a channel electron reducing step before boosting a cell string to reduce the programming disturb.

According to an aspect of the present invention, a programming method of NAND flash memory device is provided, which causes self-boosting of an inhibit cell string and performs a channel electron reducing step before the self-boosting of the inhibit cell string.

According to another aspect of the present invention, the channel electron reducing step includes a step of applying a negative voltage to the word lines coupled to the inhibit cell string.

According to a further aspect of the present invention, the negative voltage is equal to or lower than the threshold voltage of a memory cell in the inhibit cell string.

According to a still further aspect of the present invention, the positive bias is applied to the P-well through the N-well and word lines WL are grounded, where the positive bias voltage is equal to or higher than the threshold voltage of a memory cell in the inhibit cell string. The programming scheme is identical to applying a negative voltage to the word line WL to achieve the hole accumulation condition where the P-well is grounded.

According to a still furthermore aspect of the present invention, a NAND flash memory with high reliability and performance is provided. Our proposed NAND operation provides high programming disturb immunity by applying a negative voltage before boosting the memory channel to make the holes accumulate at the channel surface. These holes will ionize the donor typed interface traps to being positively charged, which captures electrons, in which electron-hole recombination process is accomplished. Thus, the channel electrons that would otherwise cause the programming disturb are eliminated through the negative voltage period, thereby preventing a poor boosting problem.

According to a still more further aspect of the present invention, our proposed peripheral circuitry and sequence are provided to enable our invented programming scheme for generating a negative bias voltage and a positive bias voltage supplied by our proposed row decoder.

According to a still more furthermore aspect of the present invention, our proposed another sequence for positive biasing to P-well from n-well is also described, which is identical to negative bias to WL gate with grounded P-well as the electron reducing step.

Advantageous Effects of Invention

According to the present invention, our proposed programming method for the NAND flash memory device, and our proposed NAND flash memory device are capable of reducing or preventing the programming disturb as compared with that of prior art.

In addition, according to the present invention, our proposed programming method for the NAND flash memory device, and our proposed NAND flash memory device are capable of updating data stored in the NAND flash memory device in a unit smaller than that of the prior art at a speed higher than that of the prior art with any block erase operation and without any garbage by the programming disturb.

Further, according to the present invention, our proposed programming method for the NAND flash memory device, and our proposed NAND flash memory device are capable of randomly programming data stored in the NAND flash memory device.

Still further, according to the present invention, our proposed programming method for the NAND flash memory device, and our proposed NAND flash memory device can reduce the frequency of page relocation: Once there is an empty sector in a used page, updating a sector can be carried out by a well-known read-modify-write process. Our proposed programming method includes a step of reading the selected sector from the NAND flash memory to the buffer memory of the NAND controller, and a step of modifying the loaded content subsequently. Afterwards, the NAND controller writes back the updated sector to the empty sector in the same page with flag change accordingly. Consequently, the re-use of the used page without any block erase can dramatically lower the page-relocation frequency.

Still more further, according to the present invention, our proposed programming method for the NAND flash memory device, and our proposed NAND flash memory device can reduce the size of the buffer memory of the NAND controller, and eliminating the product revision frequency due to the upgrade of the NAND flash memory.

Still furthermore, according to the present invention, our proposed programming method for the NAND flash memory device, and our proposed NAND flash memory device can reduce the storage wearing-rate by the reduced frequency of page relocation. Once there is empty sector in a used page, updating a sector can be carried out by a well-known read-modify-write process. Our proposed programming method includes a step of reading data of the selected sector from the NAND flash memory to the buffer memory of the NAND controller, and a step of modifying the loaded content subsequently. Afterwards, the NAND controller writes back data of the updated sector to the empty sector in the same page with flag change accordingly. Consequently, the re-use of the used page can dramatically lower the page-relocation frequency, since NOP is not restricted and no extra erase is carried out through this operation. This advantageous effect in the background delivers an enhanced wearing rate for the storage device.

Still more furthermore, according to the present invention, our proposed programming method for the NAND flash memory device, and our proposed NAND flash memory device can reduce the storage component cost by leveraging the cost-effective small-buffered NAND controller, and can eliminate the storage product revision frequency due to the upgrade of the NAND flash memory technology.

BRIEF DESCRIPTION OF DRAWINGS

FIG. 2 is a longitudinal cross sectional view along a cell string of a configuration of the NAND flash memory array 2 of FIGS. 1A and 1B;

FIG. 22 is a timing chart showing another programming scheme of the second preferred embodiment, in particular, showing a relationship between a timing of bit line pre-charge and a timing of word line negative voltage setting;

FIG. 31A is a schematic circuit diagram showing a page 3 which is a unit of program and read of data, and a block 12 which is a unit of erase of data in a part of the NAND flash memory device 80;

FIG. 37A is a schematic block diagram showing a relocation scheme between the buffer memory 61*m* and the NAND memory array 2 according to a third preferred embodiment of the present invention;

FIG. 39 is a table of respective voltages to be set in three periods in the NAND flash memory device during a programming sequence according to a modification of the preferred embodiments.

DESCRIPTION OF EMBODIMENTS

Figure 1A:
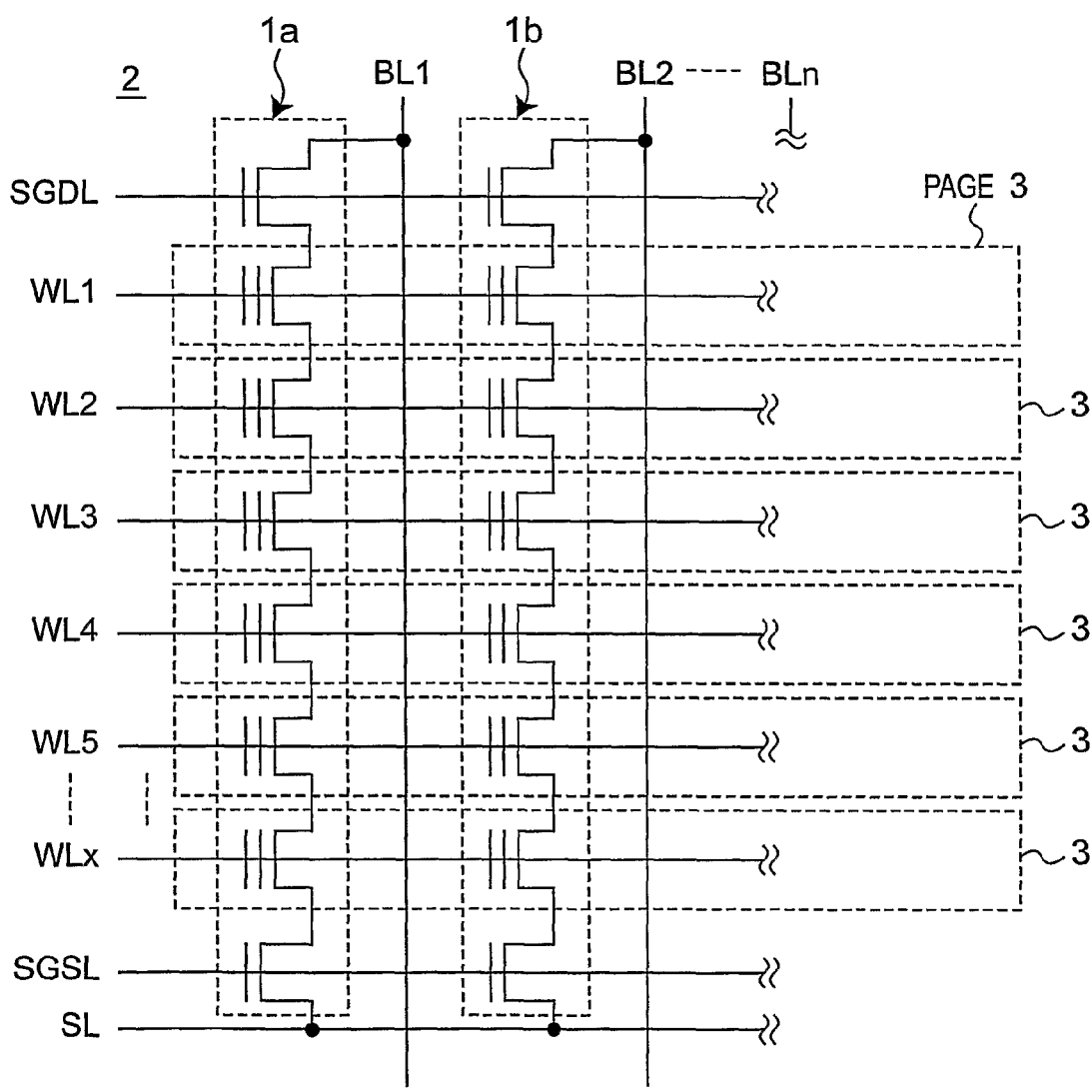
FIG. 1A is a schematic circuit diagram showing a configuration of a NAND flash memory array 2 of a first preferred embodiment according to the present invention.

Reference will be now made in detail to the embodiments of the present invention, examples of which are illustrated in the accompanying drawings. Wherever possible, the same reference numbers are used in the drawings and the description to refer to the same or like parts.

First Preferred Embodiment

Figure 1B:
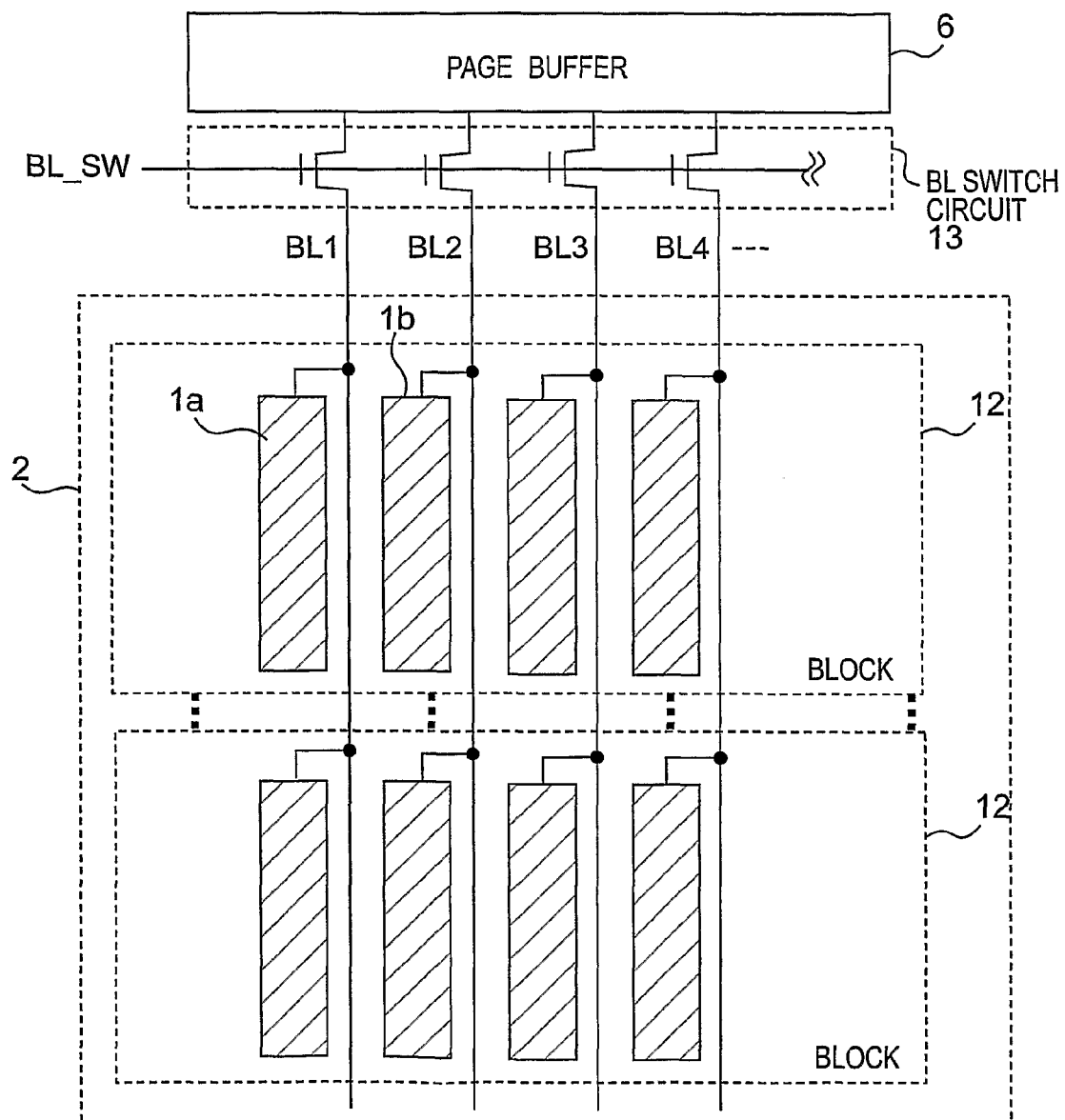
FIG. 1B is a schematic block diagram of a configuration of the NAND flash memory array 2 of FIG. 1 and peripheral circuits thereof.

FIG. 1A is a schematic circuit diagram showing a configuration of a NAND flash memory array 2 of a first preferred embodiment according to the present invention, FIG. 1B is a schematic block diagram of a configuration of the NAND flash memory array 2 of FIG. 1 and peripheral circuits thereof, and FIG. 2 is a longitudinal cross sectional view along a cell string of a configuration of the NAND flash memory array 2 of FIGS. 1A and 1B.

Referring to FIG. 1, the NAND flash memory array 2 includes a plurality of word lines WL1 to WLx, two selected gate lines SGSL and SGDL, a plurality of bit lines BL1 to BLn, and a source line SL, where x and n are each an integer equal to or larger than two. The parts of the word lines WL1 to WLx spanning over the active area correspond to memory cells. The cell strings composed of the memory cells are disposed below the bit lines BL1 to BLn, where the cell string 1*a* is connected to the bit line BL1, and the cell string 1*b* is connected to the bit line BL2. Namely, the intersections between the bit lines BL1 to BLn and the word lines WL1 to WLx respectively correspond to the memory cells. In this case, the bit line BL1 is the selected bit line, the other bit lines are deselected bit lines, the word line WL3 is the selected word line, and the other word lines are deselected word lines. The cell strings connected with deselected bit lines are inhibit cell strings.

The parts of the two selected gate lines SGDL and SGSL spanning over the active area respectively serve as the gates of the drain-side select transistors or SGDL transistors, and the gates of the source-side select transistors or SGSL transistors. The structures of the memory cells and the select transistors will be described below.

Referring to FIG. 1B, the NAND memory array 2 is divided into a plurality of blocks 12, and respective bit lines BL1 to BLn are connected via a bit line (BL) switch circuit 13 to a page buffer 6.

Referring to FIG. 2, each cell M includes a dielectric layer 106, a floating gate (FG) 108 of a charge storage layer, a dielectric layer 110, a control gate 112 and doped regions 114. The floating gate 108 may be disposed between the control gate 112 and the substrate 100, possibly including a conductive material like doped polysilicon or a charge-trapping material like silicon nitride. The selected transistor T includes, from the bottom to the top, a dielectric layer 116 and a conductive layer 118 which may be composed of two conductive layers 118*a* and 118*b*.

The drain regions D may be respectively disposed in the substrate 100 at one side of the cell strings, and may be electrically connected to the bit lines respectively through a plug 121. The source regions S may be respectively disposed in the substrate 100 at the other side of the cell strings. A plug 120 is disposed to be electrically connected with the N-well 102, and a plug 122 is disposed to be electrically connected with the P-well 104.

Figure 3:
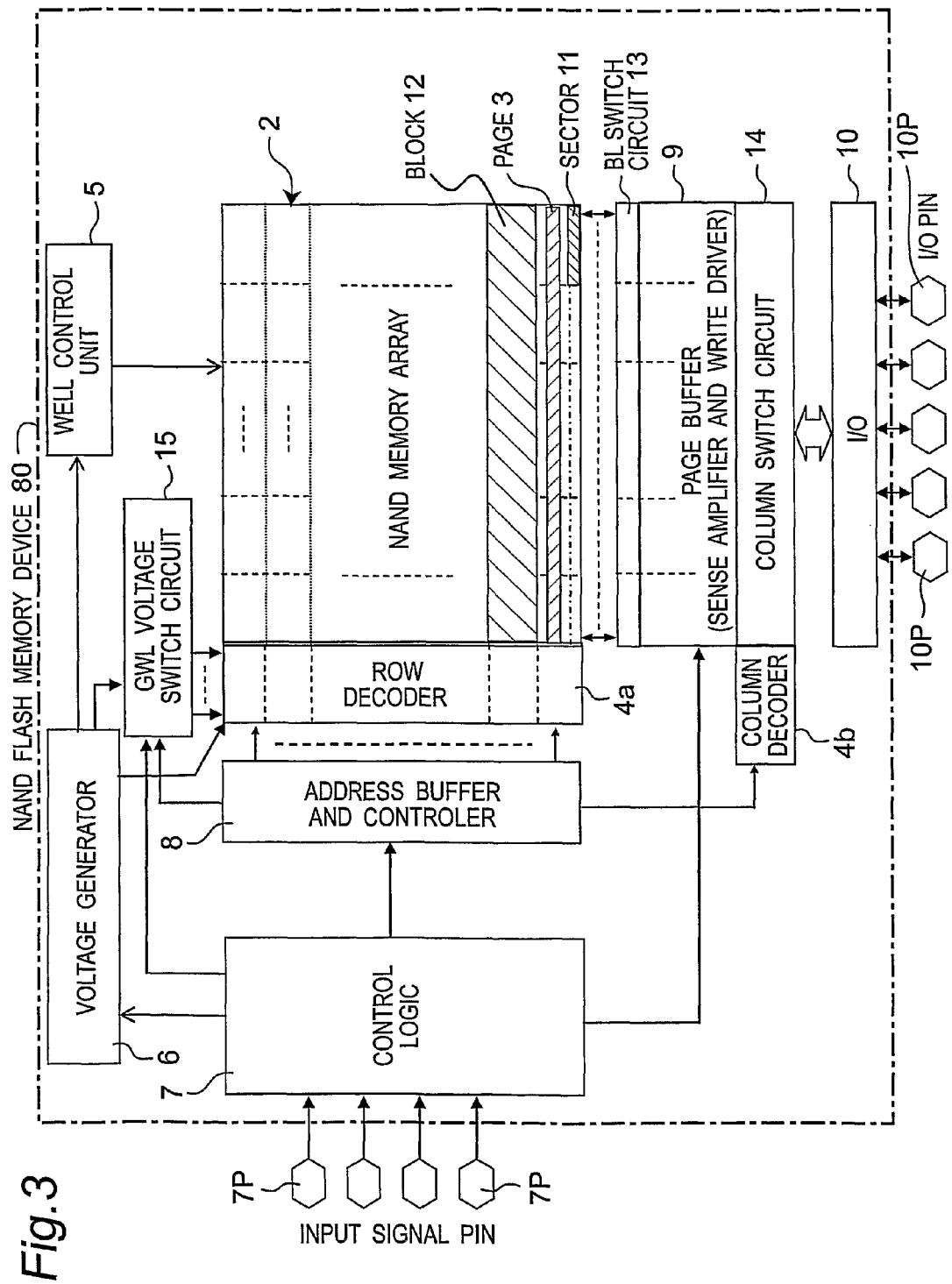
FIG. 3 is a schematic block diagram showing a configuration of an NAND flash memory device 80 including the NAND flash memory array 2 of FIGS. 1A, 1B and 2.
Figure 4:
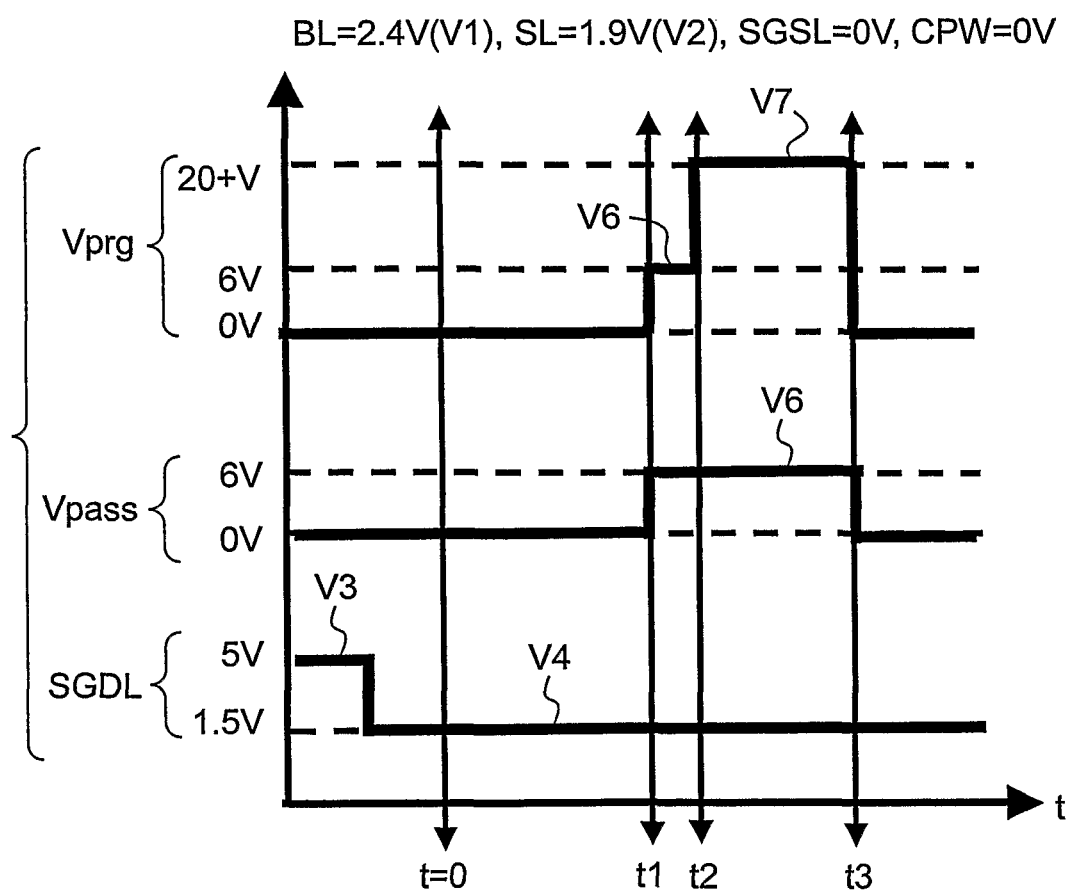
FIG. 4 is a timing chart showing a conventional programming operation of a NAND flash memory device of a prior art.
Figure 5:
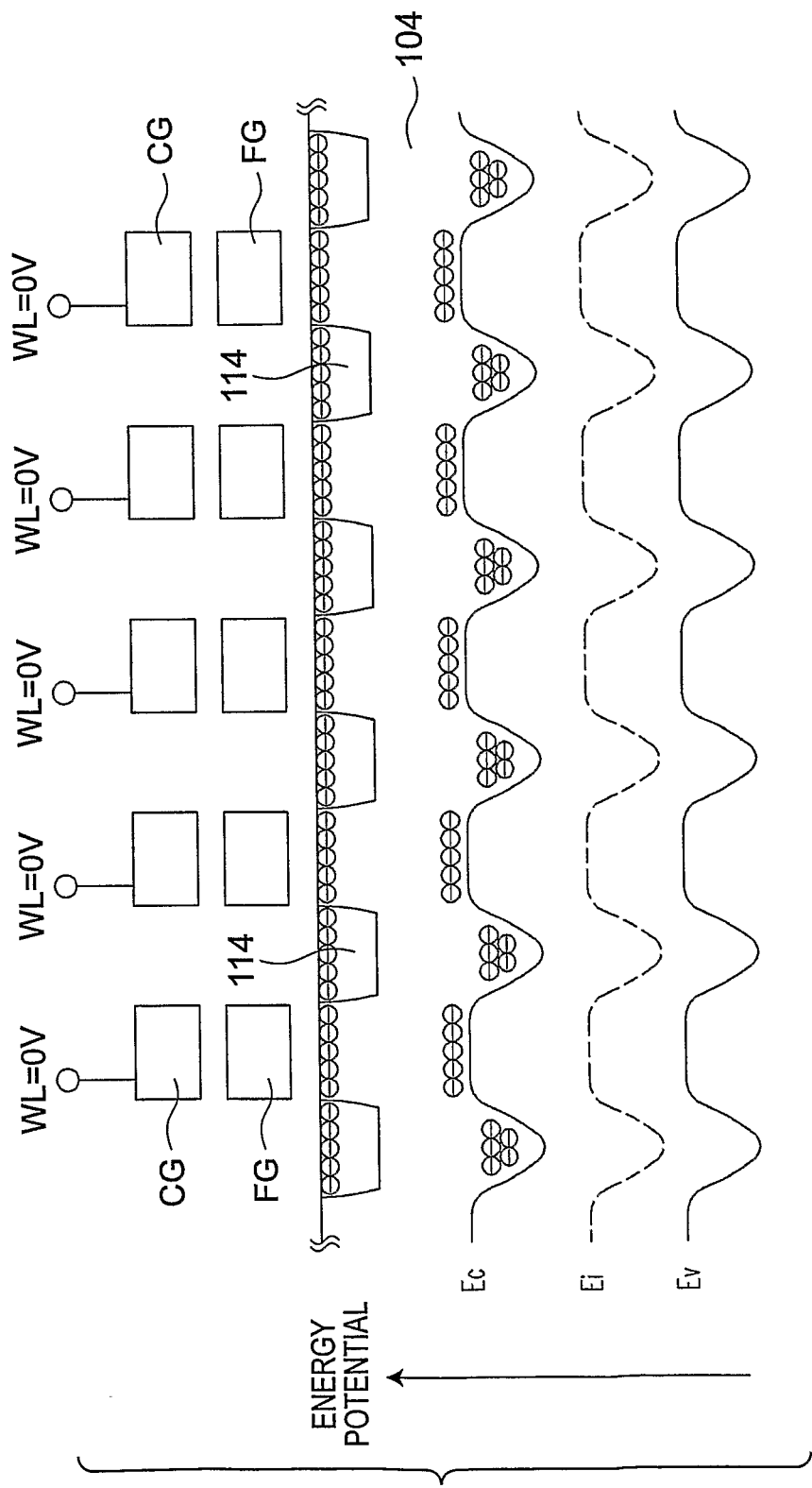
FIG. 5 is a schematic longitudinal cross sectional view and a horizontal energy band diagram along an inhibit cell string of the NAND flash memory device of the prior art, showing an electron density at a Si-interface during a period of t<t0.
Figure 6:
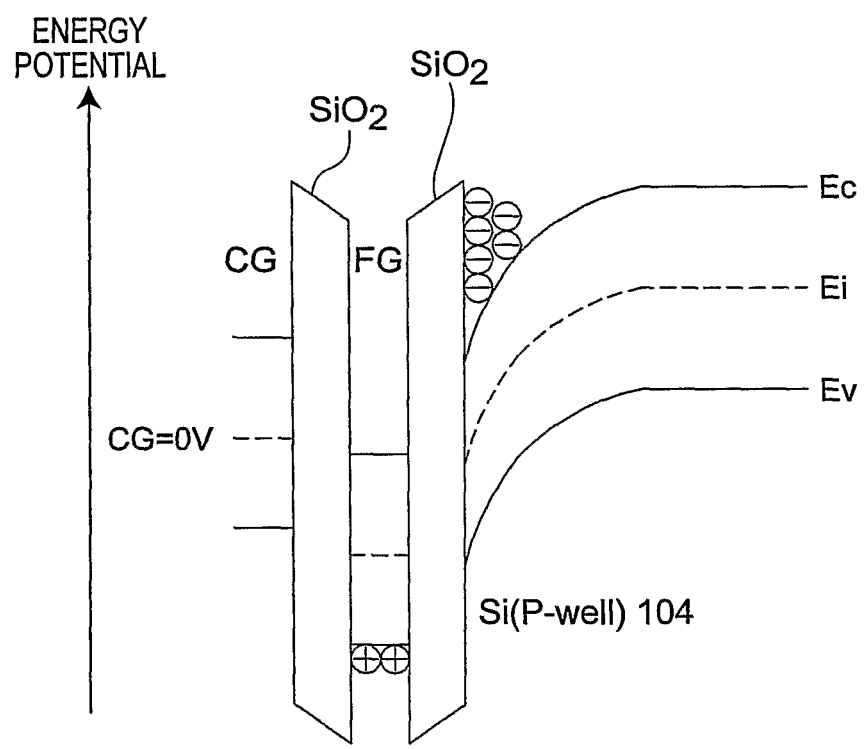
FIG. 6 is a vertical energy band diagram along an inhibit cell string of the NAND flash memory device of the prior art, showing an electron density at a cell channel thereof during a period of t>t0.
Figure 7:
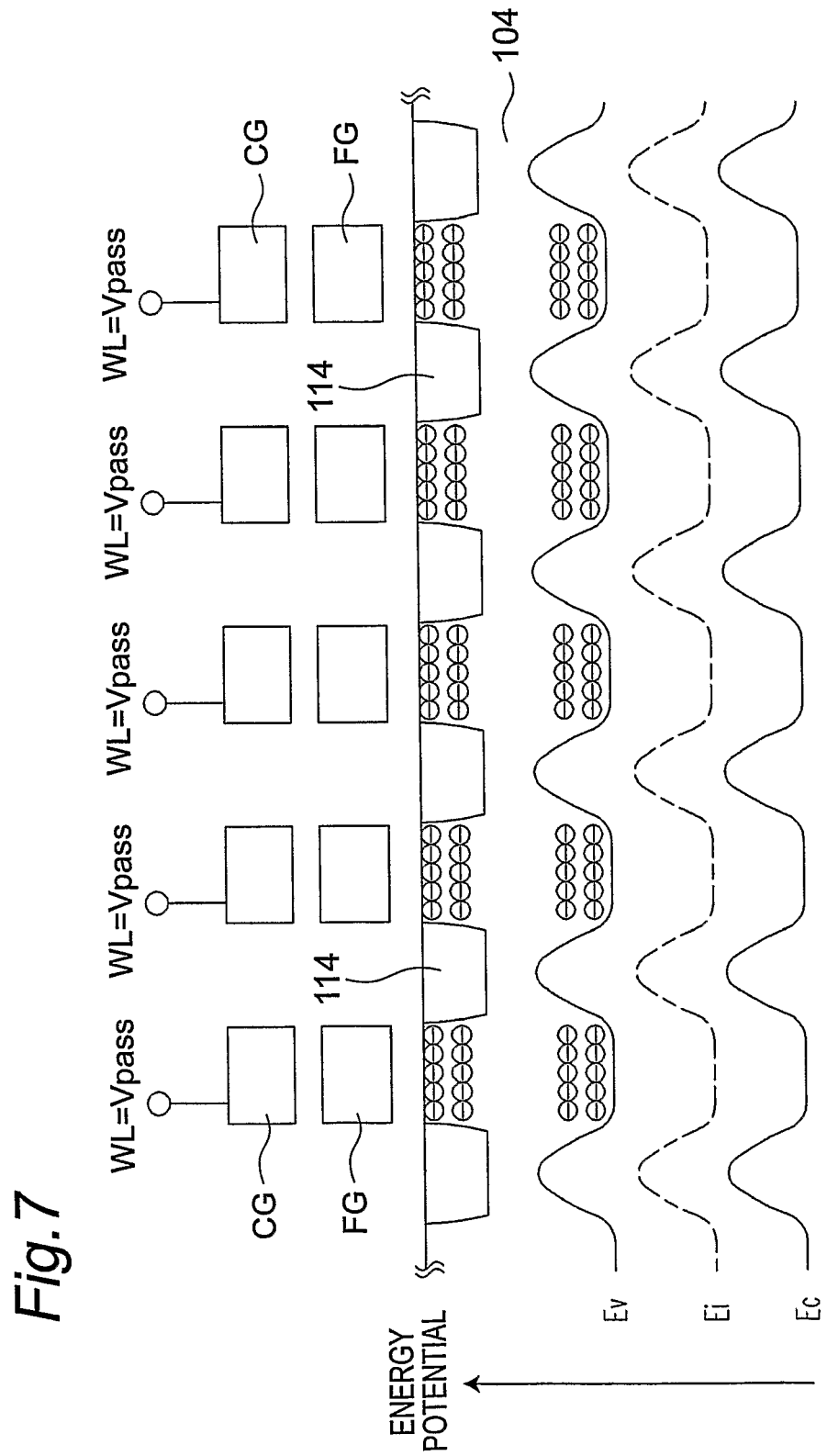
FIG. 7 is a schematic longitudinal cross sectional view and a horizontal energy band diagram along the inhibit cell string of the NAND flash memory device of the prior art, showing an electron density at the Si-interface during a period of t1<t<t2.
Figure 8:
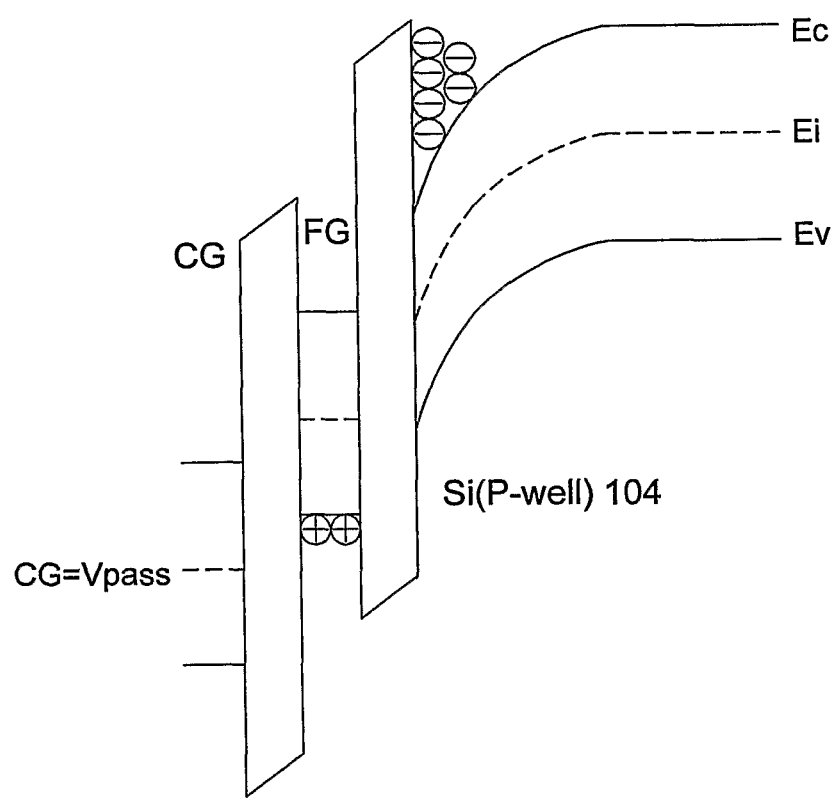
FIG. 8 is a vertical energy band diagram along the inhibit cell string of the NAND flash memory device of the prior art, showing an electron density at the cell channel thereof during a period of t1<t<t2.
Figure 9:
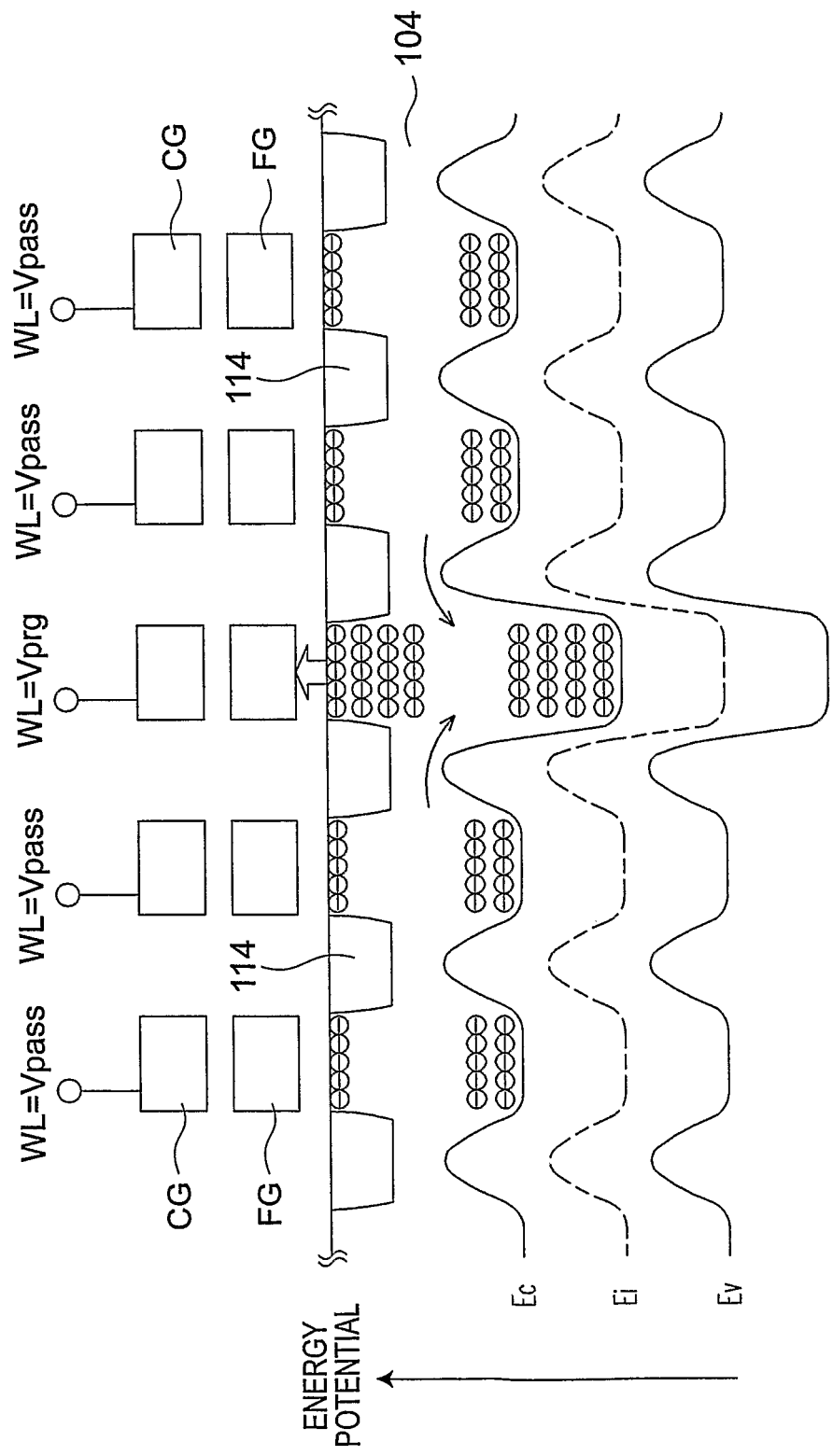
FIG. 9 is a schematic longitudinal cross sectional view and a horizontal energy band diagram along the inhibit cell string of the NAND flash memory device of the prior art, showing an electron density at the Si-interface during a period of t2<t<t3.
Figure 10:
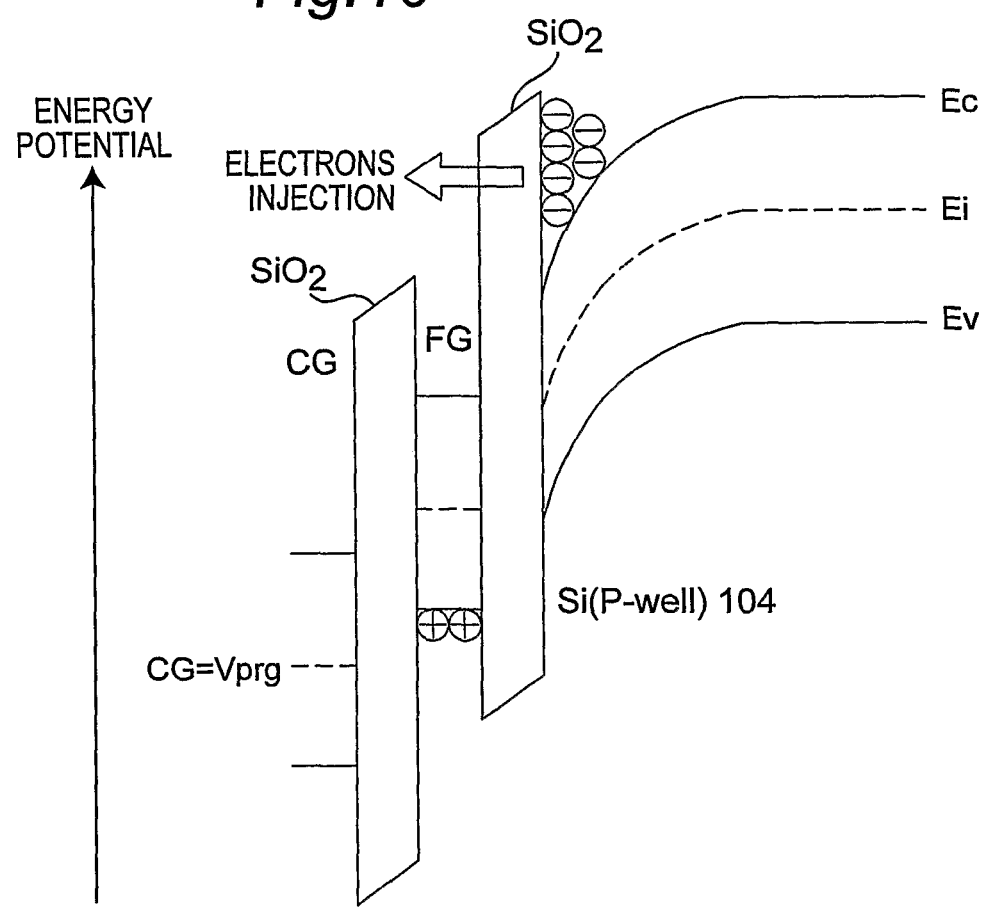
FIG. 10 is a vertical energy band diagram along the inhibit cell string of the NAND flash memory device of the prior art, showing an electron density at the cell channel thereof during a period of t2<t<t3.
Figure 11:
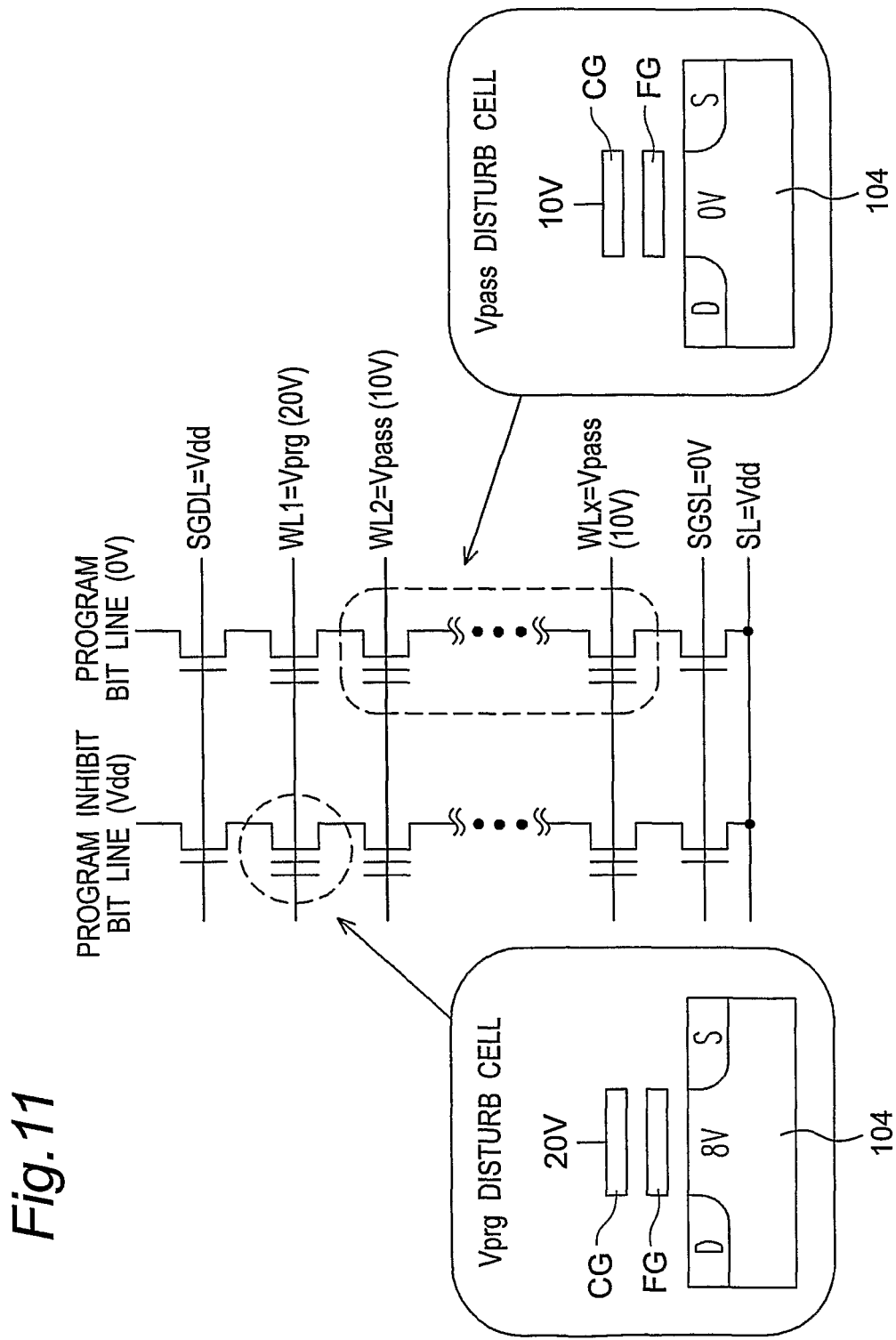
FIG. 11 is a schematic circuit diagram showing a bit line programming scheme for a basic NAND flash memory device of a prior art.

FIG. 3 is a schematic block diagram showing a configuration of an NAND flash memory device 80 including the NAND flash memory array 2 of FIGS. 1A, 1B and 2.

Referring to FIG. 3, various kinds of control signals are inputted via input signals pins 7P to a control logic 7, which generates and outputs control command signals to a voltage generator 6, an address buffer and controller 8, a page buffer 9 including a sense amplifier and a write deriver, and a global word line (GWL) voltage switch circuit (referred to as a GWL voltage switch circuit hereinafter) 15. The voltage generator 6 generates and outputs various control voltages to a well control unit 5, the GWL voltage switch circuit 15, and a row decoder 4*a*. Based on the generated voltages from the voltage generator 6, the well control unit 5 generates and outputs well control voltages to the P-well 104 and the N-well 102 of the NAND memory array 2. The GWL voltage switch circuit 15 switches over predetermined GWL voltages from the voltage generator 6 and outputs the same voltages to the row decoder 4*a*.

The address buffer and controller 8 generates and outputs row and column addresses and address signals to the row decoder 4*a*, the GWL voltage switch circuit 15, and the column decoder 4*b*. The row decoder 4*a* decodes the inputted addresses into physical addresses corresponding to the word lines WL of the NAND memory array 2. The column decoder 4*b* decodes the inputted addresses into the physical address corresponding to the bit lines BL of the NAND memory array 2.

Data from and to an external device is inputted and output to and from the NAND memory array 2 vias via input and output pins (I/O pins) 10P, an input and output interface (I/O interface) 10, the column switch circuit 14 controlled by the column decoder 4*b*, the page buffer 9 controller by the control logic 7, and a bit line switch circuit (referred to as a BL switch circuit hereinafter) 13.

The whole area of the NAND memory array 2 is divided into a plurality of blocks 12, each block 12 including cell strings connected to a plurality (e.g. 32 or 64 etc.) of word lines WL, where each block 12 includes several pages 3 each page 3 corresponding to one word line. The page 3 is divided into a plurality (e.g. 66, 132, or more) of sectors 11.

Figure 12:
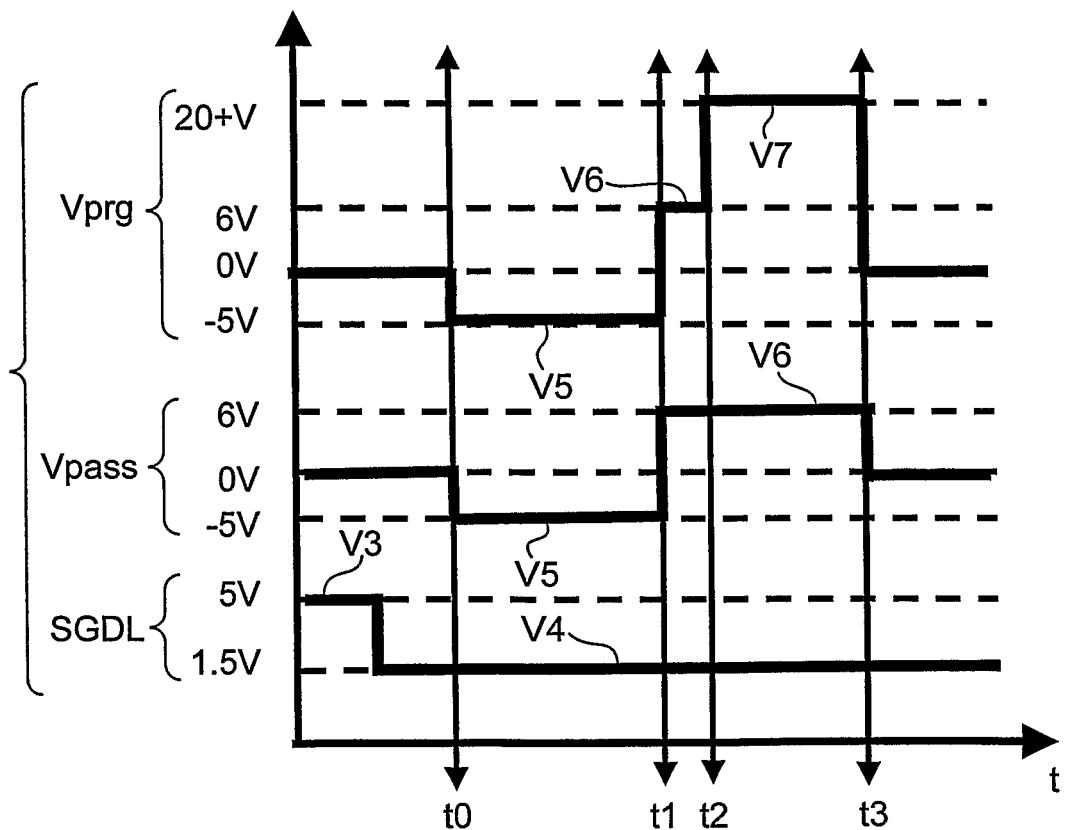
FIG. 12 is a timing chart showing a programming scheme for the NAND flash memory device 80 of FIG. 3 of a preferred embodiment according to the present invention.

FIG. 12 is a timing chart showing a programming scheme for the NAND flash memory device 80 of FIG. 3 of a preferred embodiment according to the present invention.

Referring to FIGS. 1 and 12, the programming scheme for the NAND flash memory device 80 of FIG. 3 will be described below. In a period of t<t0 (t0=0), a voltage V1 is applied to the bit lines BL2 to BLn to be deselected to inhibit the programming while the selected bit line BL1 is grounded to program the same cell. In addition, a voltage V2 is applied to the source line SL, a voltage V3 is applied to the selected gate lines SGDL (connected to the gates of the SGDL transistors), and is dropped to a voltage V4, and the word lines WL1 to WLx and the selected gate lines SGSL (connected to the gates of the SGSL transistors) are grounded to be set to a voltage of 0V.

In the present preferred embodiment, the voltage V1 is set to about 2.4V, the voltage V2 is set to about 1.9V, the voltage V3 is set to about 5V, and the voltage V4 is set to about 1.5V. In the period of t<t0, the electrons in the cell strings are swept to the bit lines BL1 to BLn through the SGDL transistors at V3 to reduce the electron density in the cell channel. in a period of t<t0. Changing the bias voltage applied to the gate line SGDL from the voltage V3 to the voltage V4, the connections to the SGDL and SGSL transistors must be cut off to prevent any reverse electron flow from the bit line BL or the source line SL to the cell string.

It is also effective to apply a positive voltage to the word lines WL1 to WLx to assist the carrier transfer to bit lines while applying V3 voltage to the gate line SGDL. However, this is not enough to remove the excess channel electrons, since the cell string length is too long to fully transfer the electrons to the bit line BL and the removal depends on the programmed data pattern in the cell string. When some memory cells in the cell string are in programmed states, it is difficult for the electrons in the memory cells between a programmed cell and the selected SGSL transistor to move to the bit line BL.

Referring to FIG. 12, in the period of t<t0, the voltage applied to the selected gate line SGDL (connected to the gates of the selected SGDL transistors) is changed from the voltage V3 to the voltage V4. The voltage V4 is set to be lower than the voltage V3 to cut off the string channel potential from the bit line BL through the selected SGDL transistor. These processes are done in a manner similar to that of the prior art.

The programming scheme of the present invention is characterized by including a step of applying a negative voltage V5 to the word lines WL1 to WLx in the period of t0<t<t 1, prior to a boosting phase of applying a positive voltage V6 in a period of t1<t<t2.

Figure 13:
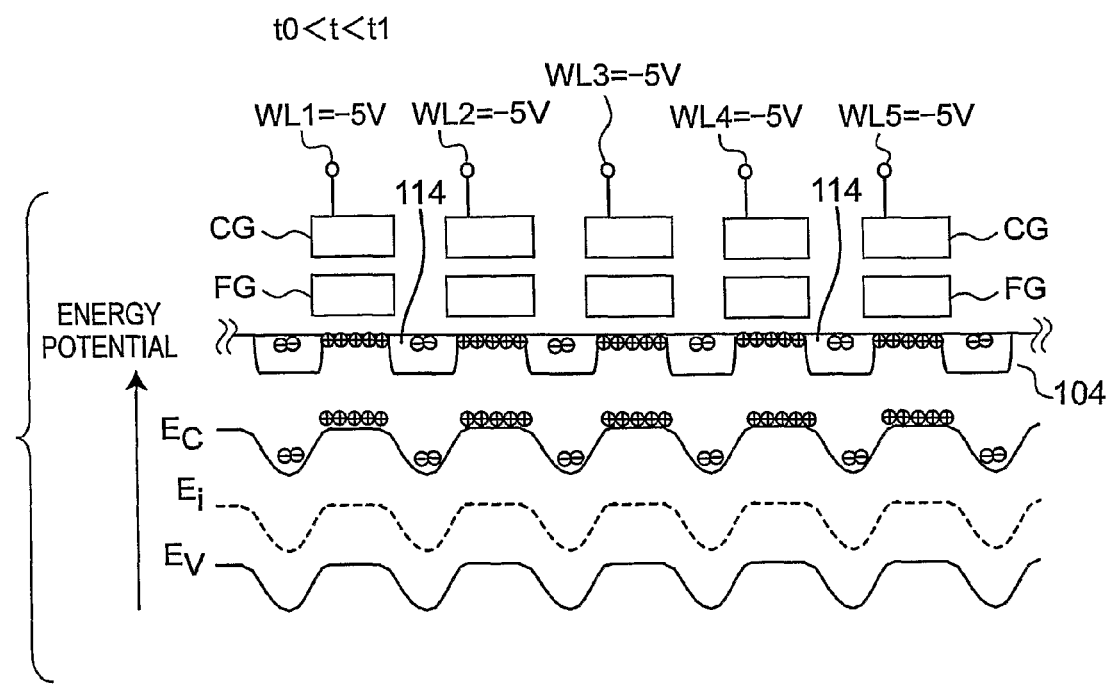
FIG. 13 is a schematic longitudinal cross sectional view and a horizontal energy band diagram along an inhibit cell string of the NAND flash memory device 80 of FIG. 3, showing an electron density at a Si-interface during a period of t0<t<t1.
Figure 14:
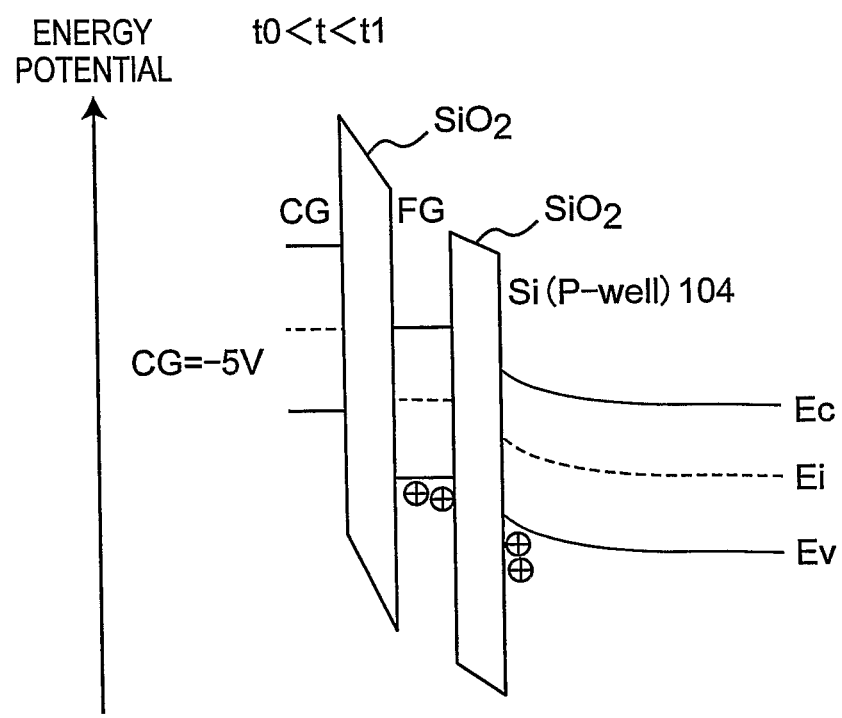
FIG. 14 is a vertical energy band diagram along the inhibit cell string of the NAND flash memory device 80 of FIG. 3, showing an electron density at the cell channel thereof during a period of t0<t<t1.

FIG. 13 is a schematic longitudinal cross sectional view and a horizontal energy band diagram along an inhibit cell string of the NAND flash memory device 80 of FIG. 3, showing an electron density at a Si-interface during a period of t0<t<t 1, and FIG. 14 is a vertical energy band diagram along the inhibit cell string of the NAND flash memory device 80 of FIG. 3, showing an electron density at the cell channel thereof during a period of t0<t<t 1. For simple illustration, only five word lines WL1 to WL5 are shown in FIG. 13, which are selected from the word lines WL1 to WLx. Namely, FIGS. 13 and 14 illustrate the horizontal and the vertical band diagrams in a case where all the cells in the cell string have been erased.

In this period, all the word lines WL are negatively biased with a negative voltage of −5V to bring the charge storage layer such as floating gate below a certain voltage to turn off the channels of the memory cells, followed by hole accumulation at the Si-surface of every channel region. In this case, the programming voltage Vprg is equal to the pass voltage Vpass, which is a negative voltage of −5V. These accumulated holes in the cell string will ionize the donor type capture centers, such as interface traps, which will capture electrons so as to be neutralized, which is done based on the electron-hole recombination process. Thus, the holes dominate in every channel region but electrons partially remain within the source and drain regions, where the recombination with electrons occurs near the junctions. The method of reducing electrons is also available even when the negative voltage V5 applied to the word lines WL may be set to a voltage equal to or lower than the threshold voltage Vth of the memory cell. This operating bias condition is effective to reduce the total amount of excess electrons in the entire channel string.

Referring to FIGS. 1 and 12, the programming voltage Vprg applied to the word lines WL1 to WLx is at the timing t 1 changed from the voltage V5 to a voltage V6, which is then applied thereto in a period of t1<t<t2. The voltage V6 is set to a positive voltage equal to or higher than the threshold voltage Vth of the memory cell. In the present preferred embodiment, the voltage V6 is set to about 6V. As shown in FIG. 12, in the period of t1<t<t2, the positive voltage V6 is applied to the word lines WL1 to WLx so that the channel is boosted and the holes are swept away to the substrate under a thermally non-equilibrium condition, in which the un-recombined electrons are induced to the surface again, and they will be captured and neutralized by the ionized donor type interface traps. A part of the remaining electrons from the sources and drains are transferred to the channel regions. As a result, channel electrons are much reduced by this recombination process.

Figure 15:
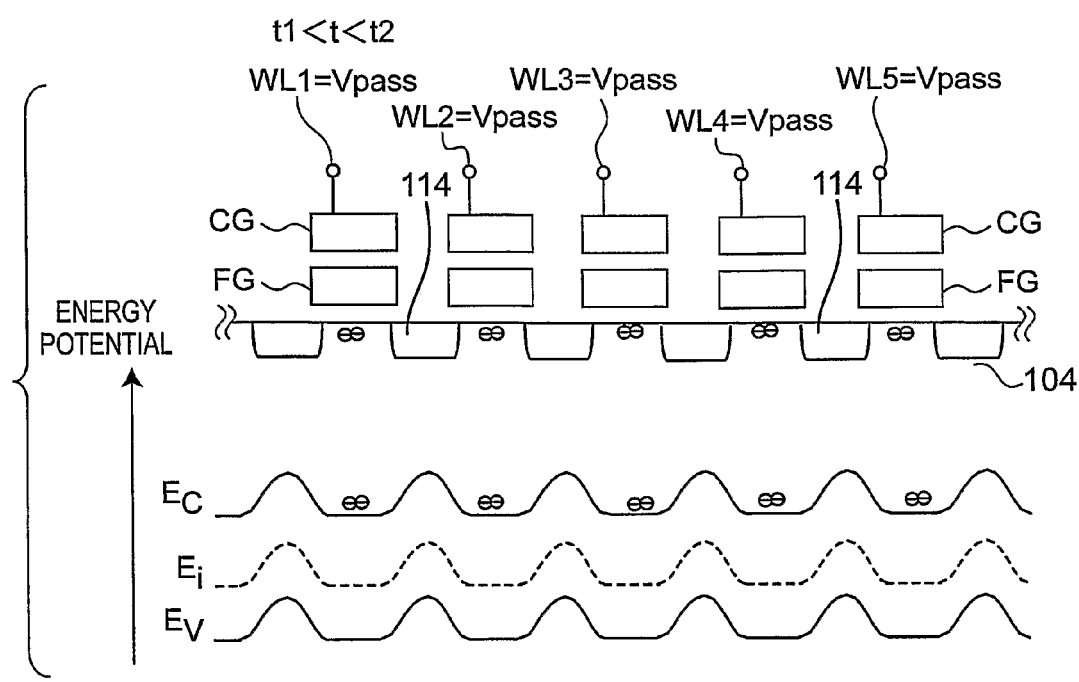
FIG. 15 is a schematic longitudinal cross sectional view and a horizontal energy band diagram along an inhibit cell string of the NAND flash memory device 80 of FIG. 3, showing an electron density at the Si-interface during a period of t1<t<t2.
Figure 16:
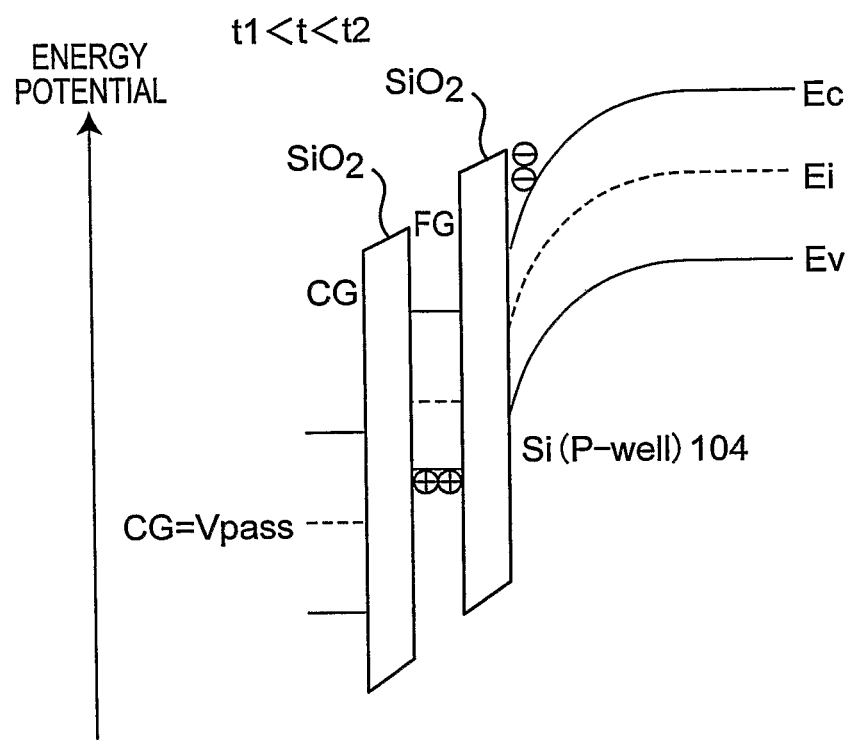
FIG. 16 is a vertical energy band diagram along the inhibit cell string of the NAND flash memory device 80 of FIG. 3, showing an electron density at the cell channel thereof during a period of t1<t<t2.

FIG. 15 is a schematic longitudinal cross sectional view and a horizontal energy band diagram along an inhibit cell string of the NAND flash memory device 80 of FIG. 3, showing an electron density at the Si-interface during a period of t1<t<t2, and FIG. 16 is a vertical energy band diagram along the inhibit cell string of the NAND flash memory device 80 of FIG. 3, showing an electron density at the cell channel thereof during a period of t1<t<t2. In FIGS. 15 and 16, for simple illustration, only the word lines WL1 to WL5 are shown which are selected from the word lines WL1 to WLx.

In this period, the programming voltage Vprg is equal to the pass voltage Vpass, which is a positive voltage of 6V. With the above operation, the electron density becomes much lower than that of the prior art, as shown in FIGS. 15 and 16 that respectively show the horizontal and the vertical band diagrams along a cell channel. This is because the number of electrons has been much reduced by accumulating the holes at the channel surface through recombination with electrons at the recombination centers induced during the period of (t0<t<t1) under a condition of the negative gate bias voltage V5.

Figure 17:
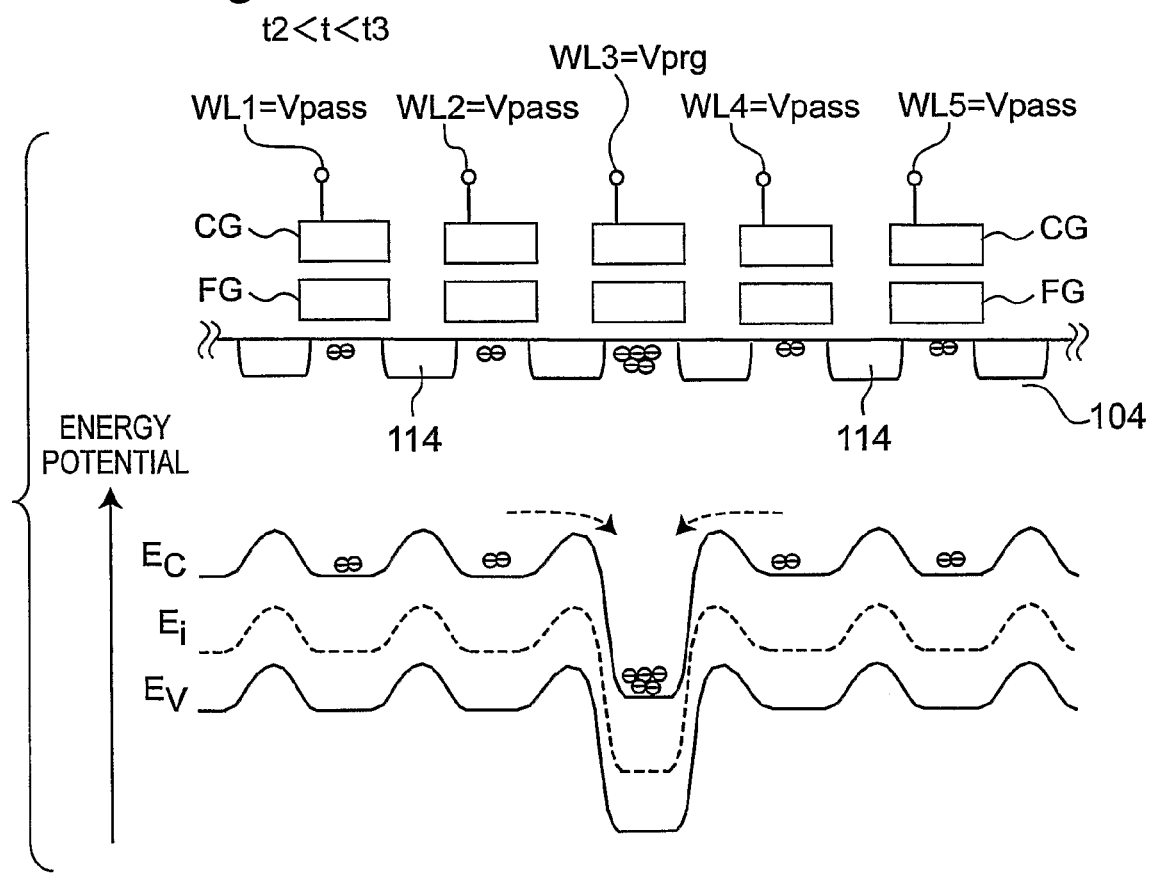
FIG. 17 is a schematic longitudinal cross sectional view and a horizontal energy band diagram along an inhibit cell string of the NAND flash memory device 80 of FIG. 3, showing an electron density at the Si-interface during a period of t2<t<t3.
Figure 18:
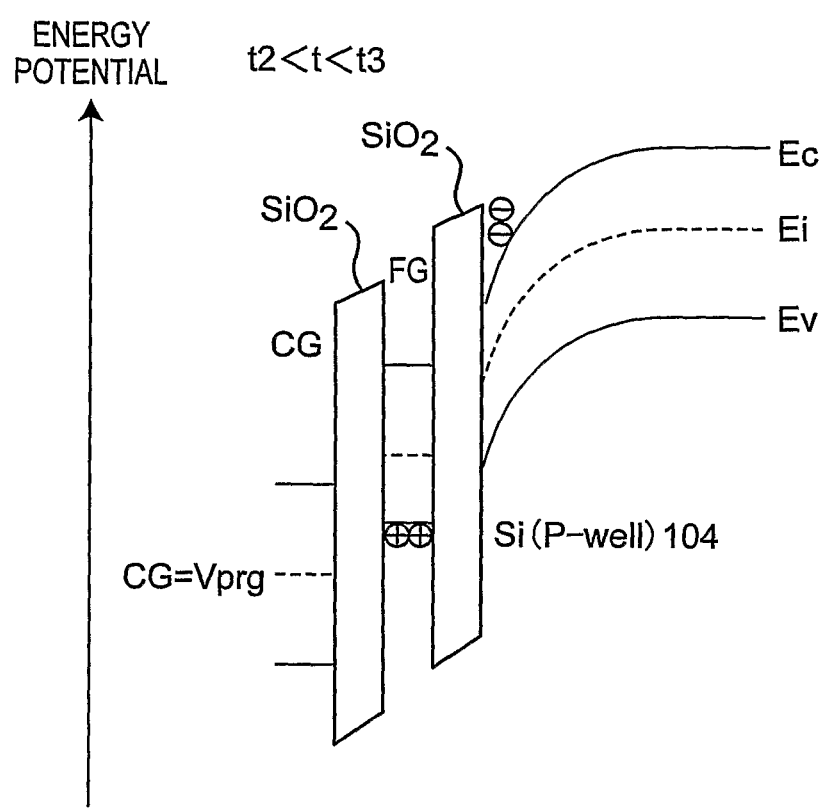
FIG. 18 is a vertical energy band diagram along the inhibit cell string of the NAND flash memory device 80 of FIG. 3, showing an electron density at the cell channel thereof during a period of t2<t<t3.

FIG. 17 is a schematic longitudinal cross sectional view and a horizontal energy band diagram along an inhibit cell string of the NAND flash memory device 80 of FIG. 3, showing an electron density at the Si-interface during a period of t2<t<t3, and FIG. 18 is a vertical energy band diagram along the inhibit cell string of the NAND flash memory device 80 of FIG. 3, showing an electron density at the cell channel thereof during a period of t2<t<t3. For simple illustration, in FIGS. 17 and 18, only the word lines WL1 to WL5 are shown which are selected from the word lines WL1 to WLx.

Referring to FIGS. 1 and 12, the programming voltage Vprg applied to the selected word line WL3 is changed at the timing t2 from the voltage V6 to the voltage V7 which is then applied thereto in the period of t2<t<t3, while the pass voltage Vpass is still applied to the other word lines WL1, WL2, WL4 and WL5 as shown in FIG. 17. In addition, the voltage applied to the selected bit line BL1 is changed at the timing t2 from the voltage V1 to the voltage 0V, so that the selected cell is programmed in the period of t2<t<t3. The voltage V7 is set to be higher than voltage V6, and the voltage V7 is about 20V or more in the present preferred embodiment.

As shown in FIGS. 1 and 12, since the programming voltage Vprg=V6 is applied to the selected word line WL3 in the period of t2<t<t3 while the pass voltage Vpass=V6 is applied to the other word lines word lines WL1, WL2, WL4 and WL5 as shown in FIG. 17. In this case, the voltage applied to the deselected bit line BL2 is kept to be V1 level, most of electrons are laterally transferred and gathered into the channel of the inhibit cells under the selected word line WL3 through drift and diffusion charge driven transfer. Before gathering of the electrons, the number of electrons has been already much reduced during the previous period (t1<t<t2) by the mechanism explained above, as shown in FIGS. 17 and 18 that respectively illustrate the horizontal and the vertical band diagrams along the cell channel. The surface potential of the inhibit cell can be maintained at high potential level, since the electron density has been much decreased through the procedure of the first preferred embodiment of the present invention. Thus, the electric field at the gate oxide can be sufficiently lowered to avoid any electron tunneling. As a result, the programming disturb is effectively prevented with the operation of the preferred embodiment of present invention.

Figure 19:
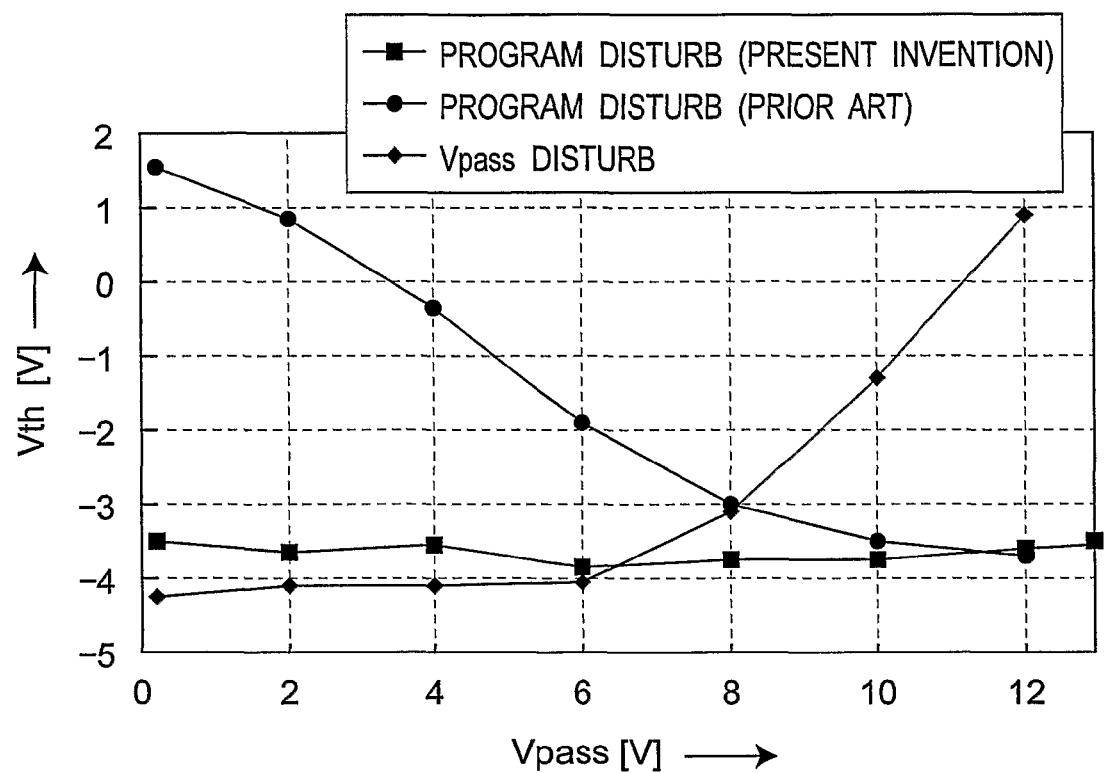
FIG. 19 is a graph showing disturb characteristics of a threshold voltage Vth to a Vpass voltage of the NAND flash memory devices according to the preferred embodiment, the prior art and the Vpass disturb case.

FIG. 19 is a graph showing disturb characteristics of a threshold voltage Vth to a Vpass voltage of the NAND flash memory devices according to the preferred embodiment, the prior art and the Vpass disturb case. Namely, FIG. 19 shows experiment results, in which the programming disturb characteristics are compared between the present invention and the prior art with self-boosting. As apparent from FIG. 19, the programming disturb is highly suppressed than that of prior art over the wide range of the pass voltage Vpass.

The programming method according to the preferred embodiment of the present invention is also applicable to cases of various data patterns of the NAND flash memory cell string where the surface potential is not uniformly distributed due to different floating gate potentials. The programming method is also applicable to the NAND flash memory of charge-trapping type, such as SONOS (Silicon Oxide Nitride Oxide Silicon) NAND flash memory, since such memory is also likely to suffer from the programming disturb. The method of applying the negative voltage V6 to all the word lines WL before applying the positive programming voltage Vprg=V7 to the word line WL is also applicable to a NAND flash memory that uses a ferroelectric material between the word lines WL and the semiconductor substrate 100.

Moreover, the programming method of the preferred embodiment of the present invention allows multiple sectors to be programmed in a page to solve the programming disturb problem of the NAND flash memory not only for single-level cell (SLC) devices but also for multi-level cell (MLC) devices.

Figure 38A:
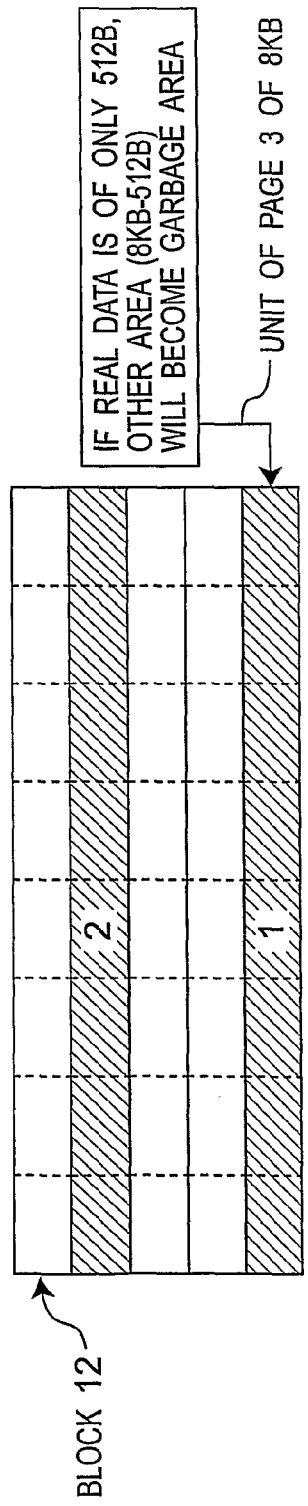
FIG. 38A is a schematic block diagram of a block 12 of the NAND memory array 2 showing an impossibly random programming with a unit of page 3 of 8 KB according to the prior art.
Figure 38B:
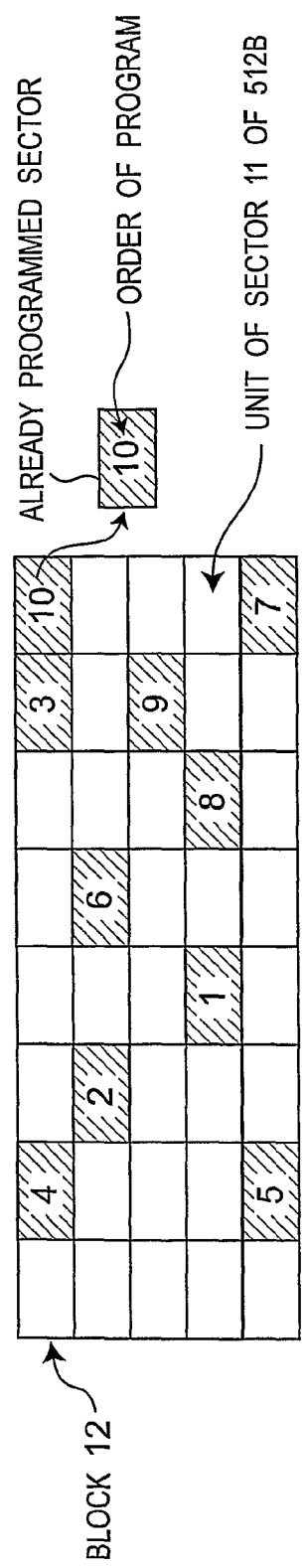
FIG. 38B is a schematic block diagram of a block 12 of the NAND memory array 2 showing a possibly random programming with a unit of sector 11 of 512 B according to the preferred embodiments of the present invention.

FIG. 38A is a schematic block diagram of a block 12 of the NAND memory array 2 showing an impossibly random programming with a unit of page 3 of 8 KB according to the prior art, and FIG. 38B is a schematic block diagram of a block 12 of the NAND memory array 2 showing a possibly random programming with a unit of sector 11 of 512 B according to the preferred embodiments of the present invention. In FIG. 38A showing the prior art, random programming is impossible due to the Vpass disturb, however, as apparent from FIG. 38B, random programming is possible by the preferred embodiment which can be solve the Vpass disturb problem.

In other words, sequential programming from the source side as well as random programming operation is possible in the preferred embodiment.

According to the preferred embodiment of the present invention, the NAND flash memory with higher reliability and performance can be provided. Our proposed programming method for the NAND memory device provides higher programming disturb immunity by applying the negative voltage before boosting the memory channel to make the holes accumulate at the channel surface. The channel electrons that would otherwise cause the programming disturb are eliminated through the negative voltage period (t0<t<t1), and this leads to preventing the poor boosting problem.

Moreover, the programming method for the NAND memory device is quite useful for charge-trapping type NAND, since the programming disturb problem is more serious in the SONOS or TANOS (TaN/$Al_2O_3$/Oxide/Si) NAND memory devices under development.

Second Preferred Embodiment

Our proposed programming scheme using the negative gate voltage can be done by the row decoder 4a which will be described below.

Figure 20A:
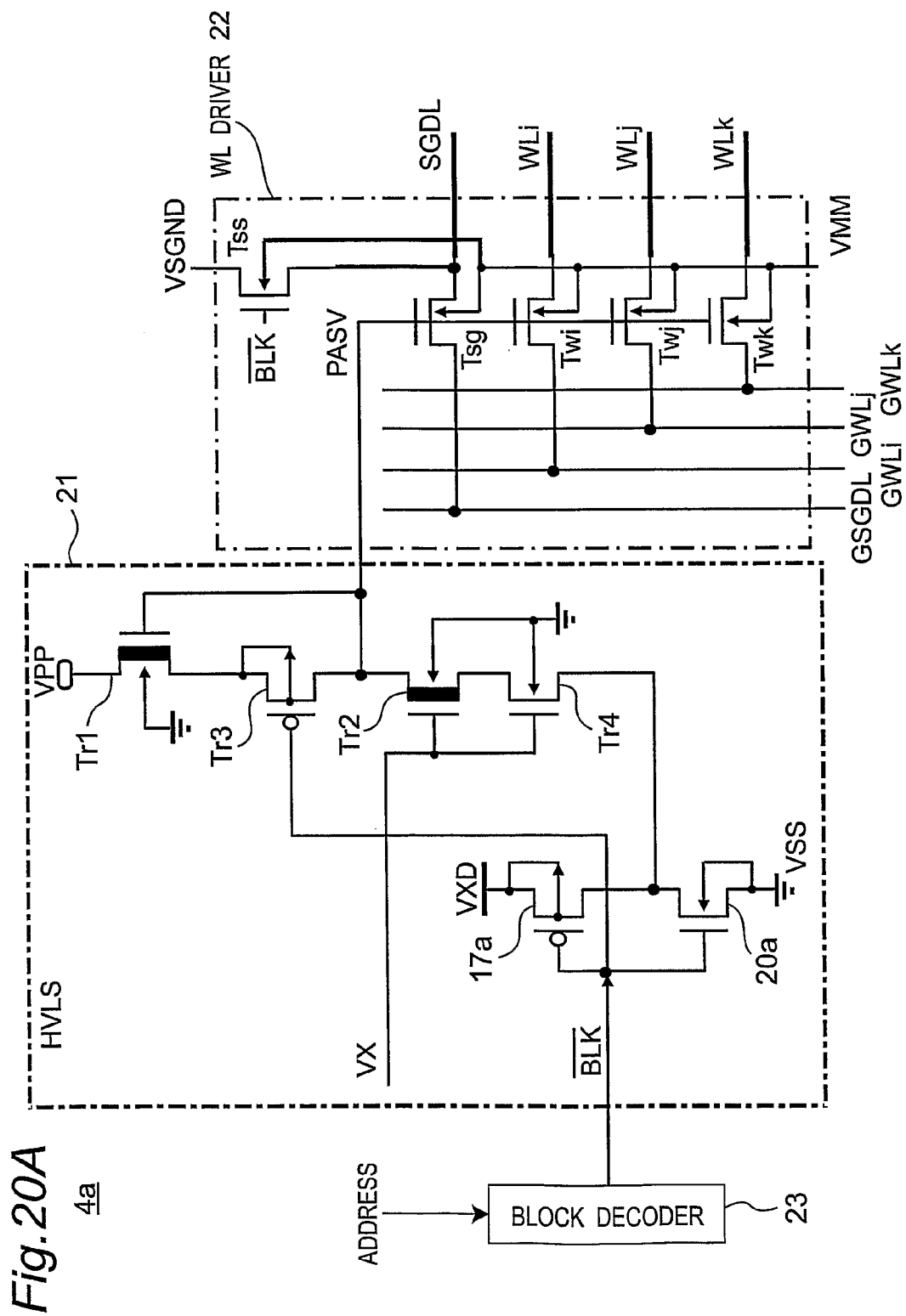
FIG. 20A is a schematic circuit diagram showing a configuration of a high voltage level shifter (HVLS) 21 and a word line driver 22 of a row decoder 4a according to a second preferred embodiment of the present invention.
Figure 20B:
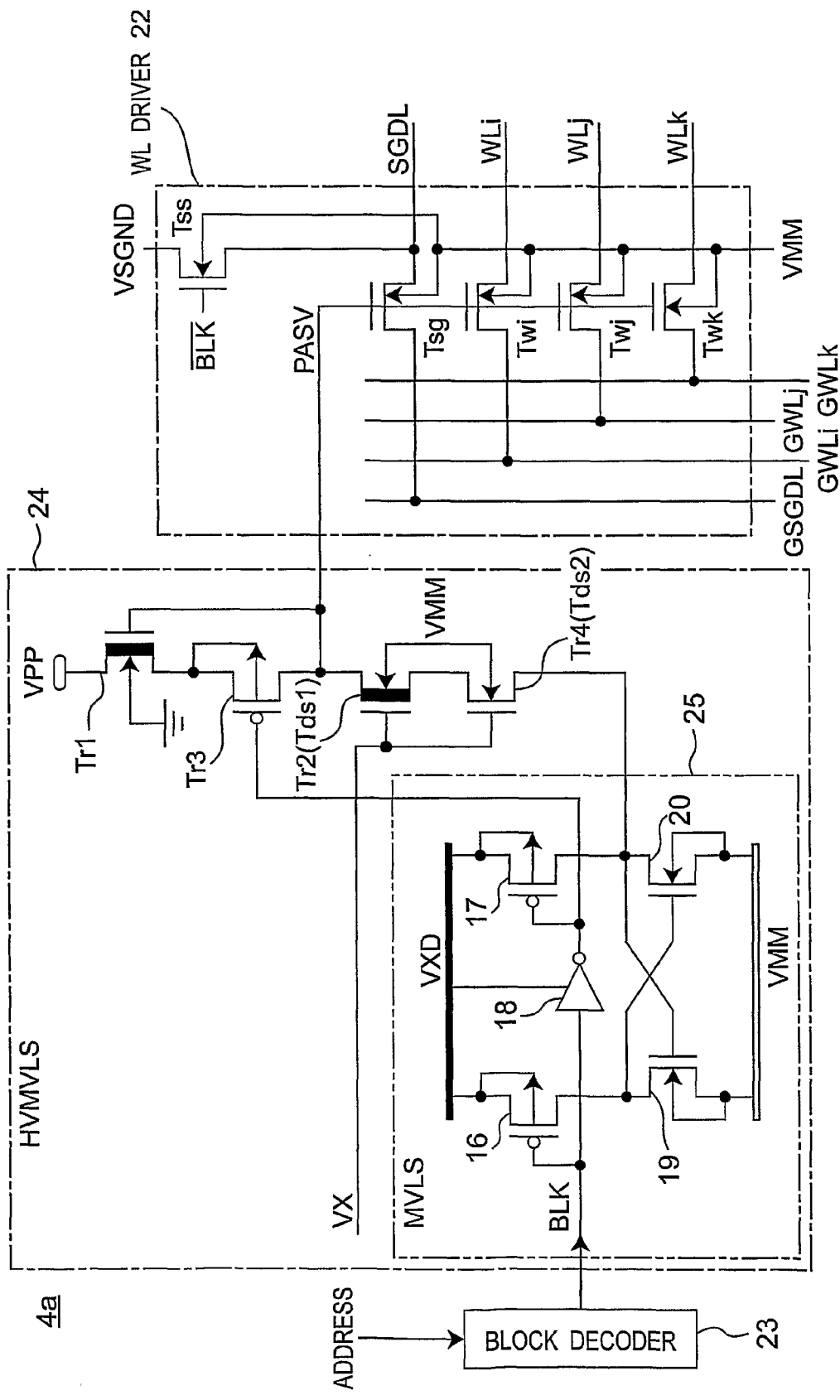
FIG. 20B is a schematic circuit diagram showing a configuration of a high voltage level shifter (HVMVLS) 24 and the word line driver 22 of the row decoder 4a according to the second preferred embodiment of the present invention.
Figure 21A:
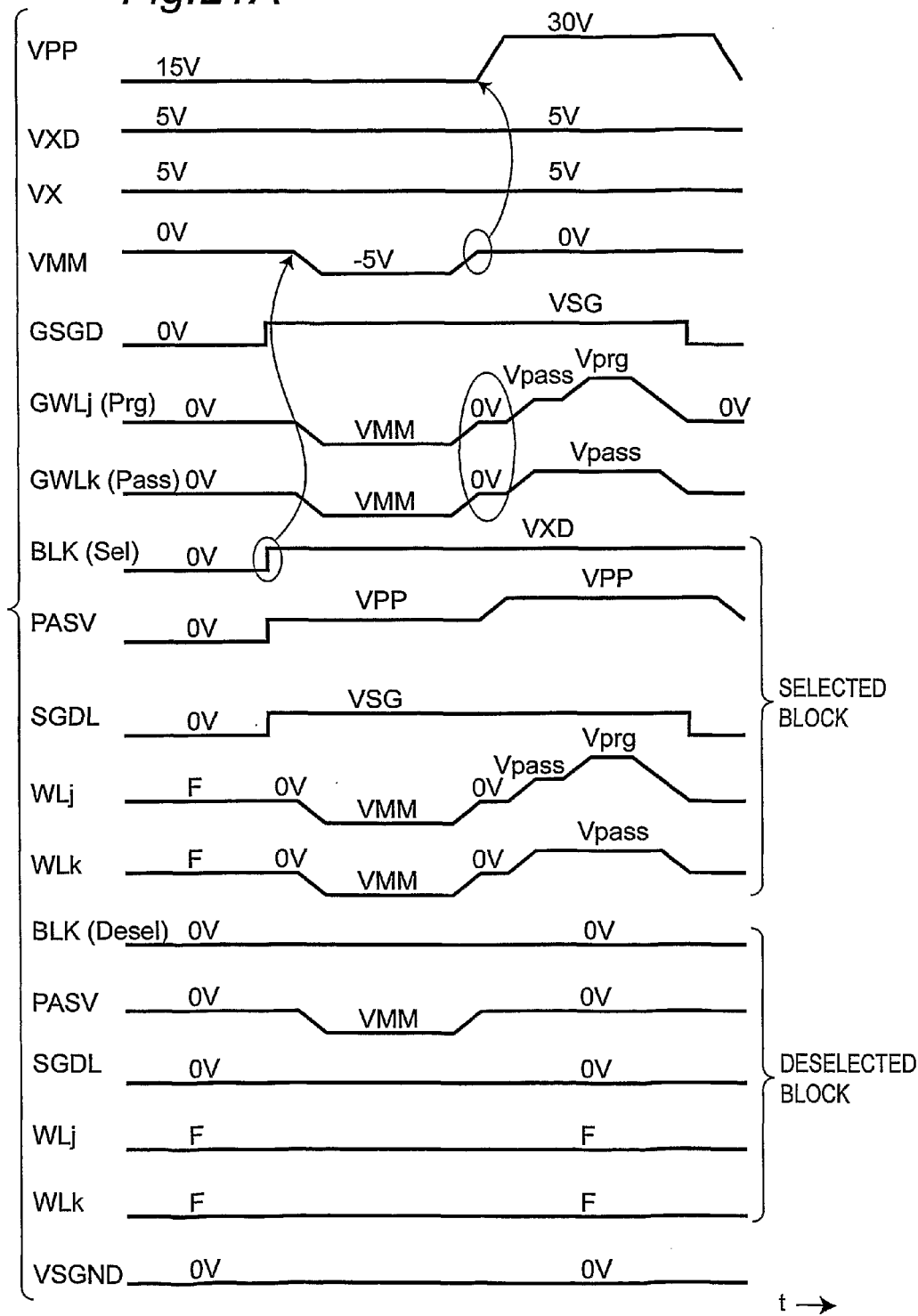
FIG. 21A is a timing chart showing a programming scheme of the second preferred embodiment based on the timing chart of FIG. 12 of the first preferred embodiment.

FIG. 20A is a schematic circuit diagram showing a configuration of a high voltage level shifter (referred to as an HVLS hereinafter) 21 and a word line driver (referred to as a WL driver hereinafter) 22 of the row decoder 4a according to a second preferred embodiment of the present invention, FIG. 20B is a schematic circuit diagram showing a configuration of a high voltage level shifter (referred to as an HVMVLS hereinafter) 24 and the WL driver 22 of the row decoder 4a according to the second preferred embodiment of the present invention, and FIG. 21A is a timing chart showing a programming scheme of the second preferred embodiment based on the timing chart of FIG. 12 of the first preferred embodiment. Namely, FIG. 21A shows a programming sequence according to the second preferred embodiment of the present invention, based on the timing chart of FIG. 12 with which the row decoder 4a of FIGS. 3, 20A and 20B can be applied to operate.

Referring to FIG. 20A, the row decoder 4a includes a block decoder 23 which outputs a block select signal BLK and an inverted block select signal $\overline{BLK}$, the HVLS 21 which includes MOS transistors 17a, 20a and Tr1 to Tr4 and outputs a signal PASV in response to the inverted block select signal $\overline{BLK}$, and the WL driver 22 which includes the MOS transistors Tss, Tsg, Twi, Twj and Twk and generates the respective voltages SGDL, WLi, WLj and WLk in response to the signal PASV. The row decoder 4a of FIG. 20A is used for the timing chart of FIGS. 28 and 29 in which it is not necessary to apply a negative voltage to the word lines WL since the negative potential is achieved by applying the positive voltage to the P-well 104. The row decoder 4a of FIG. 20B is used for the other timing charts of FIGS. 21A, 21B, 22 and 23.

Referring to FIG. 20B, the row decoder 4a of another preferred embodiment includes the block decoder 23 which outputs a block select signal BLK and an inverted block select signal $\overline{BLK}$, the HVMVLS 24 including a middle voltage level shifter (referred to as an MVLS hereinafter) 25 and the MOS transistors Tr1 to Tr4, and the WL driver 22. In this case, the MVLS 25 outputs an output signal in response to the block select signal BLK, and the HVMVLS 24 outputs the signal PASV to the WL driver 22.

When a block is selected in response to an inputted address, the block decoder 23 of FIGS. 20A and 20B outputs the block select signal BLK having a high level. In response to the block select signal BLK having the high level, the signal PASV is changed to a VPP level, and then, the MOS transistors Tsg, Twi, Twj and Twk of the WL driver 22 are turned on, and the respective voltages of the word lines WLi, WLj and WLk and SGDL become the same as the respective voltages of the global word lines GWLi, GWLj and GWLk and the gate line GSGDL, respectively.

On the other hand, when a block is deselected, the block decoder 23 outputs the block select signal BLK having a low level, and then, the signal PASV becomes the VMM level. In this case, the MOS transistors Tsg, Twi, Twj and Twk of the WL driver 22 are turned off, then the word lines WL and the gate line SGDL are isolated from the global word lines GWLi, GWLj and GWLk and the gate line GSGDL. This means that the word lines WL are in a "Floating" state, however, the gate line SGDL is set to 0V by the MOS transistor Tss because the inverted block select signal $\overline{BLK}$ has the high level.

Referring to FIG. 20B, the HVMVLS 24 includes a high positive voltage VPP side circuit, and a negative voltage VMM side circuit, and the HVMVLS 24 outputs the output signal PASV to the WL driver 22. The VPP side circuit includes N-channel depletion type MOS transistor Tr1, and the P-channel enhance type MOS transistor Tr3. The VPP side circuit operates as a VPP level shifter in response to the inputted block select signal BLK. Further, the MVLS 25 includes the six MOS transistors 16 to 20 including an inverter 18 of two MOS transistors, which are provided between a high positive voltage VXD and a negative voltage VMM.

If the signal PASV is 0V or VMM, the MOS transistor Tr1 is turned on so as to pass therethrough a voltage lower than the voltage of 4V, and then, the MOS transistor Tr3 is in a cut-off state because of the signal VX=5V and the signal PASV is in a stable state. If the signal PASV starts from the voltage of about 4V (=VXD−Vth of the MOS transistor Tr4), the MOS transistor Tr1 is turned on so as to pass therethrough a voltage higher than the voltage of 7V, then the MOS transistor Tr3 is turned on, and the voltage of 7V is applied to the signal line of the signal PASV so that the voltage of the signal PASV increases. This feedback finishes at a condition of PASV=VPP.

On the other hand, the VMM side circuit of the HVMVLS 24 includes the N-channel depletion type MOS transistor Tr2, and the N-channel enhance type MOS transistor Tr4, and the MVLS 25. The MVLS 25 operates as a level shifter between the voltages VXD and VMM. In this case, when the block select signal BLK has the high level, the MVLS 25 outputs the voltage VXD to the source of the MOS transistor Tr4. On the other hand, when the block select signal BLK has the low level, the MVLS 25 outputs the voltage VMM to the source of the MOS transistor Tr4. The MOS transistor Tr2 act as a voltage dropper to keep the drain voltage of the MOS transistor Tr4 located on the MOS transistor Tr2 side, which is lower than the break-down voltage of the MOS transistors Tr2 and Tr3. In this case, the following equation (2) is obtained:

$$(\text{Drain voltage } Vd \text{ of Tr4}) < VPP - (VXD + |V\text{th of Tr2}|) = 22V \quad (2)$$

Then, the MOS transistor Tr4 keeps the source voltage thereof (=the output voltage from the MVLS 25) which is lower than the voltage VXD so that any current does not flows from the voltage source VPP to the voltage VXD through the MOS transistor Tr17 when the block select signal BLK has the high level.

The WL driver 22 includes the transfer gate MOS transistors Tsg, Twi, Twj, Twk and Tss. Each of the MOS transistors Twn (n=i, j, k) is provided for connecting the global word line GWLn (n=i, j, k) with the local word line WLn (n=i, j, k), respectively. The word lines WLn correspond to the word lines WL1 to WLx of FIG. 1A. The voltage of the global word lines GWLn is controlled by the conditions such as the operation mode and the mode of selecting or deselecting.

Figure 24:
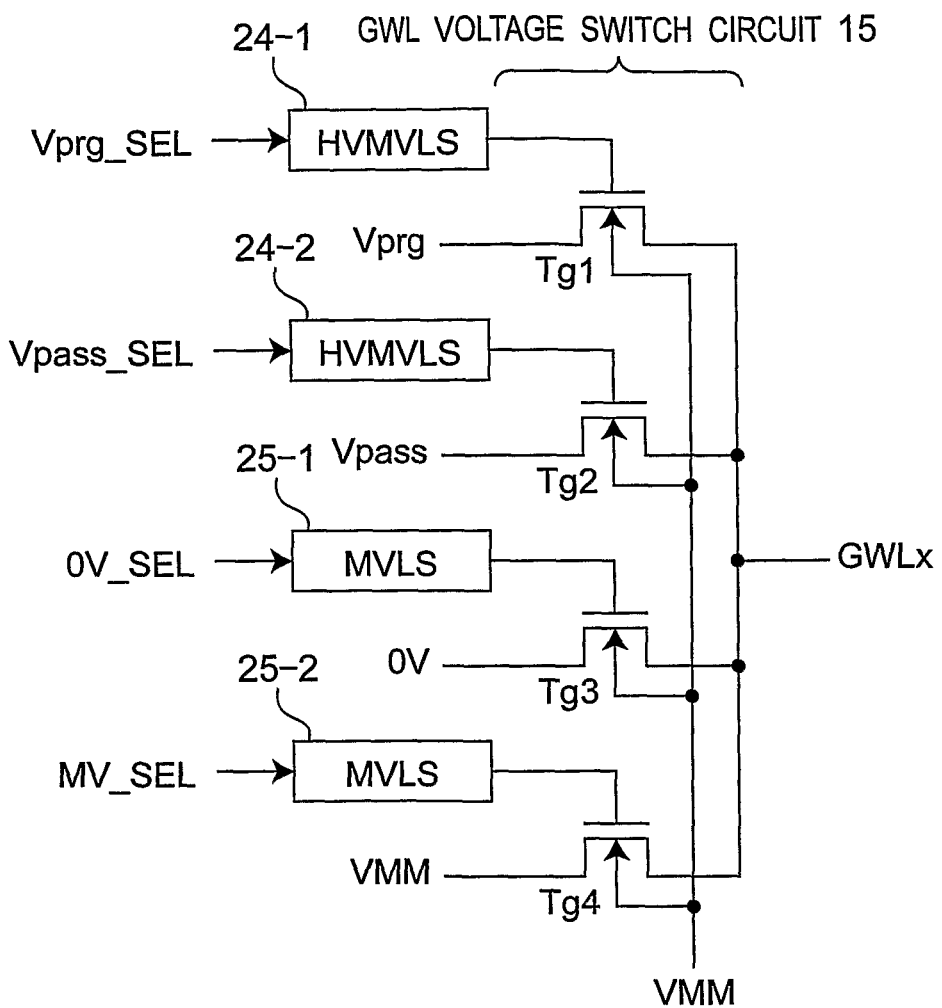
FIG. 24 is a detailed schematic circuit diagram showing a configuration of a global word line (GWL) voltage switch circuit 15 of FIG. 3 according to the second preferred embodiment of the present invention.

FIG. 24 is a detailed schematic circuit diagram showing a configuration of a global word line voltage switch circuit (referred to as a GWL voltage switch circuit hereinafter) 15 of FIG. 3 according to the second preferred embodiment of the present invention. Referring to FIG. 24, for example, if a global word line GWLn is selected and in the programming mode, the GWL voltage switch circuit 15 switches over the voltage GWLn to be applied in an order of 0V, VMM, Vpass, Vprg, and 0V through one of gate transistors Tg1 to Tg4.

Referring to FIGS. 20A and 20B, the gate transistor Tsg is provided for connecting the global line GSGDL with the local line SGDL. The gate transistor Tss is provided for connecting the local line SGDL with the ground VSGND during a selected state. On the other hand, the gate transistor Tss is provided for the deselected block to set the voltage of the local line SGDL to 0V during a deselected state. It is noted that the local line SGSL of FIG. 1 is not shown in FIGS. 20A and 20B because the local line SGSL is set to 0V during the programming mode. The N-channel MOS transistors handling the negative voltage VMM such as Tr2, Tr4, Tr19, Tr20, Tsg, Twi, Twj, Twk, Tss are formed in a P-well in a N-well which is provided in a Triple well structure of a semiconductor substrate. These nodes of the MOS transistors in the P-well 104 are connected to the node of the voltage VMM as shown in FIGS. 20A and 20B, however, any N-well 102 connections of the MOS transistors are not shown in FIGS. 20A and 20B. Normally, these nodes of the N-well 102 are connected to the node of the power supply Vdd.

FIG. 21A is a timing chart showing a programming scheme of the second preferred embodiment based on the timing chart of FIG. 12 of the first preferred embodiment.

Referring to FIG. 21A, for the selected block, the negative voltage VMM is applied to the word lines WL when the voltage VMM is set to −5V. In this case, the voltage VMM is changed after the row decoding operation by the row decoder 4a, and then has been fixed, so that the signal PASV of the selected block is set to the voltage VPP, however, the signal PASV of the deselected block is equal to the voltage VMM, and makes the gate transistors Tsg, Twi, Twj and Twk of the WL driver 22 turned off. Then, the global lines GWLn (n=i, j, k) are set to the voltage VMM during the period to sweep out the electrons from the channel region of the NAND memory array 2.

As a result, the voltages of the word lines WL of the selected block are changed in an order of 0V, the negative voltage VMM, and 0V, according to voltage of the global lines GWL for the period. After this period, the global word lines GWL are set to the pass voltage Vpass, and the selected global word line GWL to be programmed is set to the programming voltage Vprg. In this example, the voltage VPP is set so as to have two stages including the first stage of a voltage lower than the voltage of 15V before applying the programming voltage Vprg, and the second stage of a voltage higher than the voltage of 20V during applying the programming voltage Vprg. This is to avoid exceeding the break-down voltage of the MOS transistors Tr2 and Tr3. If the voltage VPP is set to the voltage of 30V while the voltage VMM is set to the negative voltage of −5V, the break-down voltage applied to the drain of the MOS transistor Tr2 needs a voltage higher than 35V, and the break-down voltage applied to the drain of the MOS transistor Tr3 needs a voltage higher than 7 to 8V.

However, if the voltage VPP is changed with the two stages, these requirements can relax the break-down voltages to 30V and 5V, respectively, in a manner similar to that of the conventional case.

Figure 21B:
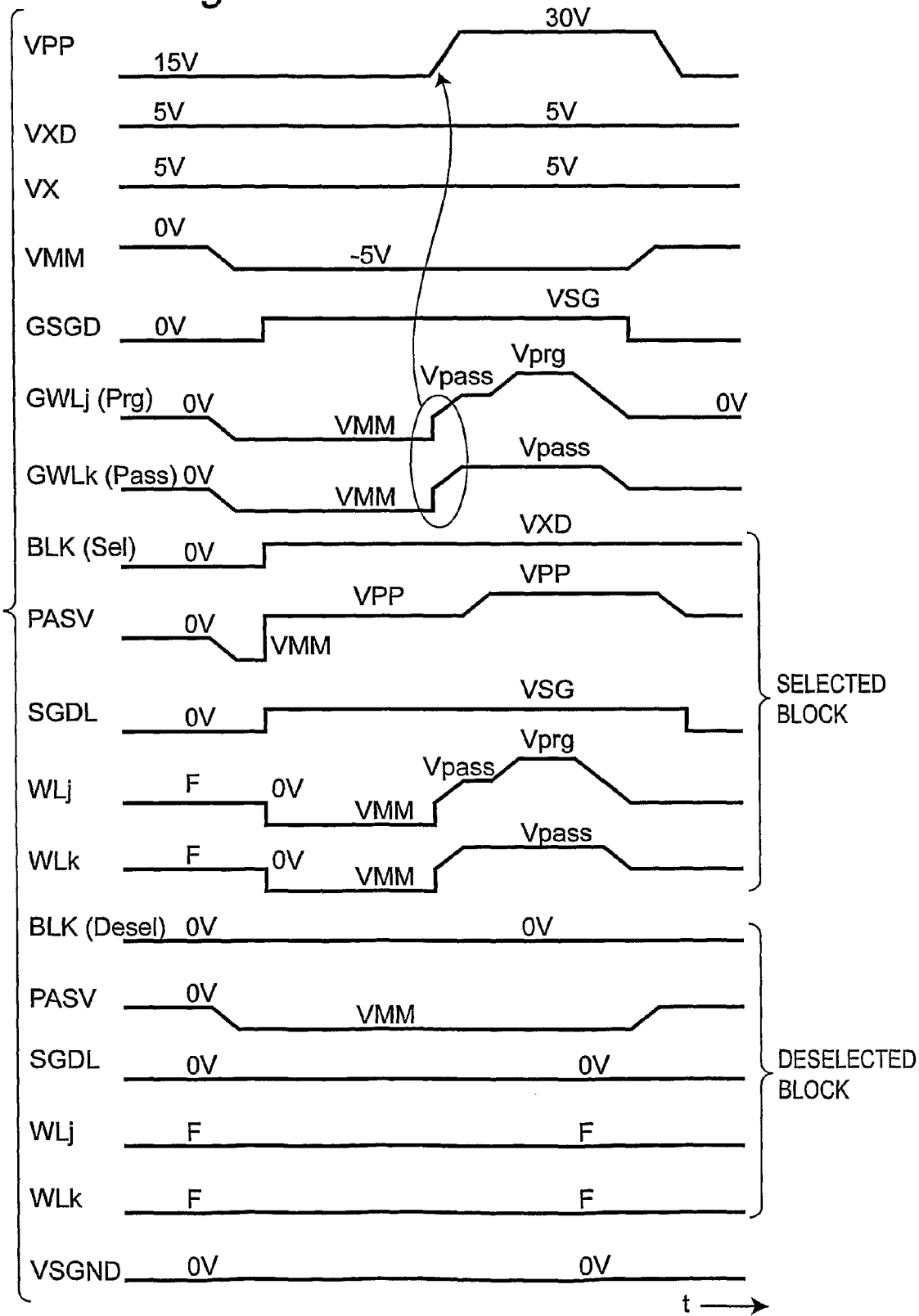
FIG. 21B is a timing chart showing another programming scheme of the second preferred embodiment to shorten a total programming time.

FIG. 21B is a timing chart showing another programming scheme of the second preferred embodiment to shorten a total programming time. Namely, FIG. 21B shows another example to shorten the total programming time. An ordinary voltage VMM setting speed is slow because the drivability of power supply generated by pumping is small. Therefore, this example adopts early voltage VMM setting and GWL voltage switching from the voltage VMM to the Vpass voltage directly. Before a block is selected, the signal PASV of all the blocks becomes the voltage VMM, and makes the gate transistors of WL driver 22 of all blocks turned off, and the gate transistors of the WL driver 22 are turned on for the selected block after the block has been selected. Then, the voltage VMM is applied to the word lines WL of the selected block. After the period of cleaning out the electrons from the channel region of the NAND memory array 2, the GWL voltage switch circuit 15 of FIG. 24 switches over from the voltage VMM to the Vpass voltage without setting to 0V between them. In this case, the voltage VMM is hold to −5V until the programming has been finished. Then, the break-down voltage of the MOS transistors Tr2 and Tr3 need to have a voltage higher than 35V and 8V, respectively. However, if the node of the P-well 104 of the MOS transistor Tr2 is connected to the source thereof on the MOS transistor Tr4 side, and the node of the N-well 102 is connected to the voltage source having a voltage higher than the voltage of (VXD+|Vth of Tr2|), then the break-down issue of the MOS transistor Tr2 can be removed.

Figure 23:
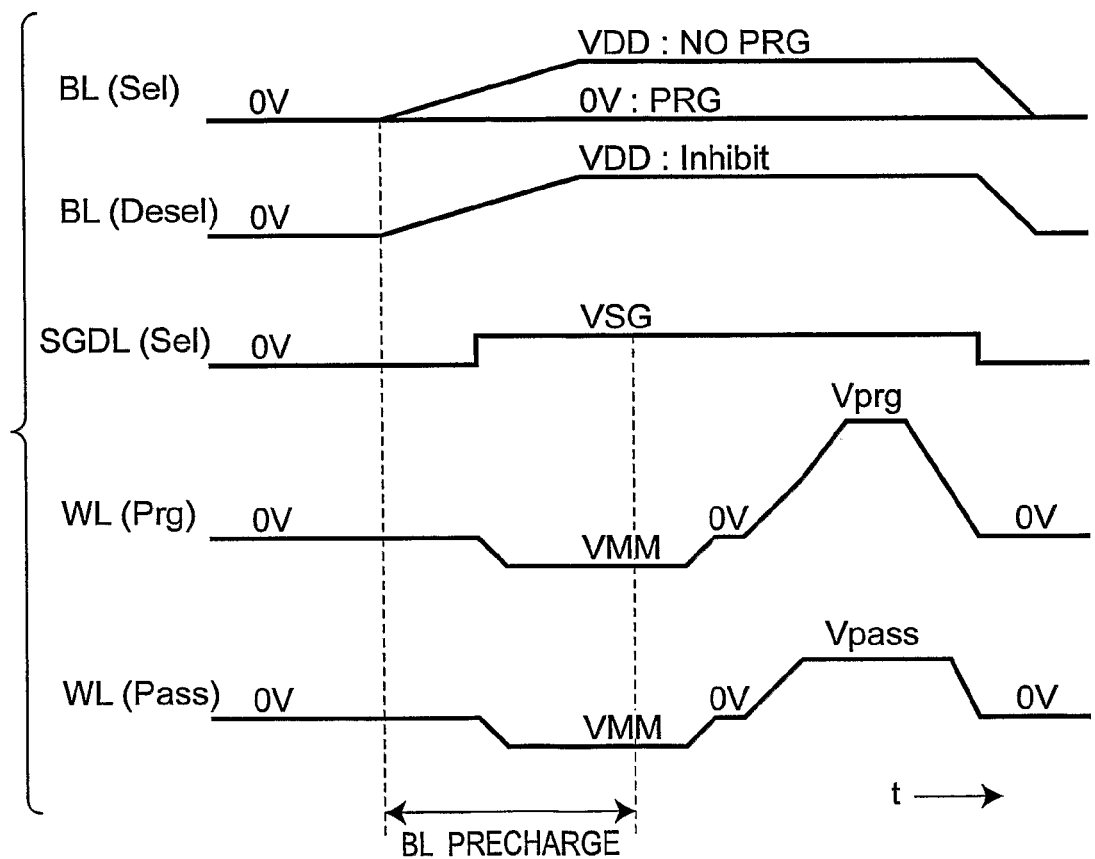
FIG. 23 is a timing chart showing a further programming scheme as modified from the timing chart of second preferred embodiment.

FIG. 23 is a timing chart showing another programming scheme of the second preferred embodiment, in particular, showing a relationship between a timing of bit line pre-charge and a timing of word line negative voltage setting. Namely, FIG. 23 shows another example modified from that of FIG. 21B. Referring to FIG. 23, the voltage VMM is required for changing from −5V to 0V just after the timing of the global word line GWL changing from the voltage VMM to the Vpass voltage, and the voltage VPP is also changed to 30V just after the voltage VMM has been changed to 0V. The break-down issue of the MOS transistors Tr2 and Tr3 can be overcome since the change in the voltages VMM and VPP is slow, and the voltage VPP=15V is high enough to set to pass the Vpass voltage through the MOS transistors Tr2 and Tr3.

FIG. 22 is a timing chart showing a further programming scheme as modified from the timing chart of second preferred embodiment. Namely, FIG. 22 shows a relation between the timing of bit line (BL) pre-charge and the timing of setting a negative voltage to the word lines WL. The timing of setting the negative voltage to the word lines WL should be set after the BL pre-charging because the electrons in the memory cell channels move during the BL pre-charging period. However, in order to shorten the total programming time, the time interval of the BL pre-charging and the time interval of applying the negative voltage to the word lines WL should be overlapped.

FIG. 24 is a detailed schematic circuit diagram showing a configuration of a global word line voltage switch circuit (referred to as a GWL voltage switch circuit hereinafter) 15 of FIG. 3 according to the second preferred embodiment of the present invention. Referring to FIG. 24, the GWL voltage switch circuit 15 includes two HVMVLSs 24-1 and 24-2, two MVLSs 25-1 and 25-2, and four transfer gate MOS transistors Tg1 to Tg4. The GWL voltage switch circuit 15 outputs an output voltage of one of Vprg, Vpass, 0V or VMM to the global word line GWLx by switching the transfer gate transistors Tg1 to Tg4 corresponding to the voltage with a select control signal.

In this case, when a Vprg_SEL signal becomes the high level, the HVMVLS 24-1 outputs the voltage VPP to the gate of the transfer gate transistor Tg1 so that the node of the global word line GWLx becomes the voltage Vprg. When a Vpass_SEL signal becomes the high level, the HVMVLS 24-2 outputs the voltage Vpass to the gate of the transfer gate transistor Tg2 so that the node of the global word line GWLx becomes the voltage Vpass. When a 0V_SEL signal becomes the high level, the MVLS 25-1 outputs the voltage VXD to the gate of the transfer gate transistor Tg3 so that the node of the global word line GWLx becomes the voltage 0V. When a MV_SEL signal becomes the high level, the MVLS 25-2 outputs the voltage VXD to the gate of the transfer gate transistor Tg4 so that the node of the global word line GWLx becomes the voltage VMM. In the preferred embodiment, it is necessary for the transfer gate transistors Tg1 to Tg4 to be formed in the Triple-well structure of the semiconductor substrate 100 to handle the negative voltage VMM.

Figure 25:
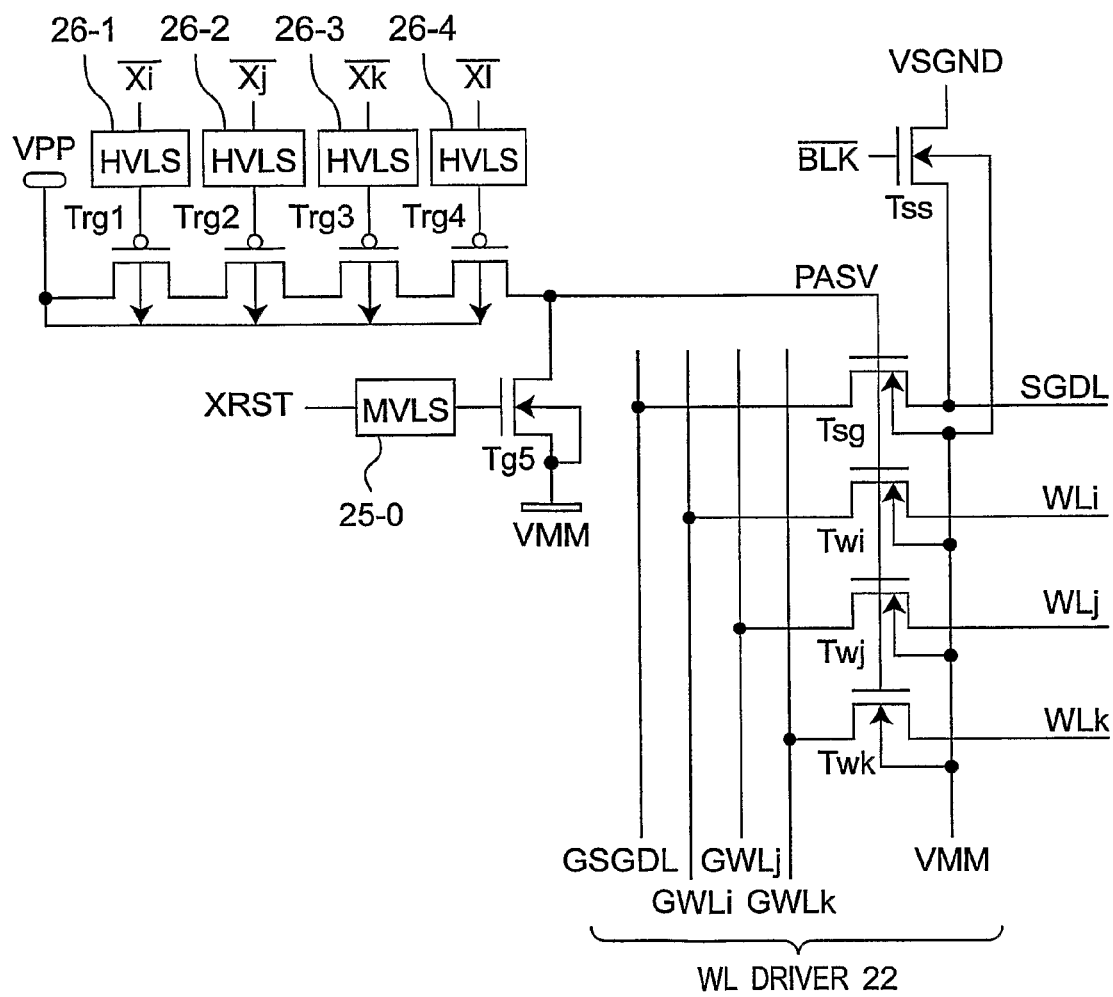
FIG. 25 is a detailed schematic circuit diagram showing a configuration of a modification of the row decoder 4a of FIG. 3 according to the second preferred embodiment of the present invention.

FIG. 25 is a detailed schematic circuit diagram showing a configuration of a modification of the row decoder 4a of FIG. 3 according to the second preferred embodiment of the present invention. Referring to FIG. 25, the row decoder 4a includes the HVLSs 26-1 to 26-4, the MVLS 25-0, five gate transistors Trg1 to Trg5, and five gate transistors Tss, Tsg, Twi, Twj and Twk.

Block select address signals $\overline{Xi}$, $\overline{Xj}$, $\overline{Xk}$, and $\overline{Xl}$ are connected to the gates of the P-channel MOS transistors Trg1 to Trg4 through the HVLSs 26-1 to 26-4, respectively. Each of the P-channel MOS transistors Trg1 to Trg4 decodes the block select signal, and switches over whether or not the voltage VPP passes therethrough to generate the signal PASV to the gates of the gate transistors Tsg, Twi, Twj and Twk when the block is selected. However, the transistors Trg1 to Trg4 are turned off when the block is not selected so that the transistor Tg5 is provided for this case.

Only when all of the transistors Trg1 to Trg4 are turned on, then the voltage VPP passes through the transistors Trg1 to Trg4 to generate the signal PASV. Before the block select address signals $\overline{Xi}$, $\overline{Xj}$, $\overline{Xk}$, and $\overline{Xl}$ are activated, these signals $\overline{Xi}$, $\overline{Xj}$, $\overline{Xk}$, and $\overline{Xl}$ are set to the high level (namely, all deselected), and the reset signal XRST is set to the high level, then the signal PASV is set to the voltage VMM. Thereafter, the block select address signals $\overline{Xi}$, $\overline{Xj}$, $\overline{Xk}$, and $\overline{Xl}$ are activated, the reset signal XRST is set to the low level, then the signal PASV holds the voltage VMM for the deselected blocks, however, the signal PASV is changed to the voltage VPP for the selected block. The MVLS 25-0 is a level shifter which outputs either the voltage VMM or the voltage Vdd (3V). Each of the HVLSs 26-1 to 26-4 is a level shifter which outputs either the voltage 0V or the voltage VPP.

Figure 26:
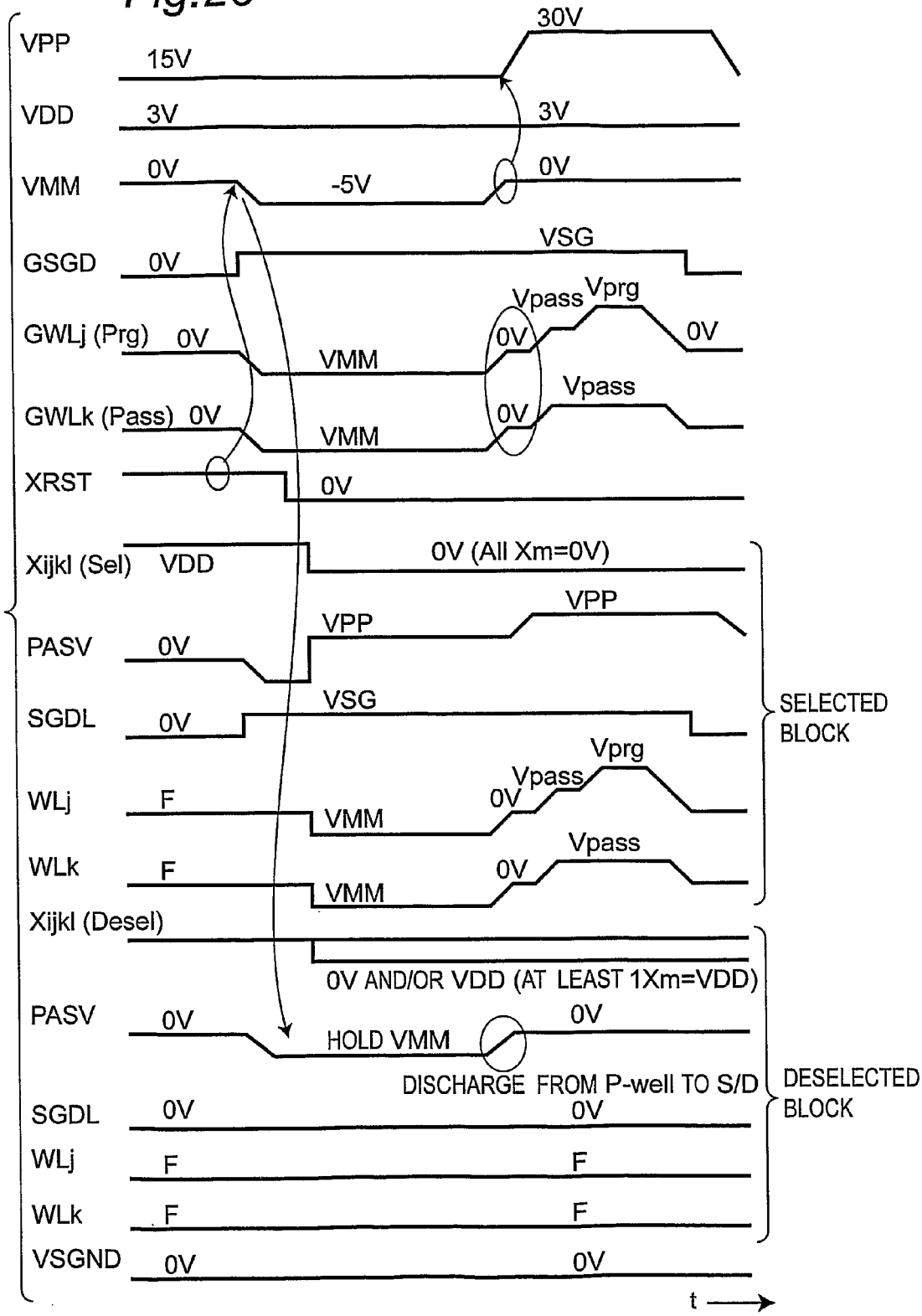
FIG. 26 is a timing chart showing a programming scheme which is executed by the GWL voltage switch circuit 15 of FIG. 24 and the row decoder 4a of FIG. 25.

FIG. 26 is a timing chart showing a programming scheme which is executed by the GWL voltage switch circuit 15 of FIG. 24 and the row decoder 4a of FIG. 25. The timing chart of FIG. 26 is almost the same as that of FIG. 21. The major differences between those of FIGS. 21 and 26 are as follows:

(1) In response to the reset signal XRST, the signal PASV is reset to a negative voltage VMM, and then, the signal PASV of the selected block is set to VPP and the voltage of the word lines WL is changed to a negative voltage VMM to be held thereafter; and (2) In order to apply the negative voltage VMM to the signal line of the signal PASV of the deselected block, the gate transistor Tg5 is turned on when the negative VMM is applied thereto.

Figure 27:
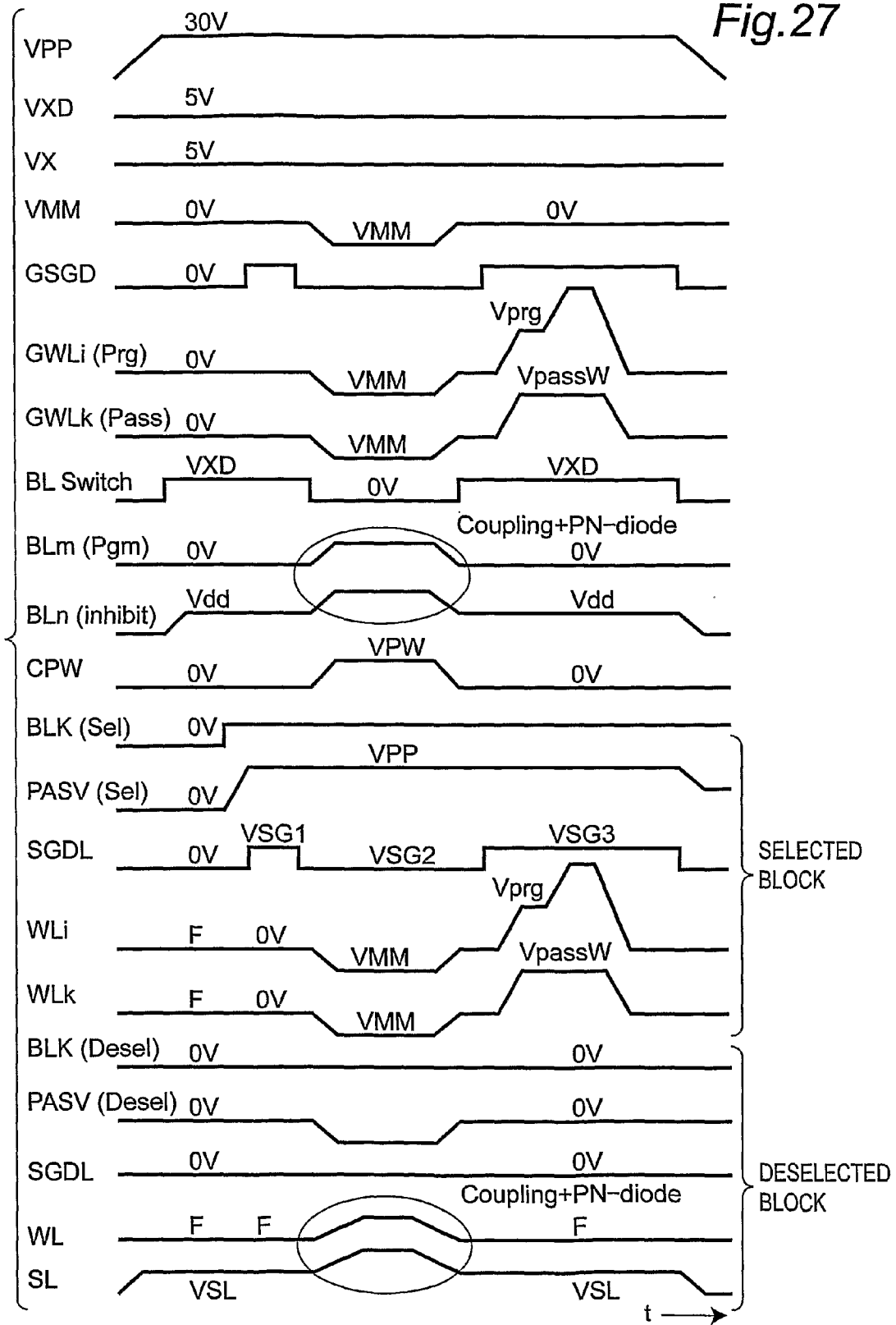
FIG. 27 is a timing chart showing a programming scheme with a combination of the word lines each having a negative voltage and a P-well 104 having a positive voltage, which is executed by the GWL voltage switch circuit 15 of FIG. 24 and the row decoder 4a of FIG. 20B, and which is modified from the timing chart of FIG. 21A.

FIG. 27 is a timing chart showing a programming scheme with a combination of the word lines each having a negative voltage and the P-well 104 having a positive voltage, which is executed by the GWL voltage switch circuit 15 of FIG. 24 and the row decoder 4a of FIG. 20B, and which is modified from the timing chart of FIG. 21A In this programming method of FIG. 27, such a synergetic effect that the burdens of a negative pumping to the word lines WL and a positive pumping to the P-well 104 decrease totally can be anticipated by appropriate selections. For example, when the potential of the P-well 104 is set to the voltage of 2.5V generated by the voltage source Vdd, then the negative voltage VMM is set to a negative voltage of −2.5V not 5V. Therefore, it is able to minimize drastically the size of the negative pumping circuit and elevates the pumping efficiency. Consequently the consumption power also decreases drastically.

Many other variations for the circuits for use in the mentioned row decoder 4a and/or the operation timings therefor are available. For example, several blocks adjacent each other are selected at same time during the word line negative period to increase the effect of clean up the electrons at the channel area of the NAND memory array 2. The selected block actually programmed is positioned at around the center of this several blocks. This is realized easily by forcing some address signals to be "selected".

The other example is that the negative voltage is not applied to all the word lines WL in a block. If a word line WL15 is actually programmed, for example, the negative voltage is applied to the word lines WL10 to WL20 adjacent to the word line WL15, however, no voltage is applied to the other word lines WL1 to WL9 and WL21 to WLx to be maintained at 0V. This leads to saving of the pumping power.

Figure 28:
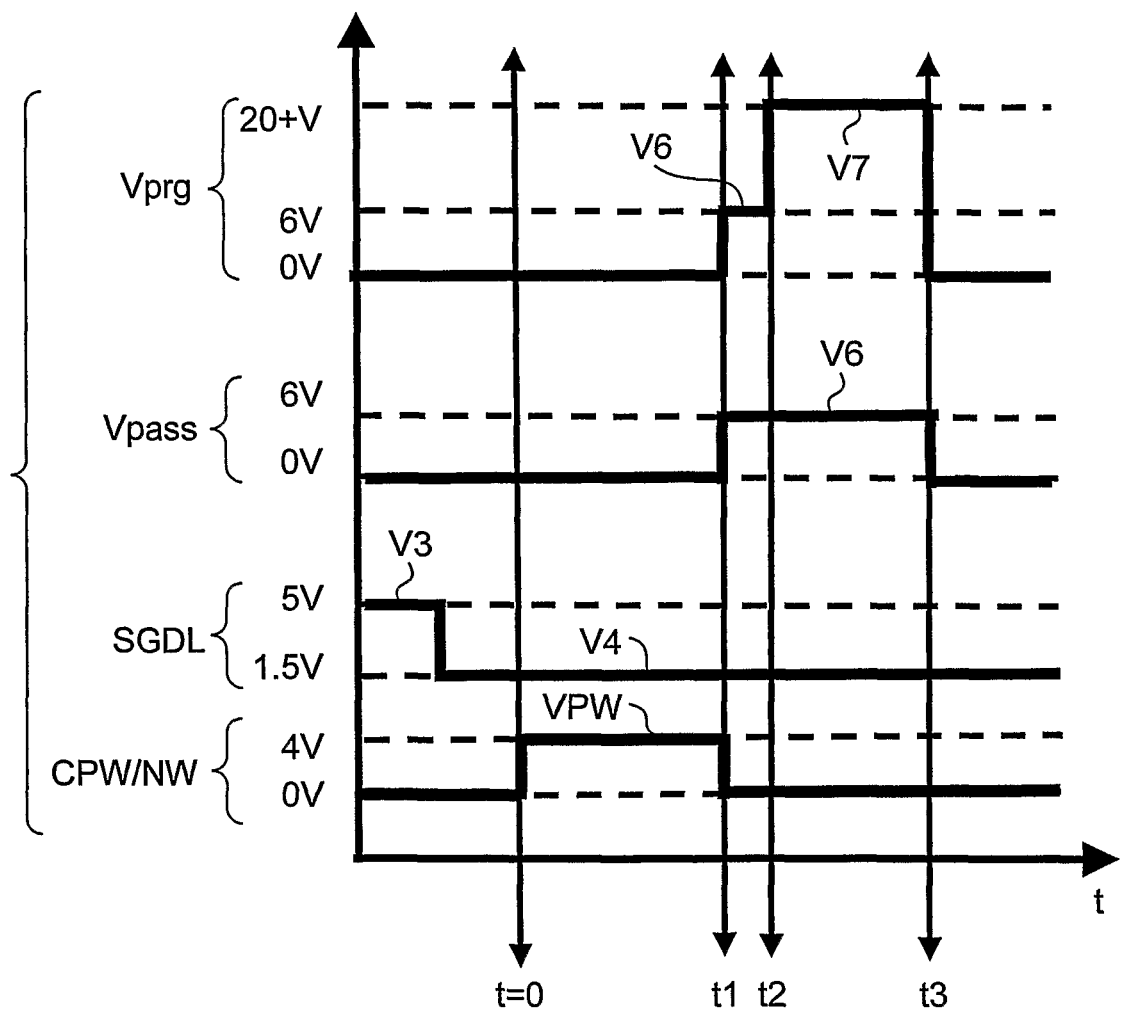
FIG. 28 is a timing chart showing a programming scheme for the NAND flash memory device 80 of FIG. 3 of a modification of the second preferred embodiment according to the present invention.

FIG. 28 is a timing chart showing a programming scheme for the NAND flash memory device 80 of FIG. 3 of a modification of the second preferred embodiment according to the present invention. The differences between FIGS. 28 and 12 are as follows as shown in FIG. 28: the negative voltage V5 is not applied to the word lines WL in the period of t0<t<t1, however, a positive voltage CPW of 4V is applied to the P-well 104 in the same period.

In the case of the row decoder 4a of FIG. 20A, a conventional row decoder is available because the P-well 104 can be positively biased instead of applying the negative voltage to the word lines WL. The operational circuitry of the row decoder 4a is just the same as that of the prior art.

Figure 29:
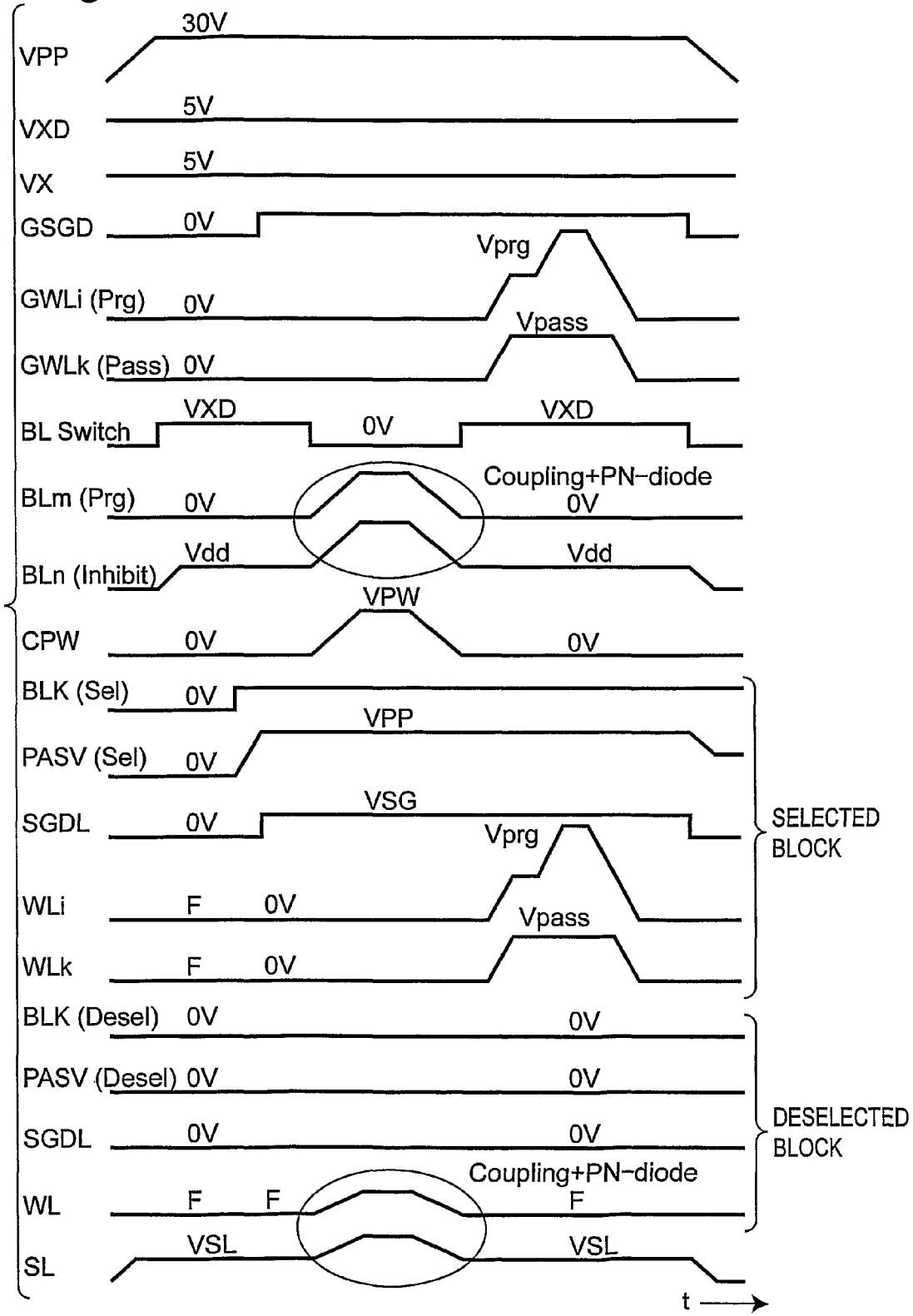
FIG. 29 is a timing chart showing a programming scheme which is executed by the GWL voltage switch circuit 15 of FIG. 24 and the row decoder 4a of FIG. 20A based on the timing chart of FIG. 28.

FIG. 29 is a timing chart showing a programming scheme which is executed by the GWL voltage switch circuit 15 of FIG. 24 and the row decoder 4a of FIG. 20A based on the timing chart of FIG. 28. Namely, FIG. 29 shows waveforms of the word lines WL and the gate line SGDL in the selected block and deselected block. Referring to FIG. 29, the word lines WL in the selected block become a negative potential state against the potential of the P-well 104 during the period of the P-well 104 (CPW) biasing to a positive voltage VPW. It is necessary for the bit lines BL and the source lines SL to be isolate from the periphery circuits (for the bit lines BL, the bit line switch transistors 13 cut off the path thereof) when the positive bias voltage VPW is applied to the P-well 104, since the voltages of the bit lines BL and the source lines SL are raised up to almost the same voltage as the potential of the P-well 104 by capacitance couplings between the P-well 104 and the bit lines BL and/or the source lines SL. The voltages of the deselected word lines WL are also raised up by the same reason. In FIG. 29, "F" means a "floating level" in a floating state, in which the signal line is isolated by cutting off the transfer gate transistor for connecting the signal line and the periphery circuits. The bias voltage to the N-well 102 is not shown because it is very simple design matter.

Figure 30:
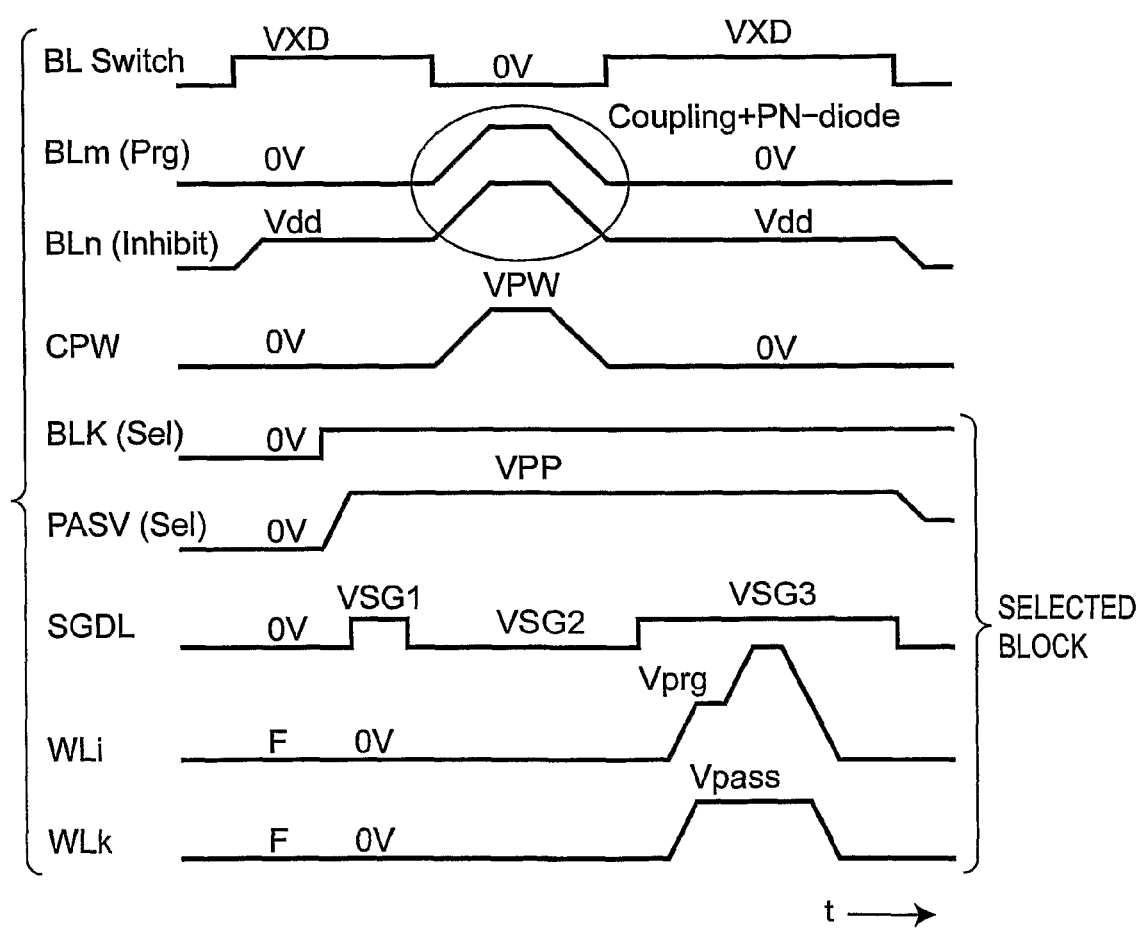
FIG. 30 is a timing chart showing a programming scheme in the other SGDL signal setting case similar to that of FIG. 28.
Figure 31B:
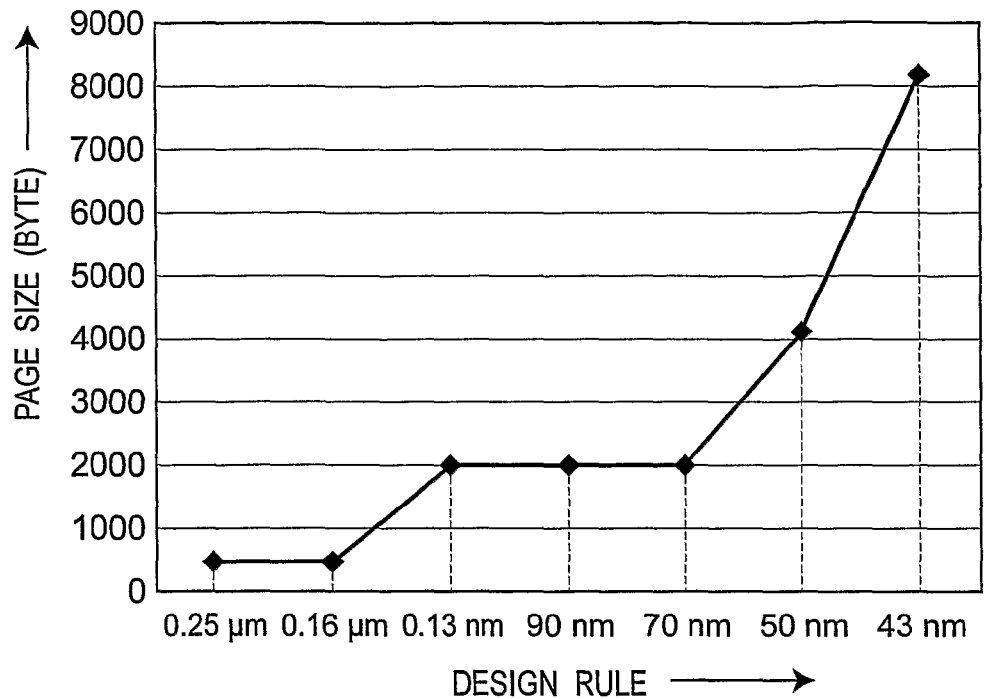
FIG. 31B is a graph showing a trend of the page size over the scaling of the design rule of the prior art.
Figure 31C:
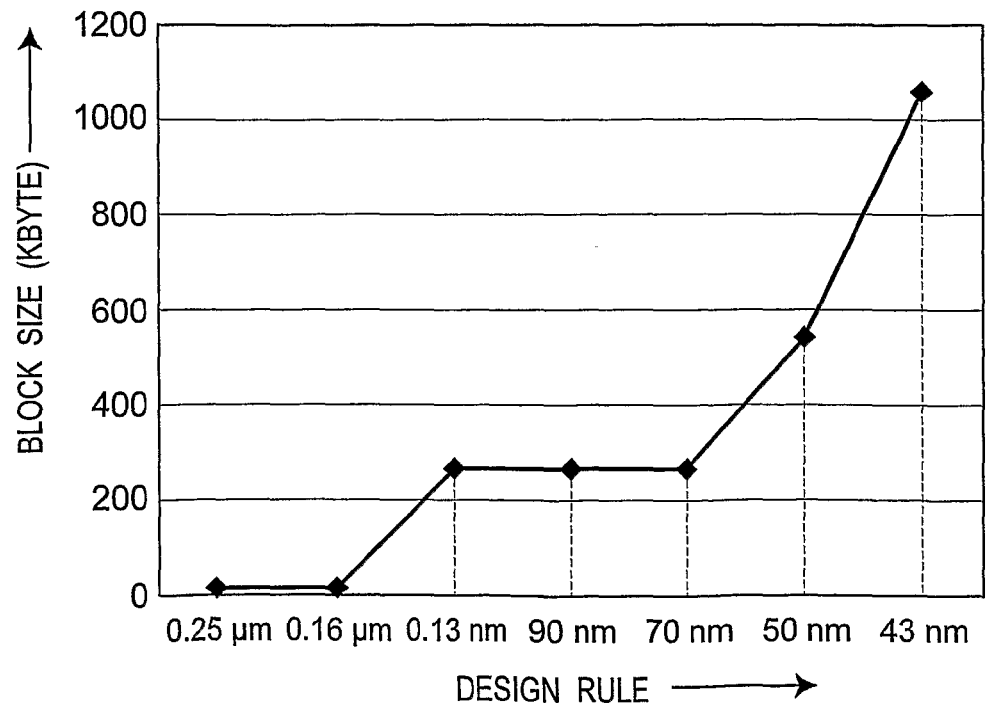
FIG. 31C is a graph showing a trend of the block size over the scaling of the design rule of the prior art.
Figure 32A:
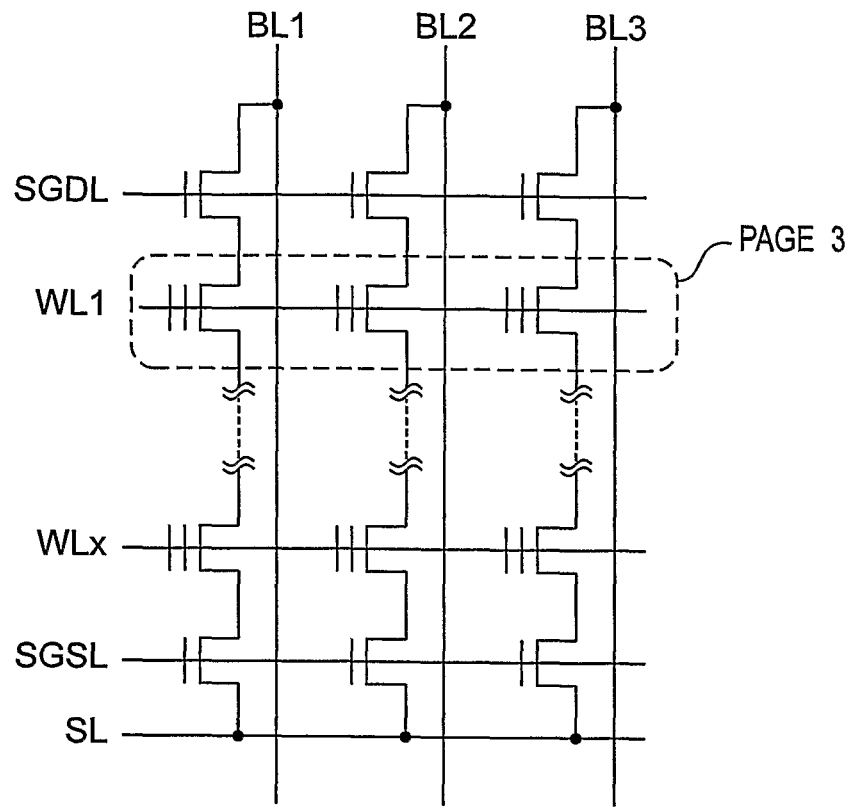
FIG. 32A is a schematic circuit diagram showing a page in a part of a NAND flash memory array of the prior art.
Figure 32B:
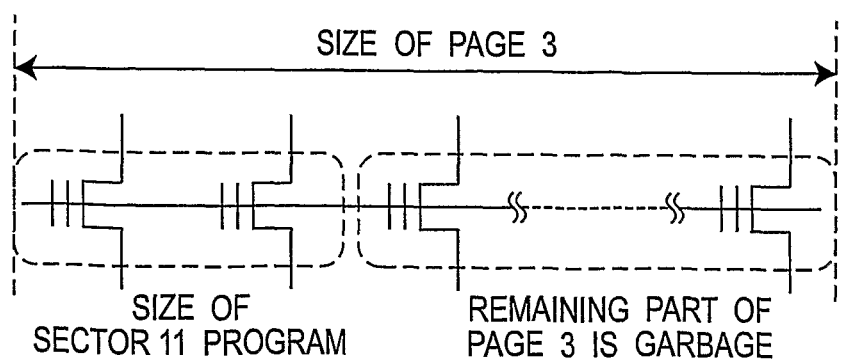
FIG. 32B is a schematic circuit diagram showing a size of the page in a part of the NAND flash memory array of FIG. 32A.
Figure 33:
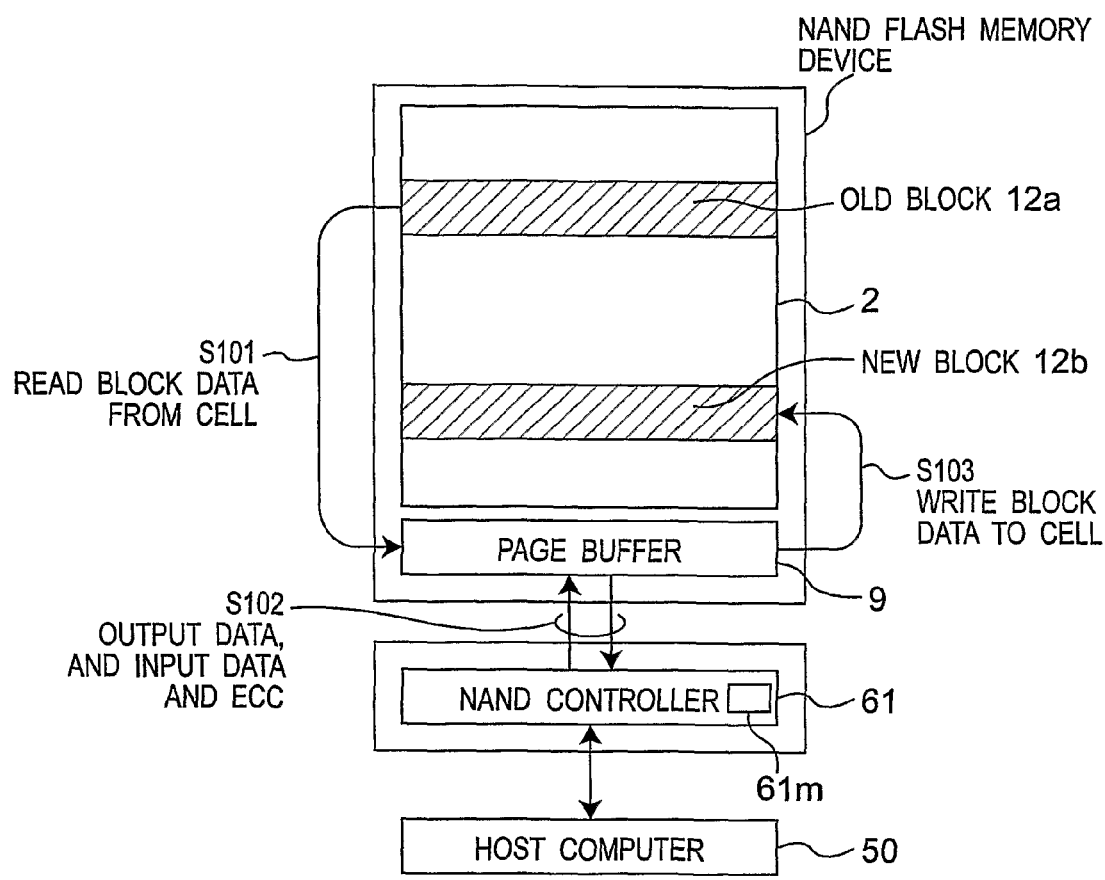
FIG. 33 is a schematic block diagram showing a block copy operation upon updating a file data in a NAND flash memory device of a prior art.

FIG. 30 is a timing chart showing a programming scheme in the other SGDL signal setting case similar to that of FIG. 28. Referring to FIG. 30, the voltage of the gate line SGDL is controlled to suitable for three stages including the first stage VSG1 of bit line pre-charging, the second stage VSG2 of a negative bias voltage, and the third stage VSG3 of the programming operation.

Third Preferred Embodiment

The leveraged benefit for file system application brought by this programming method will be described hereinafter.

Figure 34A:
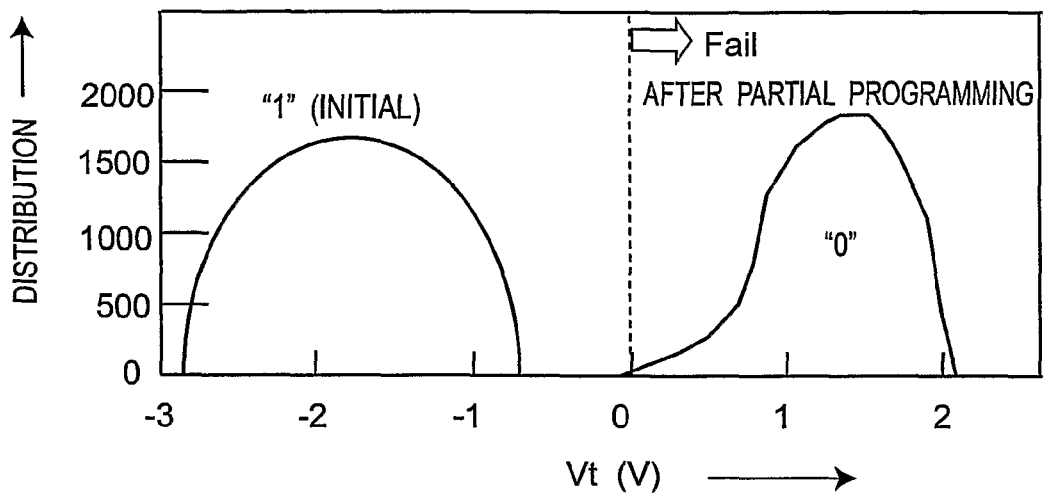
FIG. 34A is a graph showing a threshold voltage Vth shift by the program disturb after a partial programming according to a prior art.
Figure 34B:
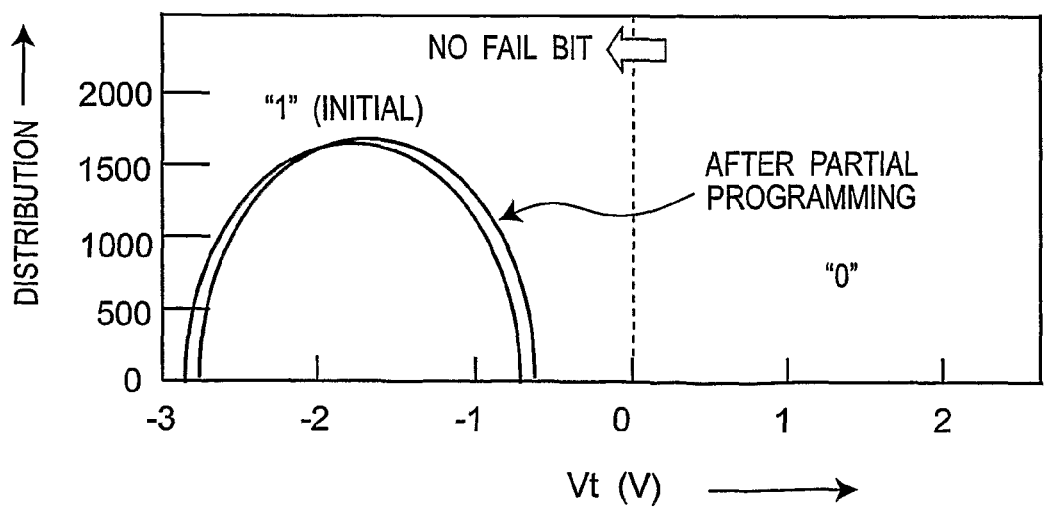
FIG. 34B is a graph showing a threshold voltage Vth shift by the program disturb after a partial programming according to the preferred embodiments of the present invention.
Figure 34C:
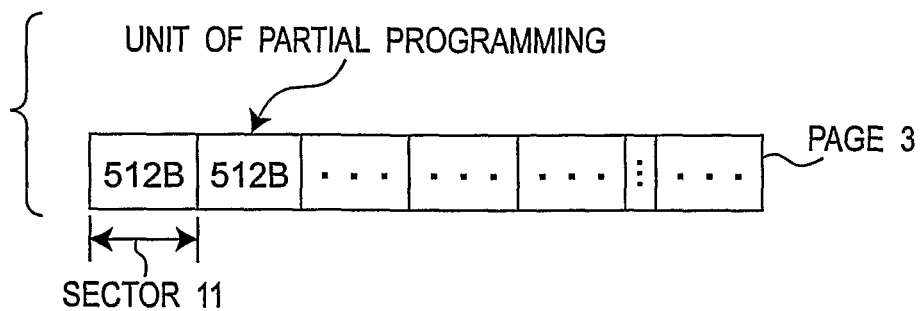
FIG. 34C is a schematic block diagram showing a unit of partial programming in the page 3.
Figure 34D:
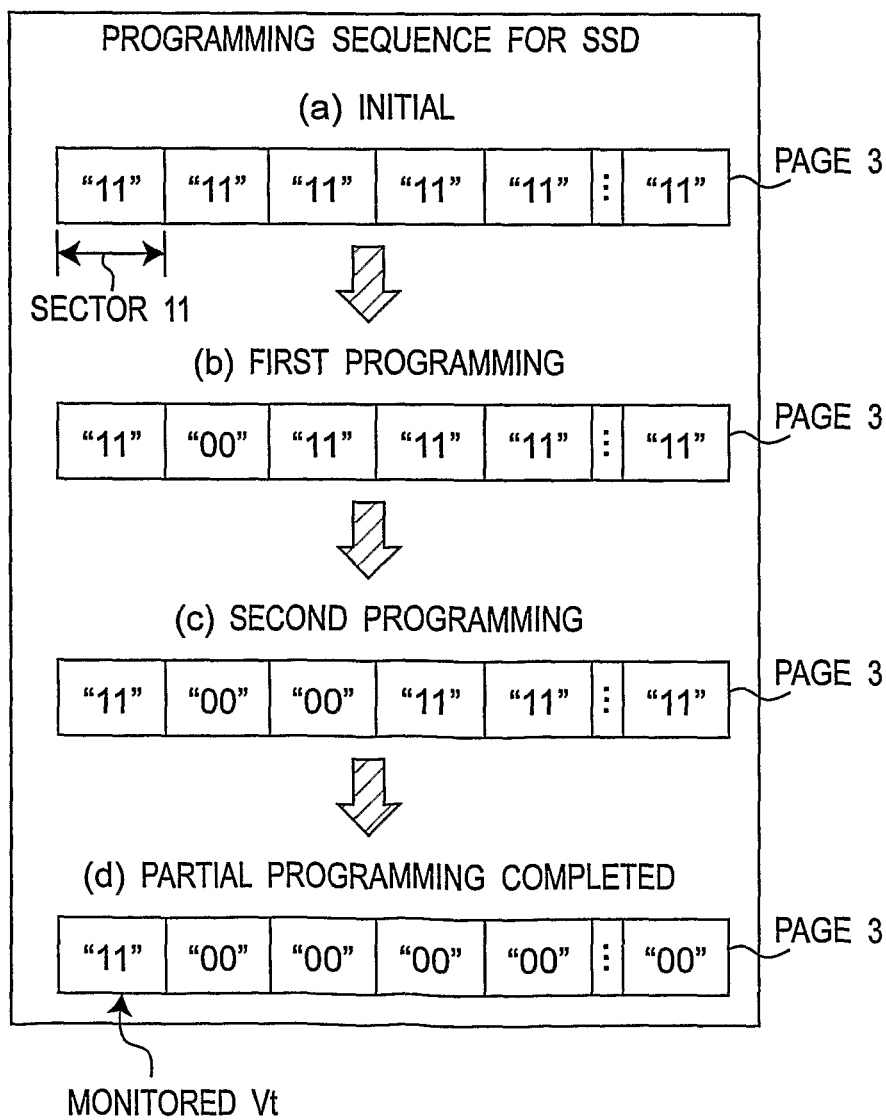
FIG. 34D is a schematic diagram showing a programming sequence.

FIG. 34A is a graph showing a threshold voltage Vth shift by the program disturb after a partial programming according to a prior art, and FIG. 34B is a graph showing a threshold voltage Vth shift by the program disturb after a partial programming according to the preferred embodiments of the present invention. FIG. 34C is a schematic block diagram showing a unit of partial programming in the page 3 which is used for FIGS. 34A and 34B, and FIG. 34D is a schematic block diagram showing a programming sequence for a storage unit such as a solid-state drive (SSD) which is used for FIG. 34B.

Although the program disturb occurs seriously in the conventional programming scheme as shown in FIG. 34A, no threshold voltage (Vth) shift is seen after over programming at the same page in our proposed programming method as shown in FIG. 34B, where the program disturb is highly suppressed by applying the electron reduction step.

Figure 35A:
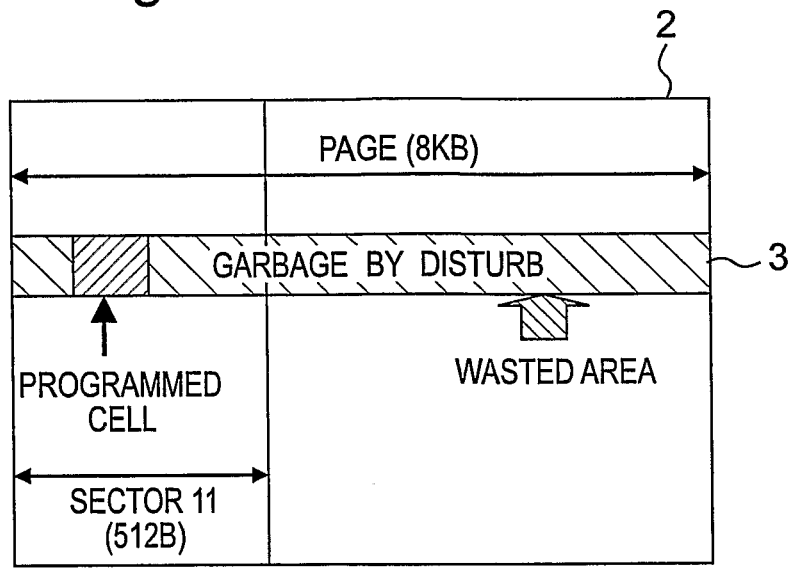
FIG. 35A is a schematic block diagram showing a programmed cell in a sector and a wasted area in the page 3 of the NAND flash memory array 2 according to the programming sequence of the prior art.
Figure 35B:
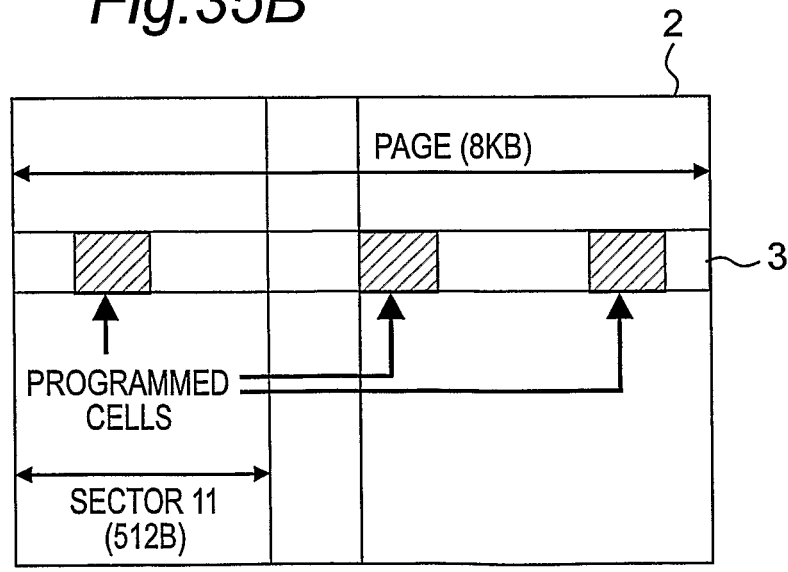
FIG. 35B is a schematic block diagram showing programmed cells and a wasted area in the page 3 of the NAND flash memory array 2 according to the programming sequence (NOP (Number of Operation for Programming in one page) is not limited) of the preferred embodiments of the present invention.

FIG. 35A is a schematic block diagram showing a programmed cell and a wasted area in the page 3 of the NAND flash memory array 2 according to the programming sequence of the prior art, and FIG. 35B is a schematic block diagram showing programmed cells and a wasted area in the page 3 of the NAND flash memory array 2 according to the programming sequence (NOP (Number of Operation for Programming in one page) is not limited) of the preferred embodiments of the present invention. There is no limitation for the NOP, in which multiple over write operation is allowed in the page 3. Thus, the successive partial programming such as sector base programming is allowed as shown in FIG. 35A. Since it does not need extra block copy operation, it enables the fast file update in file management system by over-writing the same page 3 as shown in FIG. 35B without any block erase operation.

Figure 35C:
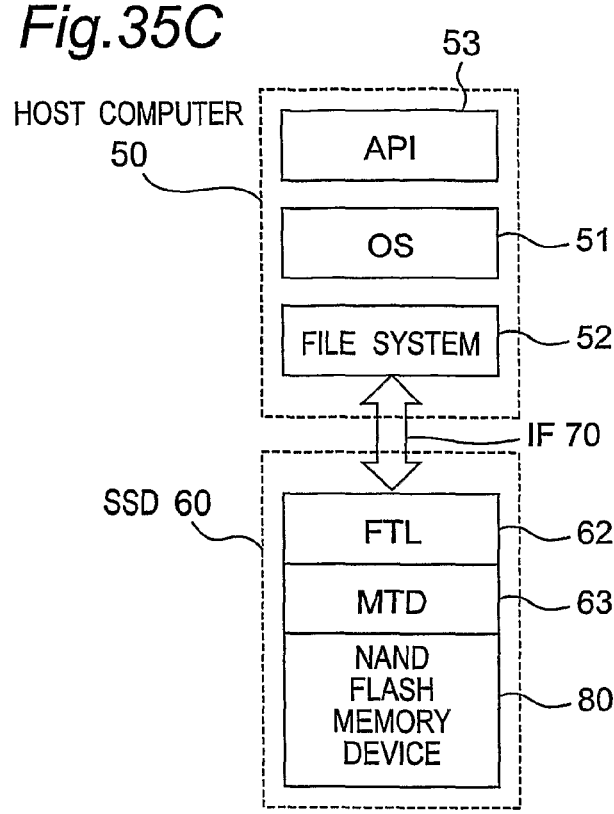
FIG. 35C is a schematic block diagram showing a configuration of a software system which is of a combination of a host computer 50 and a solid-state drive 60 having the NAND flash memory drive 80 of the preferred embodiments of the present invention.
Figure 35D:
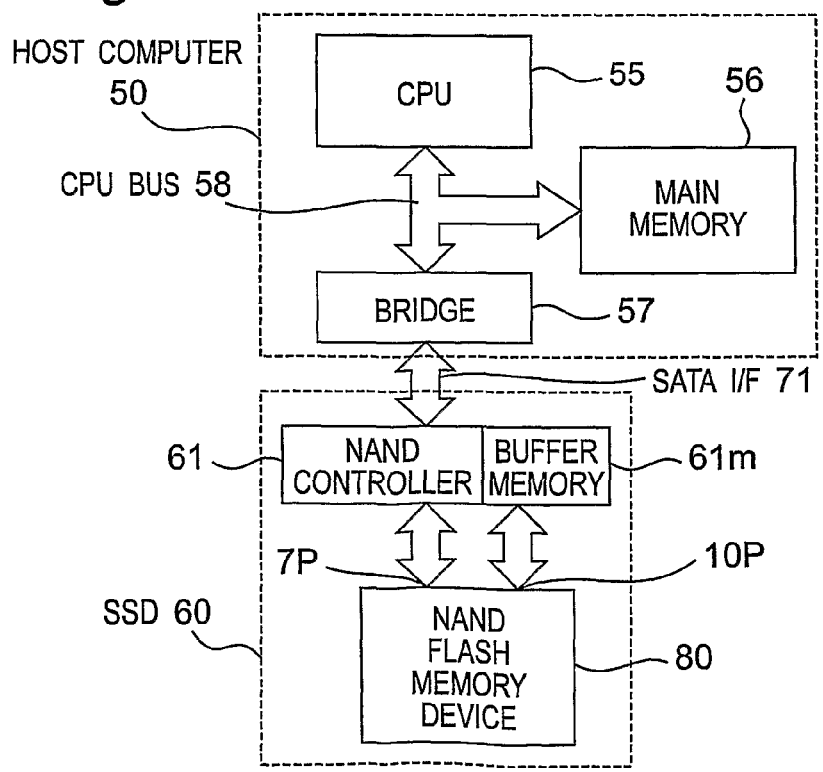
FIG. 35D is a schematic block diagram showing a configuration of a hardware system which is of a combination of the host computer 50 and the solid-state drive 60 having the NAND flash memory drive 80 of the preferred embodiments of the present invention.

FIG. 35C is a schematic block diagram showing a configuration of a software system which is of a combination of a host computer 50 and an SSD 60 having the NAND flash memory drive 80 of the preferred embodiments of the present invention, and FIG. 35D is a schematic block diagram showing a configuration of a hardware system which is of a combination of the host computer 50 and the SSD 60 having the NAND flash memory drive 80 of the preferred embodiments of the present invention.

Referring to FIG. 35C showing the software system, the SSD 60 includes the NAND flash memory device 80, a memory technology device (MTD) 63, and a flash translation layer (FTL) 62. A host computer 50 includes an operating system (OS) 51, a file system 52, and an application interface (API) 53. In this case, the flash translation layer (FTL) 62 is connected via an interface 70 to the file system 52.

Referring to FIG. 35D showing the hardware system, the SSD 60 includes the NAND flash memory 80, the NAND controller 61, and the buffer memory 61m. The host computer 50 includes a CPU 55, a main memory 56, and a bridge 57 which are connected via a CPU bus 58. In this case, the NAND controller 61 is connected via a SATA interface 71 to the bridge 57.

Namely, FIGS. 35C and 35D show the SSD system software and hardware architecture utilizing our proposed programming scheme for use in the NAND flash memory device 80. In this case, the SSD 60 includes the NAND controller 61 such as a low-end processor microcontroller along with the buffer memory 61*m* such as a small amount of SRAM (Buffer) between the NAND flash memory device 80 and the host computer 50 through the interface 71. The flash translation layer (FTL) 62 is formed by the controller between the operating system (OS) 51 and the NAND flash memory device 80, which takes care of mapping a sector to a block and page on the NAND flash memory device 80, thereby giving the file system 52 in view of an in-place mass storage device. The flash translation layer (FTL) 62 is implemented as the NAND controller 61 in the hardware block of FIG. 35D.

The size of the outstanding buffer memory 61*m* for the NAND controller 61 can be reduced to a designated size, referred to as a "sector size", against the up-sizing page sizes of the NAND flash memory device 80 programming-disturb-relaxed by the preferred embodiments of the present invention by the advantage of the NOP (Number of Operation for Programming in one page). The page 3 contains equal to or more than two sectors by the variance of the designated sector size and the designated page size.

Figure 36:
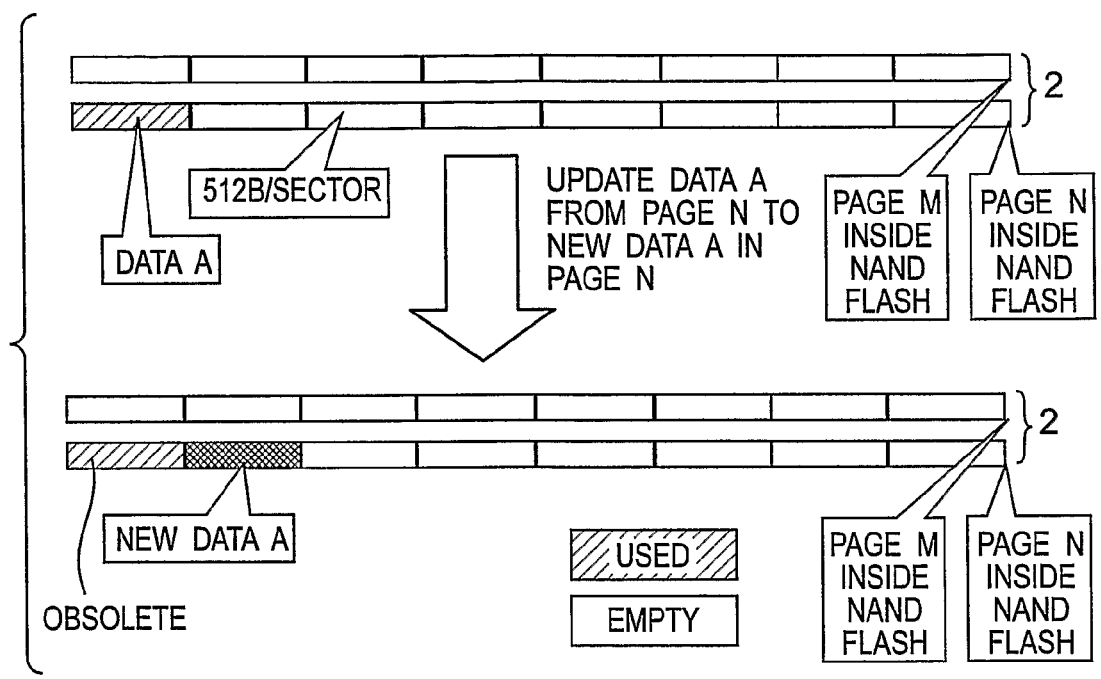
FIG. 36 is a schematic block diagram showing updating of sector data in the NAND flash memory array of the prior art.

The designated size of the buffer memory 61*m* for the NAND controller 61 can be 128 B, for an embedded operating system, which modifies data in the unit of 128 B. In addition, the designated size of the buffer memory 61*m* for the NAND controller 61 can be 256 B, for an embedded operating system, which modifies data in the unit of 256 B as shown in FIG. 36 which is a schematic block diagram showing updating of sector data in the NAND flash memory array of the prior art.

The designated size of the buffer memory 61*m* for the NAND controller 61 can be 512 B for a popular operating system such as Microsoft Windows XP (Registered Trademark), which modifies data in the unit of 512 B. In addition, the designated size of the buffer memory 61*m* for the NAND controller 61 can be 4 KB for an advanced operating system such as Microsoft Windows Vista (Registered Trademark), which modifies data in the unit of 4 KB.

The advantageous effect of the NOP is obtained in such a case that the result of the maximum number of disturb-free programming times is equal to or larger than the number of sectors in a page plus a designated number for a sector flag storage.

The designated number for the sector flag storage depends on the controller algorithm, which can be zero by the simultaneous program along with the program of the corresponding sector or can be a non-zero number by the specific design requirement.

The sectors can be organized into used or empty state by the sector flag stored in the spare area of the NAND flash memory array 2 of the corresponding selected page 3, where the empty sectors are extracted into empty sector link list and such an information can be stored in the designated block 12 in the NAND flash memory array 2 accessed by the NAND controller 61 firmware executed by the controller processor thereof.

The empty sector link list enables the full utilization of every sector 11 before an action to erase the block, where the erase operation on the NAND flash memory array 2 is performed by the unit of block 12. The full utilization of every sector 11 dramatically reduces the times of page relocation and block relocation. The reduction can be as much as the sector numbers in a page, which can be referred to as the worst case that only one sector 11 is used in a page 3, while the rest of sectors 11 are empty, followed by a page relocation or block relocation is performed. The reduction in the page relocation or block relocation results in the extended life time of storage device formed by the NAND flash memory advantage and the corresponding controller management.

FIG. 37A is a schematic block diagram showing a relocation scheme between the buffer memory 61*m* and the NAND memory array 2 according to a third preferred embodiment of the present invention.

The SSD 60 includes the NAND flash memory device 80 according to the preferred embodiments of the present invention, and the NAND controller 61. The NAND controller 61 can obtain the following advantageous effects. The size of the buffer memory 61*m* for the NAND controller 61 can be reduced to a designated size, referred to as a "sector size", against the up-sizing page sizes of the NAND flash memory device 80 according to the preferred embodiments of the present invention by the advantage of the NOP (Number of Operation for Programming in one page). The page 3 contains equal to or more than two sectors by the variance of the designated sector size and the designated page size.

The designated size of the buffer memory 61*m* for the NAND controller 61 can be 128 B, for an embedded operating system, which modifies data in the unit of 128 B. In addition, the designated size of the buffer memory 61*m* for the NAND controller 61 can be 256 B, for an embedded operating system, which modifies data in the unit of 256 B.

The designated size of the buffer memory 61*m* for the NAND controller 61 can be 512 B for a popular operating system such as Microsoft Windows XP (Registered Trademark), which modifies data in the unit of 512 B. In addition, the designated size of the buffer memory 61*m* for the NAND controller 61 can be 4 KB for an advanced operating system such as Microsoft Windows Vista (Registered Trademark), which modifies data in the unit of 4 KB.

The sectors 11 can be organized into used or empty state by the sector flag stored in the spare area of the NAND flash memory array 2 of the corresponding selected page, where the empty sectors are extracted into empty sector link list and such an information can be stored in the designated block in the NAND flash memory array 2 accessed by the NAND controller 61 firmware executed by the controller processor thereof.

The empty sector link list enables the full utilization of every sector before an action to erase the block, where the erase operation of the NAND flash memory array 2 is performed by the unit of block 12. The full utilization of every sector 11 dramatically reduces the times of page relocation and block relocation. The reduction can be as much as the sector numbers in a page 3, which can be referred to as the worst case that only one sector 11 is used in a page 2, while the rest of sectors 11 are empty, followed by a page relocation or block relocation is performed. The reduction in the page relocation or block relocation results in the extended life time of storage device formed by the NAND flash memory device 80 and the corresponding controller management.

The disturb-relaxed MLC NAND flash memory device 80 can obtain the following advantage effects. The number of page programming times (NOP) to the selected page can be performed by multiple disturb-free times, which are equal to or larger than the number of sectors in a page plus a designated number for sector flag storage.

Our proposed SSD system delivers enhanced wearing-rate for high reliable system operation and introduces cost-effective controller engineering for an advanced-technology MLC NAND flash memory device.

Figure 37B:
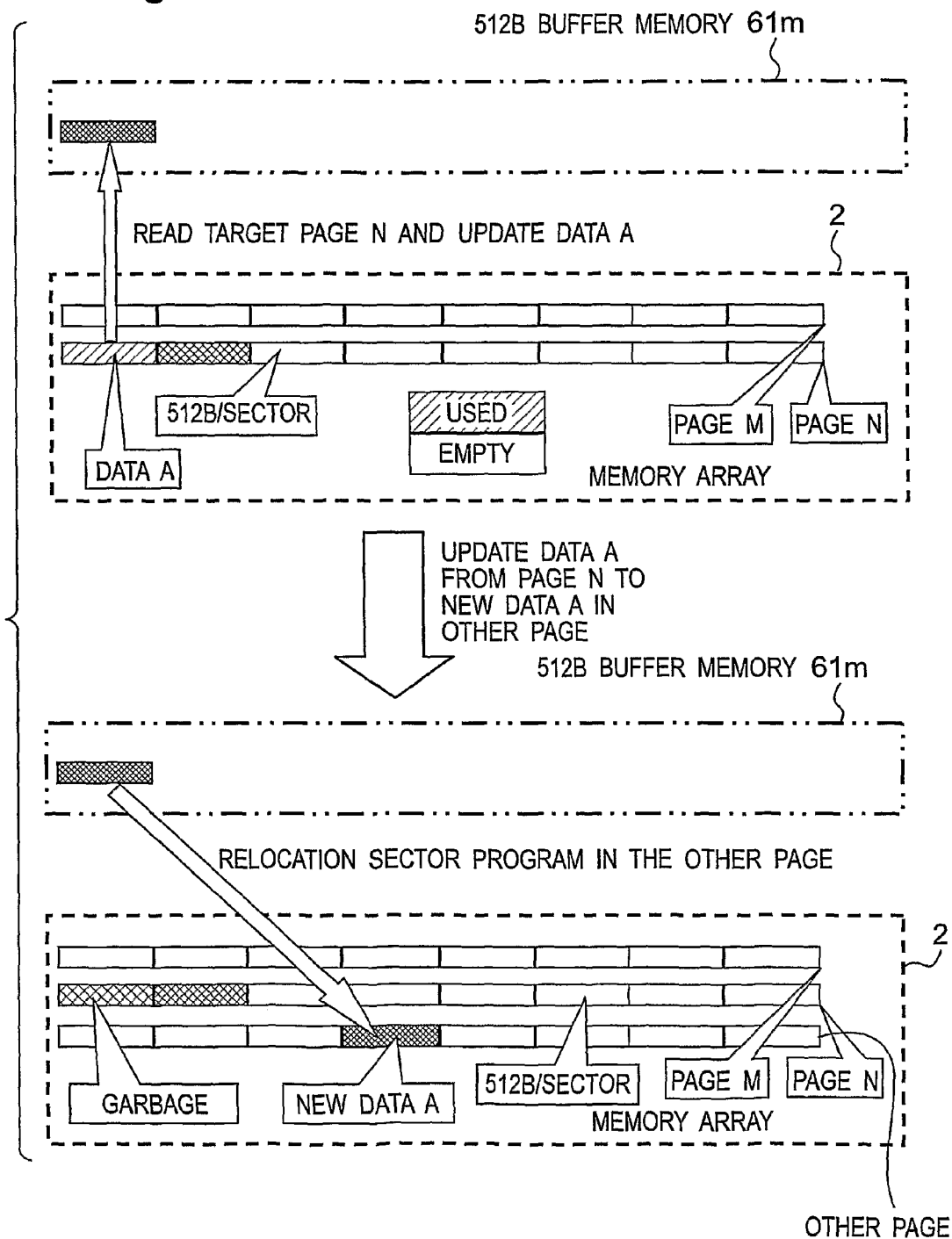
FIG. 37B is a schematic block diagram showing a relocation scheme between the buffer memory 61*m* and the NAND memory array 2 according to a first modification of the third preferred embodiment of the present invention.

FIG. 37B is a schematic block diagram showing a relocation scheme between the buffer memory 61*m* and the NAND memory array 2 according to a first modification of the third preferred embodiment of the present invention. As shown in FIG. 37B, new data may be written by our proposed random programming into a sector of the page 3 other than the page 3 in which the data has been already stored.

Figure 37C:
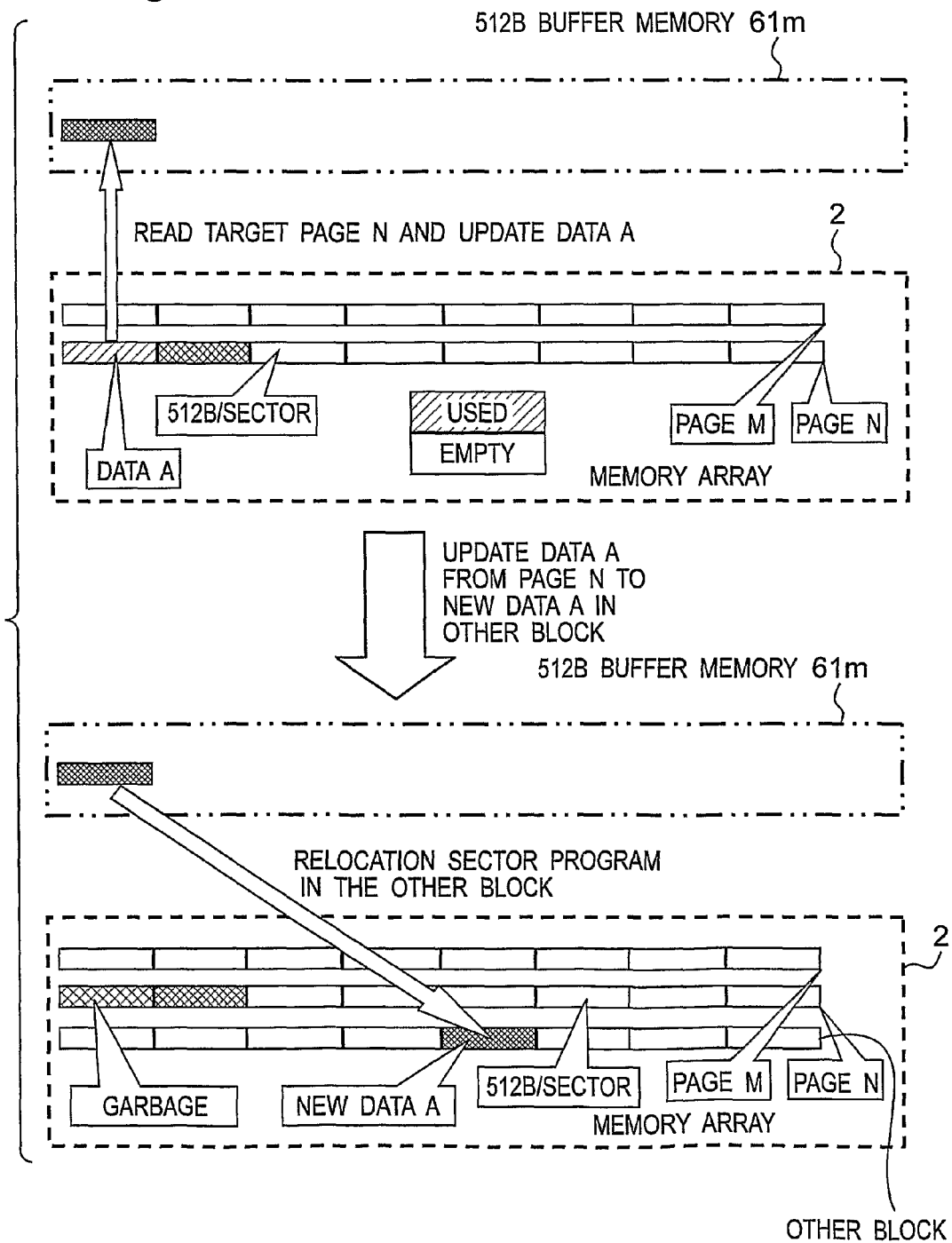
FIG. 37C is a schematic block diagram showing a relocation scheme between the buffer memory 61*m* and the NAND memory array 2 according to a second modification of the third preferred embodiment of the present invention.

FIG. 37C is a schematic block diagram showing a relocation scheme between the buffer memory 61*m* and the NAND memory array 2 according to a second modification of the third preferred embodiment of the present invention. As shown in FIG. 37C, new data may be written by our proposed random programming into a sector of a page of the block 12 other than the block 12 in which the data has been already stored.

SUBJECT MATTERS OF PREFERRED EMBODIMENTS

According to a first aspect of the present invention, there is provided a programming method for a NAND flash memory device including a memory cell array formed on a P-well of a semiconductor substrate. The memory cell array includes a plurality of cell strings connected to a plurality of word lines. The programming method includes a step of reducing electrons in channel, source and drain regions of the cell strings before a step of programming a memory cell to be programmed.

In the above-mentioned programming method, the step of reducing the electrons includes a step of biasing the word lines to be a voltage lower than a bias voltage of the P-well to accumulate holes at a channel surface to ionize interface traps which recombine with electrons during a self boosting operation upon programming for inhibit cells.

In addition, in the above-mentioned programming method, the step of reducing includes a step of negatively biasing the word lines against the P-well.

Further, in the above-mentioned programming method, the step of negatively biasing includes step of applying a negative voltage to the word lines with the P-well grounded.

Still further, in the above-mentioned programming method, the step of reducing includes a step of positively biasing the P-well against the word lines.

Still more further, in the above-mentioned programming method, the step of positively biasing includes a step of applying a positive voltage to the P-well with the word lines grounded.

Still more further, in the above-mentioned programming method, the step of positively biasing includes a step of applying a positive voltage to the P-well while applying a negative voltage to the word lines.

According to a second aspect of the present invention, there is provided a programming method for a NAND flash memory device including a memory cell array formed on a P-well of a semiconductor substrate. The memory cell array includes a plurality of cell strings connected to word lines and is divided into a plurality of blocks, where each block corresponds to respective word lines selected from the word lines. The programming method includes a step of reducing channel electrons in the cell strings, and a step of applying a program voltage to at least one selected word line while applying one or several pass voltages Vpass in a range between 0V and the program voltage, to deselected word lines after the step of reducing.

In the above-mentioned programming method, the step of reducing includes a step of negatively biasing the word lines against the P-well.

In addition, in the above-mentioned programming method, the step of negatively biasing includes step of applying a negative voltage to the word lines with the P-well grounded.

Further, in the above-mentioned programming method, the word line which is negatively biased is only one word line connected to a memory cell to be programmed.

Furthermore, in the above-mentioned programming method, the step of negatively biasing includes a step of applying a negative voltage to a plurality of word lines in the memory string, which include one word line connected to a memory cell to be programmed.

Still further, in the above-mentioned programming method, the step of negatively biasing includes a step of applying a negative voltage to all the word lines in a selected block including a memory cell to be programmed.

Still more further, in the above-mentioned programming method, the step of negatively biasing includes a step of applying a negative voltage to all the word lines in a plurality of selected blocks, one selected block including a memory cell to be programmed.

Still furthermore, in the above-mentioned programming method, each cell string is connected to each bit line. The method further includes a step of applying a voltage corresponding to the program voltage to the bit line connected to a memory string to be programmed before the step of reducing the channel electrons, and a step of applying a voltage corresponding to a program inhibit voltage to the bit line connected to a memory string to be unprogrammed before the step of reducing the channel electrons.

Still more furthermore, in the above-mentioned programming method, each cell string is connected to each bit line. The method further includes a step of applying a voltage corresponding to a program inhibit voltage to the bit lines before the step of reducing the channel electrons, and a step of applying a voltage corresponding to the program voltage to the bit line connected to a memory string to be programmed at start of programming.

In the above-mentioned programming method, the step of reducing includes a step of positively biasing the P-well against the word lines in the memory string.

In addition, in the above-mentioned programming method, the step of positively biasing includes a step of applying a positive voltage to the P-well with the word lines in the memory string grounded.

Further, in the above-mentioned programming method, the step of positively biasing includes a step of applying a positive voltage to the P-well while applying a negative voltage to the word lines in the memory string.

Furthermore, the above-mentioned programming method further includes a step of grounding the P-well upon applying the program voltage.

Still further, in the above-mentioned programming method, the step of positively biasing the P-well against the word lines includes a step of applying a negative voltage to only one word line connected to a memory cell to be programmed.

Still more further, In the above-mentioned programming method, the step of positively biasing includes a step of applying a negative voltage to a plurality of word lines in the memory string, which include one word line connected to a memory cell to be programmed.

Still furthermore, In the above-mentioned programming method, the step of positively biasing includes a step of applying a negative voltage to a plurality of word line in the memory string, which include all the word lines in a selected block including a memory cell to be programmed.

Still more further, In the above-mentioned programming method, the step of positively biasing includes a step of applying a negative voltage to a plurality of selected word lines, which include all the word lines in a plurality of selected blocks, one selected block including a memory cell to be programmed.

The above-mentioned programming method further includes a step of setting the bit lines to a floating state upon positively biasing the P-well.

In addition, the above-mentioned programming method further includes a step of applying a voltage corresponding to the program voltage to the bit line including a memory cell to be programmed before the step of positively biasing the P-well, and a step of applying a voltage corresponding to a program inhibit voltage to the bit lines except for the bit line including the memory cell to be programmed before the step of positively biasing the P-well.

The above-mentioned programming method further includes a step of applying a voltage corresponding to the program voltage to the bit line including a memory cell to be programmed after the step of positively biasing the P-well, and a step of applying a voltage corresponding to a program inhibit voltage to the bit lines except for the bit line including the memory cell to be programmed after the step of positively biasing the P-well.

In addition, the above-mentioned programming method includes a step of applying a voltage corresponding to a program inhibit voltage to the bit lines before the step of positively biasing the P-well, and a step of applying a voltage corresponding to the program voltage to the bit lines including the memory cell to be programmed upon programming the memory cell.

Further, in the above-mentioned programming method, the step of negatively biasing the word lines against the P-well includes a step of changing a relative voltage to be biased to the selected word lines, against the P-well, in an order of a negative voltage before a first period, 0V in the first period, the pass voltage Vpass in the second period, and the program voltage or the pass voltage Vpass in the third period.

Furthermore, in the above-mentioned programming method, the step of negatively biasing the word lines against the P-well includes a step of changing a relative voltage to be biased to the selected word lines, against the P-well, in an order of 0V before a first period, a negative voltage in the first period, the pass voltage Vpass in the second period, and the program voltage or the pass voltage Vpass in the third period.

Still further, in the above-mentioned programming method, the step of negatively biasing the word lines against the P-well includes a step of changing a relative voltage to be biased to the selected word lines, against the P-well, in an order of a pre-charge voltage before a first period, a negative voltage in the first period, the pass voltage Vpass in the second period, and the program voltage or the pass voltage Vpass in the third period.

Still more further, in the above-mentioned programming method, the step of negatively biasing the word lines against the P-well includes a step of changing a relative voltage to be biased to the selected word lines, against the P-well, in an order of a negative voltage, and then, the program voltage or the pass voltage Vpass.

According to a third aspect of the present invention, there is provided a NAND flash memory device including a memory cell array, first means for applying a program voltage, and second means for reducing channel electrons. The memory cell array is formed on a P-well of a semiconductor substrate, and the memory cell array includes a plurality of cell strings connected to word lines and is divided into a plurality of blocks, where each block corresponds to respective word lines selected from the word lines. The first means applies the program voltage to at least one selected word line in a selected block while applying a pass voltage Vpass to deselected word lines. The second means reduces channel electrons in the cell strings before applying the program voltage.

In the above-mentioned NAND flash memory device, the means for reducing the channel electrons applies a negative voltage to the word lines in the selected block.

In addition, the means for applying the program voltage includes a row decoder. The row decoder includes a block decoder, a level shifter, and a word line driver. The block decoder decodes an address signal to a select signal for selecting a block. The level shifter converts a predetermined voltage into a gate drive voltage in response to the select signal. The word line driver transfers a global word line voltage to the word lines. Each of the level shifter and the word line driver includes N-channel transistors which are formed in a Triple-well of the semiconductor substrate. The row decoder generates a negative voltage for reducing the channel electrons.

In the above-mentioned NAND flash memory device, the row decoder changes the negative voltage to 0V after reducing the channel electrons.

In addition, in the above-mentioned NAND flash memory device, the row decoder generates a high voltage higher than the negative voltage, and the high voltage at least upon reducing the channel electrons is set to be lower than a voltage obtained by an equation of the high voltage upon programming minus absolute value of the negative voltage.

Further, in the above-mentioned NAND flash memory device, the means for applying the program voltage includes a row decoder. The row decoder includes a block decoder, a level shifter, and a word line driver. The block decoder decodes an address signal to a select signal for selecting a block, the level shifter converts a predetermined voltage into a gate drive voltage in response to the select signal. The word line driver for transferring a global word line voltage to the word lines. The level shifter includes P-channel transistors.

Furthermore, in the above-mentioned NAND flash memory device, the means for reducing channel electrons applies a positive voltage to the P-well of the semiconductor substrate.

Still further, in the above-mentioned NAND flash memory device, the means for reducing channel electrons inputs the positive voltage from an external circuit, and applies the positive voltage to the P-well of the semiconductor substrate.

According to a fourth aspect of the present invention, there is provided a NAND flash memory device including a memory cell array, reducing means, and programming means. The memory cell array is formed on a P-well of a semiconductor substrate, and the memory cell array includes a plurality of cell strings connected to word lines and is divided into a plurality of blocks, where each block corresponds to respective word lines selected from the word lines, each block is divided into a plurality of pages each page located along each word line, and each page is divided into a plurality of sector corresponding to a predetermined number of memory cells. The reducing means reduces channel electrons in the cell strings. The programming means programs memory cells in a unit of one sector selected from the sectors located within one page after reducing channel electrons.

In the above-mentioned NAND flash memory device, the programming means programs the memory cells while dividing the page into sectors having a number of sectors in the page at maximum.

In addition, in the above-mentioned NAND flash memory device, when the programming means updates data stored in a first sector of a first page of a first block, the programming means randomly programs updated data onto one or ones of combination as selected from among the following: (a) a second sector of the first page of the first block; (b) a sector of a second page of the first block; and (c) a sector of a page of a second block.

According to a fifth aspect of the present invention, there is provided a system for a NAND flash memory device including NAND flash memory, a peripheral circuitry, a control logic, and a NAND controller. The NAND flash memory array performs a step of reducing electrons in channel, source and drain regions of the cell strings before programming a memory cell to be programmed. The peripheral circuitry controls the step of reducing in the NAND flash memory array. The control logic controls an operation of the peripheral circuitry. The NAND controller includes a buffer memory and manages an interface with an operation system in a unit of one sector of the NAND flash memory array.

In the above-mentioned system, the NAND controller controls data of the NAND flash memory array to be randomly programmed therein.

In addition, in the above-mentioned system, the buffer memory has a size of one sector of the NAND flash memory array.

Further, in the above-mentioned system, NOP (Number of Operation for Programming in one page) of NAND flash memory array is equal to or larger than two.

Still further, in the above-mentioned system, the NAND controller controls update data in a page of the NAND memory array to relocate to the same page without deleting old data.

Still more further, in the above-mentioned system, the NAND controller controls update data in a page of the NAND flash memory array to relocate to the same page, without deleting old data and erase operation within the same block.

Still furthermore, in the above-mentioned system, the NAND controller controls update data in a sector of a page of the NAND flash memory array to relocate to an empty sector within the same page with saving old data as an invalid data, without erase operation within the same block.

THE OTHER MODIFICATIONS OF PREFERRED EMBODIMENTS

FIG. 39 is a table of respective voltages to be preferably set in three periods in the NAND flash memory device 80 during a programming sequence according to a modification of the preferred embodiments.

According to another embodiment of the present invention, a programming method for a NAND flash memory device is provided. In a period of t<t0, a first voltage V1 is applied to the bit line BL, a second voltage V2 is applied to the source line SL, and a third voltage V3 is applied to the gate SGDL of the drain-side select transistor, and further, the selected word line WL, the deselected word lines WL and the gate SGSL of the source-side select transistor are grounded to sweep away the electrons to the bit line BL. The voltage applied to the gate SGDL of the drain-side select transistor is changed from the third voltage V3 to a fourth voltage V4, which is applied thereto, to cut-off the string channel potential from the bit line not to flow back the electrons. The fourth voltage V4 is set to be lower than the third voltage V3 through the drain-side select transistor. A fifth voltage V5 is applied to the selected word line WL and the deselected word lines WL in a period of t0<t<t1. The fifth voltage V5 is set to a negative voltage to reduce the total amount of electrons in the channel of the cell string. The voltage applied to the selected word line WL and the deselected word lines WL is changed at the timing t1 from the fifth voltage V5 to a sixth voltage V6, which is applied thereto in a period of t1<t<t2, where the sixth voltage V6 is set to a positive voltage. The voltage applied to the selected word line WL is changed at the timing t2 from the sixth voltage V6 to a seventh voltage, which is applied thereto in a period of t2<t<t3, where the seventh voltage V7 is set to be higher than the sixth voltage V6.

According to an embodiment of the present invention, respective voltages are preferably set in the NAND flash memory device 80. The first voltage V1 is set to be a voltage between 1V and 3.6V (or the power supply voltage), the second voltage V2 is set to a voltage between 0V and 3.6V (or the power supply voltage), the third voltage V3 is set to a voltage between 0.5V and 7V, the fourth voltage V4 is set to a voltage between 0.5V and 3.6V (or the power supply voltage), the fifth voltage V5 is set to a voltage between −1V and −10y, the sixth voltage V6 is set to a voltage between 5V and 15V, and the seventh voltage V7 is set to a voltage between 10V and 26V.

According to an embodiment of the present invention, the step of reducing the total amount of electrons in the channel of the cell string preferably includes a step of applying a negative voltage to the word lines WL. In the embodiment, the negative voltage is set to be equal to or lower than a threshold voltage of a memory cell in the cell string.

According to an embodiment of the present invention, a programming method for a NAND flash memory device is provided which causes self-boosting of an inhibit cell string and performs a channel electron reducing step before the self-boosting of the inhibit cell string.

According to an embodiment of the present invention, in the programming method, the channel electron reducing step includes a step of applying a negative voltage to the word lines WL coupled to the inhibit cell string.

According to an embodiment of the present invention, in the programming method, the negative voltage is set to be equal to or lower than a threshold voltage of a memory cell in the inhibit cell string.

According to an embodiment of the present invention, in the programming method of, the channel electron reducing step includes a step of applying a positive voltage to the P-well 104 in which the cell string is formed thereon, and applying the ground voltage to the word lines WL coupled to the inhibit cell string.

According to an embodiment of the present invention, the voltage of the P-well 104 is set to be equal to or higher than a threshold voltage of a memory cell in the inhibit cell string.

DIFFERENCES BETWEEN PRESENT INVENTION AND RELATED DOCUMENTS

According to the preferred embodiments of the present invention, a negative potential of the word lines WL is set against the P-well 104 of the memory cell array 2, and there are many prior art documents which disclose a step of applying a negative voltage to the word lines WL. For example, NPL 1, which is one of popular ones, discloses a NOR-type flash memory which adopts CHE (Channel Hot Electron) Injection Programming and FN (Fowler-Nordheim) Tunnel Erasing. In the erase mode thereof, a negative voltage is set to all the word lines WL in the selected memory cell array unit.

PTL 3 and 4 disclose an AG-AND type flash memory, in which memory cells on one word line WL can be erased with using a negative voltage applied to the word line WL.

PTL 5 and NPL 3 discloses a DINOR-type flash memory, in which only the selected word line WL is set to a negative voltage for the programming.

The common thing for these prior arts is that the purpose of the negative voltage to be applied to the word lines WL is only for programming or erasing and the period of applying the negative voltage, and it is limited in the programming or the erasing. It is not provided for the NAND flash memory device. However, according to the present invention, the negative voltage is applied at the time before programming to improve the program disturb issue for the NAND flash memory device. This point is the major difference between the present invention and the above-mentioned prior art documents.

INDUSTRIAL APPLICABILITY

According to the present invention, our proposed programming method for the NAND flash memory device, and our proposed NAND flash memory device are capable of reducing or preventing the programming disturb as compared with that of prior art.

In addition, according to the present invention, our proposed programming method for the NAND flash memory device, and our proposed NAND flash memory device are capable of updating data stored in the NAND flash memory device in a unit smaller than that of the prior art at a speed higher than that of the prior art with any block erase operation and without any garbage by the programming disturb.

Further, according to the present invention, our proposed programming method for the NAND flash memory device, and our proposed NAND flash memory device are capable of randomly programming data stored in the NAND flash memory device.

It will be apparent to those skilled in the art that various modifications and variations can be made to the structure of the present invention without departing from the scope or spirit of the invention. In view of the foregoing, it is intended that the present invention cover modifications and variations of the present invention provided they fall within the scope of the following claims and their equivalents.

REFERENCE SIGNS LIST 1a and 1b: Cell string,
2: NAND memory array,
3: Page,
4a: Row decoder,
4b: Column decoder,
5: Well control unit,
6: Voltage generator,
7: Control logic,
7P: Input signal pin,
8: Address buffer and controller,
9: Page buffer (sense amplifier and write deriver),
10: Input and output (I/O) interface,
10P: Input and output (I/O) pin,
11: Sector,
12: Block,
13: Bit line (BL) switch circuit,
14: Column switch circuit,
15: Global word line (GWL) voltage switch circuit,
16 to 20, 17a, 20a, Tr1 to Tr4, Tg1 to Tg4, Trg1 to Trg4, Tg5, Tgm, Tss, Tsg, Twi, Twj, and Twk: MOS transistor,
21: High level voltage shifter (HLVS),
22: Word line driver,
24, 24-1 and 24-2: High voltage level shifter (HVMVLS),
25, 25-1 and 25-2: Middle voltage level shifter (MVLS),
26-0 to 26-4: High Voltage level shifter (HVLS),
50: Host computer,
51: Operating system (OS),
52: File system,
53: Application program interface (API),
55: CPU,
56: Main memory,
57: Bridge,
58: CPU bus,
60: Solid-state drive (SSD),
61: NAND controller,
61m: Buffer memory,
62: Flash translation layer (FTL),
63: Memory technology device,
80: NAND flash memory device,
100: Semiconductor substrate,
102: N-well,
104: P-well,
106, 110 and 116: Dielectric layer,
108: Floating gate (FG),
112: Control gate (CG),
114: Doped region,
118, 118a and 118b: Conductive layer,
120, 122: Plug,
BL and BL1 to BLn: Bit lines,
D: Drain region,
S: Source region,
SGDL and SGSL: Selected gate line,
SL: Source line,
T: Selected transistor, and
WL and WL1 to WLx: Word lines.

The invention claimed is:

1. A programming method for a NAND flash memory device comprising a memory cell array formed on a P-well of a semiconductor substrate, the memory cell array including a plurality of cell strings connected to a plurality of word lines, the programming method including a step of reducing electrons in channel, source and drain regions of the cell strings before a step of programming a memory cell to be programmed.

2. The method as claimed in claim 1,
wherein the step of reducing the electrons includes a step of biasing the word lines to be a voltage lower than a bias voltage of the P-well to accumulate holes at a channel surface to ionize interface traps which recombine with electrons during a self boosting operation upon programming for inhibit cells.

3. The method as claimed in claim 2,
wherein the step of reducing includes a step of negatively biasing the word lines against the P-well.

4. The method as claimed in claim 3,
wherein the step of negatively biasing includes step of applying a negative voltage to the word lines with the P-well grounded.

5. The method as claimed in claim 2,
wherein the step of reducing includes a step of positively biasing the P-well against the word lines.

6. The method as claimed in claim 5,
wherein the step of positively biasing includes a step of applying a positive voltage to the P-well with the word lines grounded.

7. The method as claimed in claim 5,
wherein the step of positively biasing includes a step of applying a positive voltage to the P-well while applying a negative voltage to the word lines.

8. A system for a NAND flash memory device comprising:
a NAND flash memory array which performs a step of reducing electrons in channel, source and drain regions of the cell strings before programming a memory cell to be programmed;
a peripheral circuitry which controls the step of reducing in the NAND flash memory array;
a control logic which controls an operation of the peripheral circuitry; and
a NAND controller which includes a buffer memory and manages an interface with an operation system in a unit of one sector of the NAND flash memory array.

9. The system as claimed in claim 8,
wherein the NAND controller controls data of the NAND flash memory array to be randomly programmed therein.

10. The system as claimed in claim 8,
wherein the buffer memory has a size of one sector of the NAND flash memory array.

11. The system as claimed in claim 8,
wherein NOP (Number of Operation for Programming in one page) of NAND flash memory array is equal to or larger than two.

12. The system according to claim 8,
wherein the NAND controller controls update data in a page of the NAND memory array to relocate to the same page without deleting old data.

13. The system according to claim 8,
wherein the NAND controller controls update data in a page of the NAND flash memory array to relocate to the same page, without deleting old data and erase operation within the same block.

14. The system according to claim 8,
wherein the NAND controller controls update data in a sector of a page of the NAND flash memory array to relocate to an empty sector within the same page with saving old data as an invalid data, without erase operation within the same block.

* * * * *